(12) United States Patent
Hatsuda et al.

(10) Patent No.: US 10,388,345 B2
(45) Date of Patent: Aug. 20, 2019

(54) MEMORY DEVICE

(71) Applicant: TOSHIBA MEMORY CORPORATION, Minato-ku, Tokyo (JP)

(72) Inventors: Kosuke Hatsuda, Tokyo (JP); Yoshiaki Osada, Kawasaki Kanagawa (JP); Yorinobu Fujino, Hachioji Tokyo (JP); Jieyun Zhou, Fujisawa Kanagawa (JP)

(73) Assignee: TOSHIBA MEMORY CORORATION, Tokyo (JP)

( * ) Notice: Subject to any disclaimer, the term of this patent is extended or adjusted under 35 U.S.C. 154(b) by 0 days.

(21) Appl. No.: 15/918,399

(22) Filed: Mar. 12, 2018

(65) Prior Publication Data
US 2019/0088298 A1 Mar. 21, 2019

(30) Foreign Application Priority Data
Sep. 21, 2017 (JP) ................. 2017-180935

(51) Int. Cl.
| G11C 11/16 | (2006.01) |
| G11C 13/00 | (2006.01) |
| H01L 43/08 | (2006.01) |
| H01L 43/10 | (2006.01) |
(Continued)

(52) U.S. Cl.
CPC ...... G11C 11/1673 (2013.01); G11C 11/1675 (2013.01); G11C 11/1693 (2013.01); G11C 13/004 (2013.01); G11C 13/0061 (2013.01); G11C 11/161 (2013.01); G11C 2013/0057 (2013.01); H01F 10/3254 (2013.01); H01L 27/228 (2013.01); H01L 43/08 (2013.01); H01L 43/10 (2013.01)

(58) Field of Classification Search
CPC ............ G11C 11/1673; G11C 11/1675; G11C 11/161; H01L 27/228; H01L 43/08; H01L 43/10
See application file for complete search history.

(56) References Cited

U.S. PATENT DOCUMENTS

| 7,102,945 B2 | 9/2006 | Tsuchida et al. |
| 7,852,665 B2 | 12/2010 | Chen et al. |
| 8,908,426 B2 | 12/2014 | Wang et al. |
(Continued)

FOREIGN PATENT DOCUMENTS

| JP | 2006294178 A | 10/2006 |
| JP | 3959417 B2 | 8/2007 |
| JP | 2008217842 A | 9/2008 |

Primary Examiner — Mohammed A Bashar
(74) Attorney, Agent, or Firm — Holtz, Holtz & Volek PC

(57) ABSTRACT

According to one embodiment, a memory device includes a preamplifier configured to execute a first read in which a first current relating to a memory cell is passed through a first path and a second current relating to the first current is passed through a second path, to generate a first voltage, to write first data to the memory cell; and to execute a second read in which a third current relating to the memory cell with the first data written thereto is passed through the first path and a fourth current relating to the third current is passed through the second path, to generate a second voltage; and a sense amplifier configured to determine data stored in the memory cell during execution of the first read based on the first voltage and the second voltage.

20 Claims, 58 Drawing Sheets

(51) Int. Cl.
*H01F 10/32* (2006.01)
*H01L 27/22* (2006.01)

(56) References Cited

U.S. PATENT DOCUMENTS

| | | |
|---|---|---|
| 8,923,041 B2 | 12/2014 | Andre et al. |
| 9,286,205 B2 | 3/2016 | Ramanujan et al. |
| 2016/0027489 A1 | 1/2016 | Alam et al. |
| 2016/0099037 A1* | 4/2016 | Alam .................. G11C 11/1673 365/158 |
| 2016/0225444 A1 | 8/2016 | Kitagawa et al. |

* cited by examiner

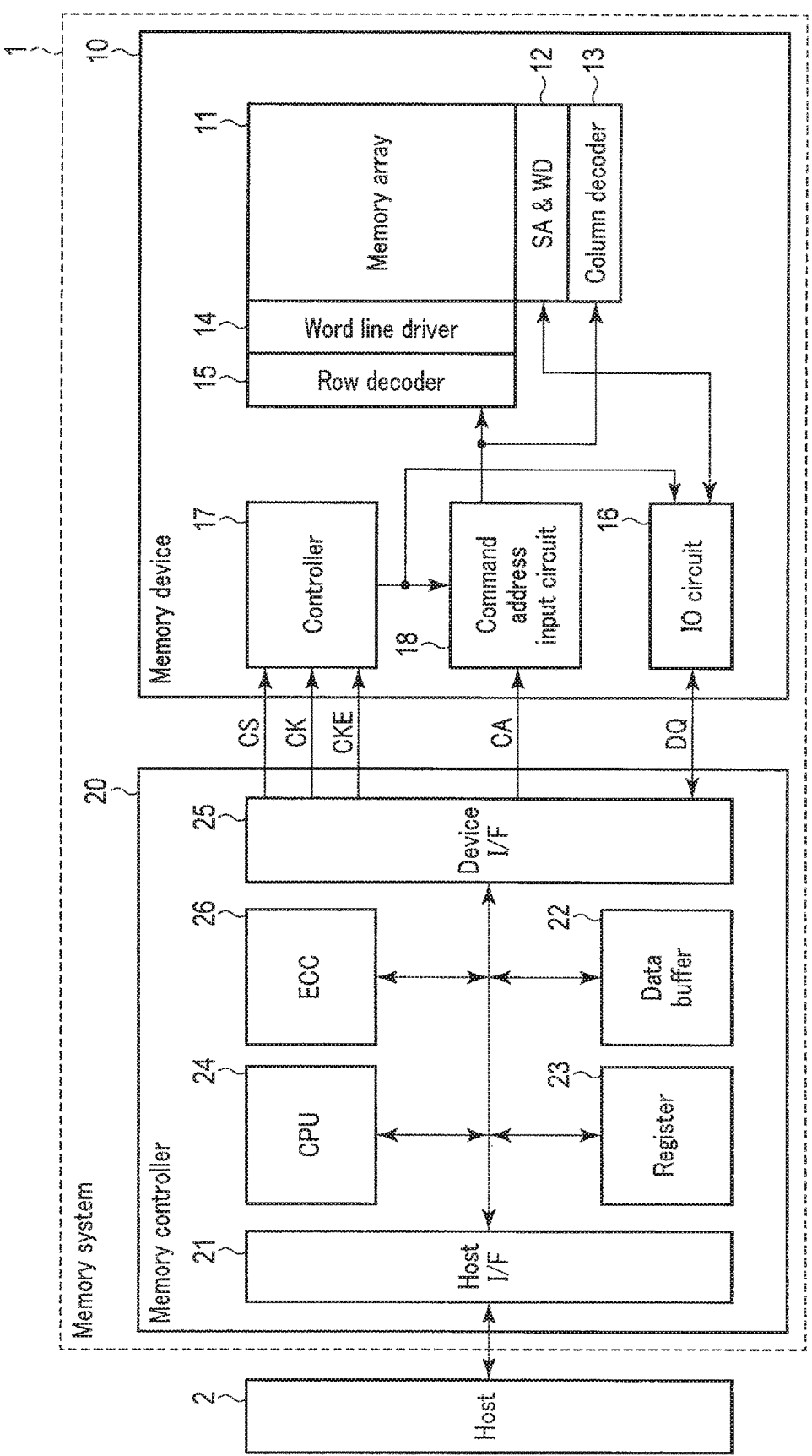
F I G. 1

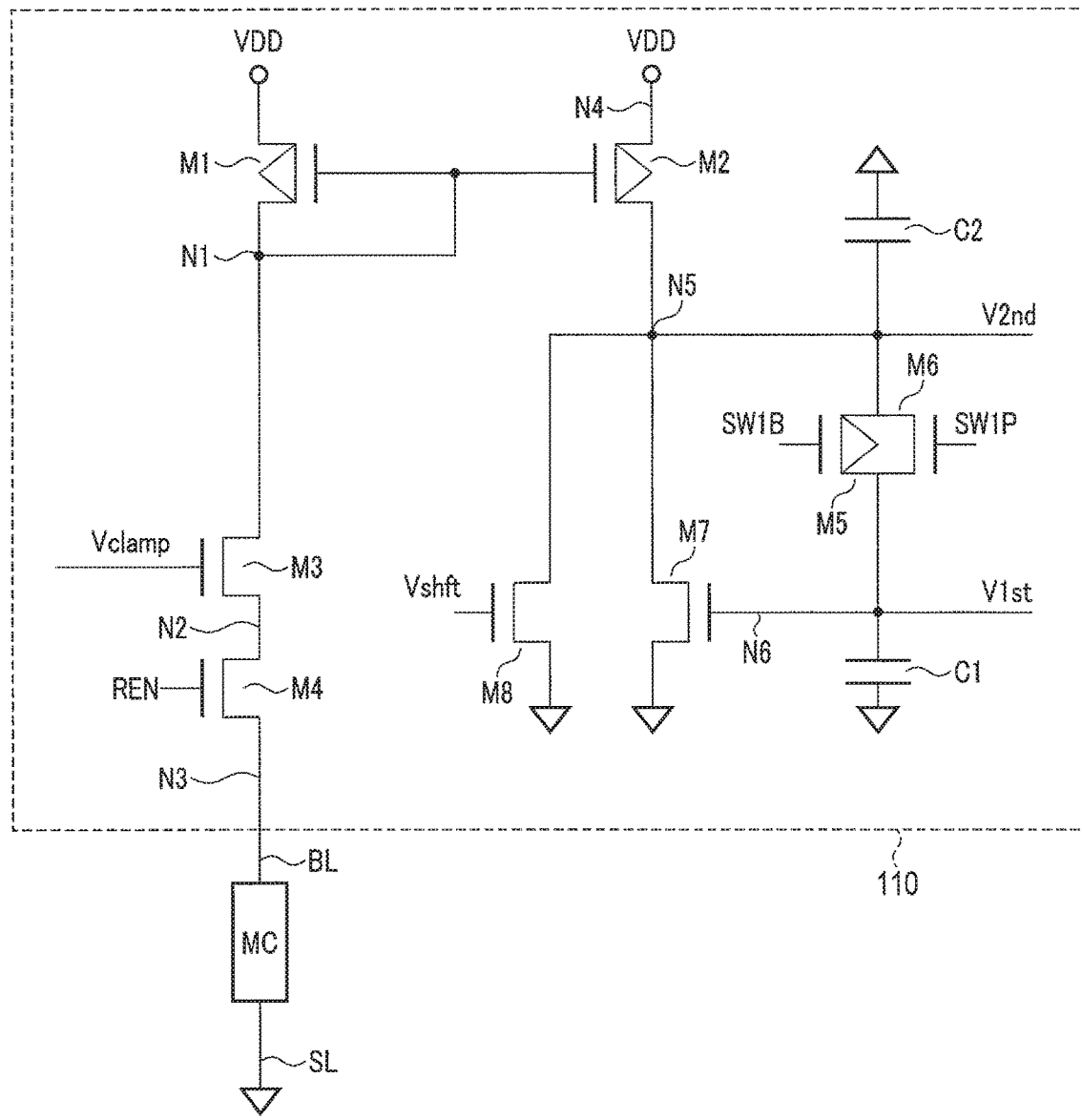
F I G. 5

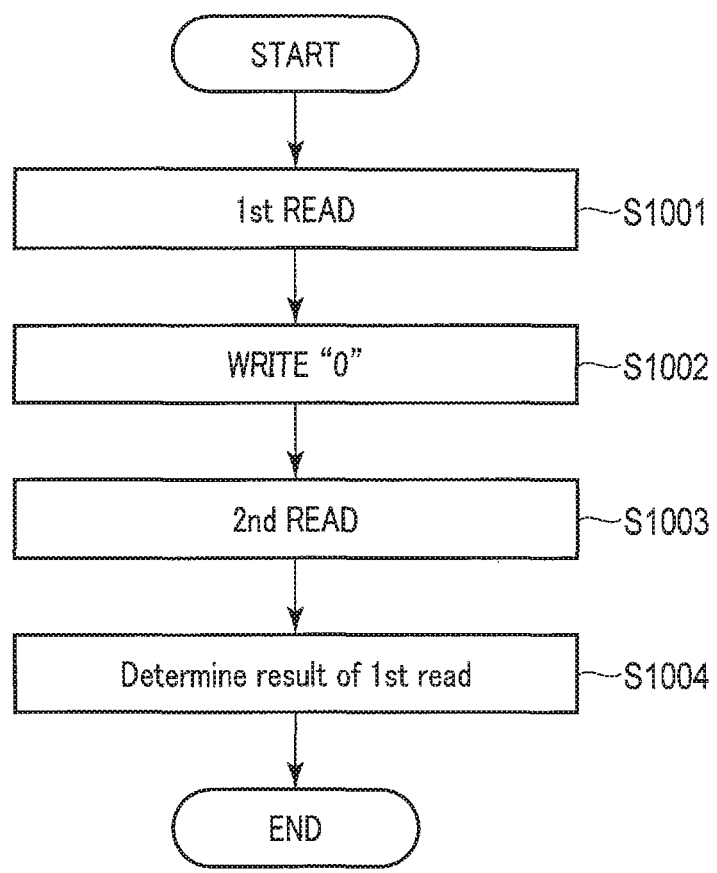
F I G. 7

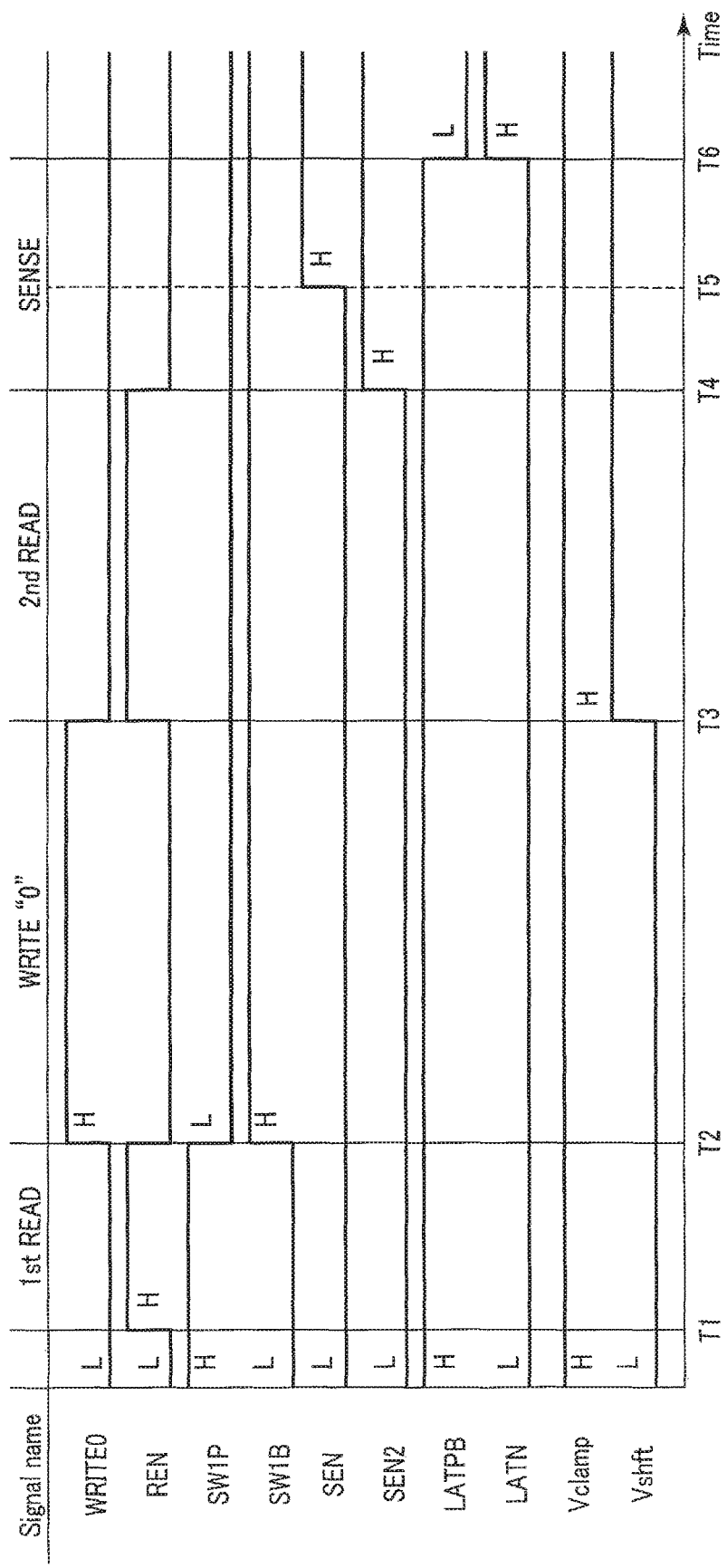
F I G. 8

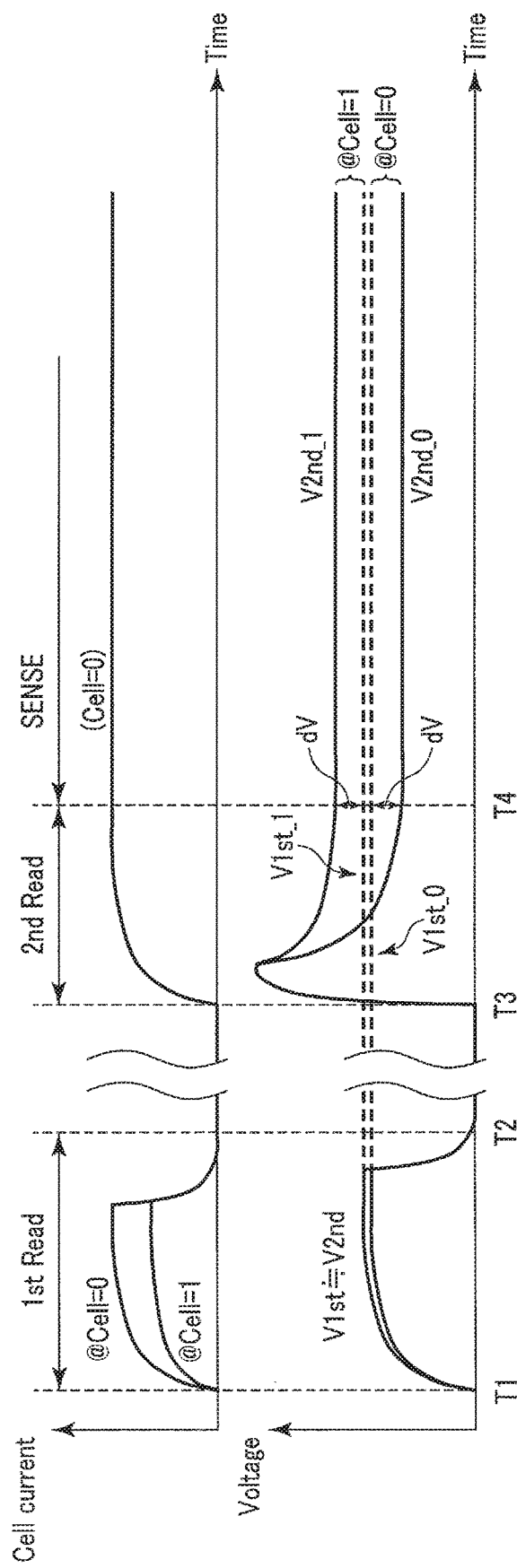
F I G. 12

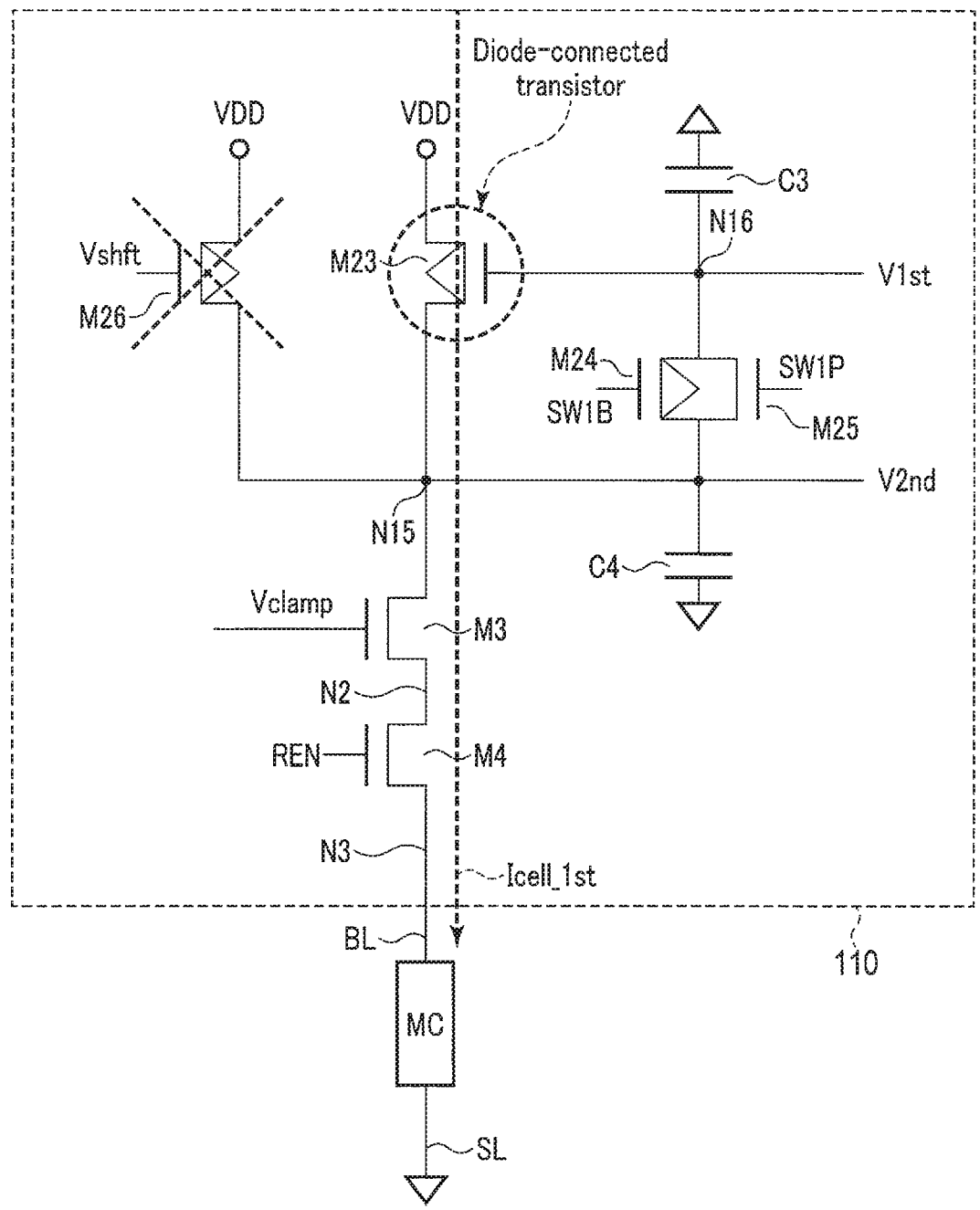
F I G. 14

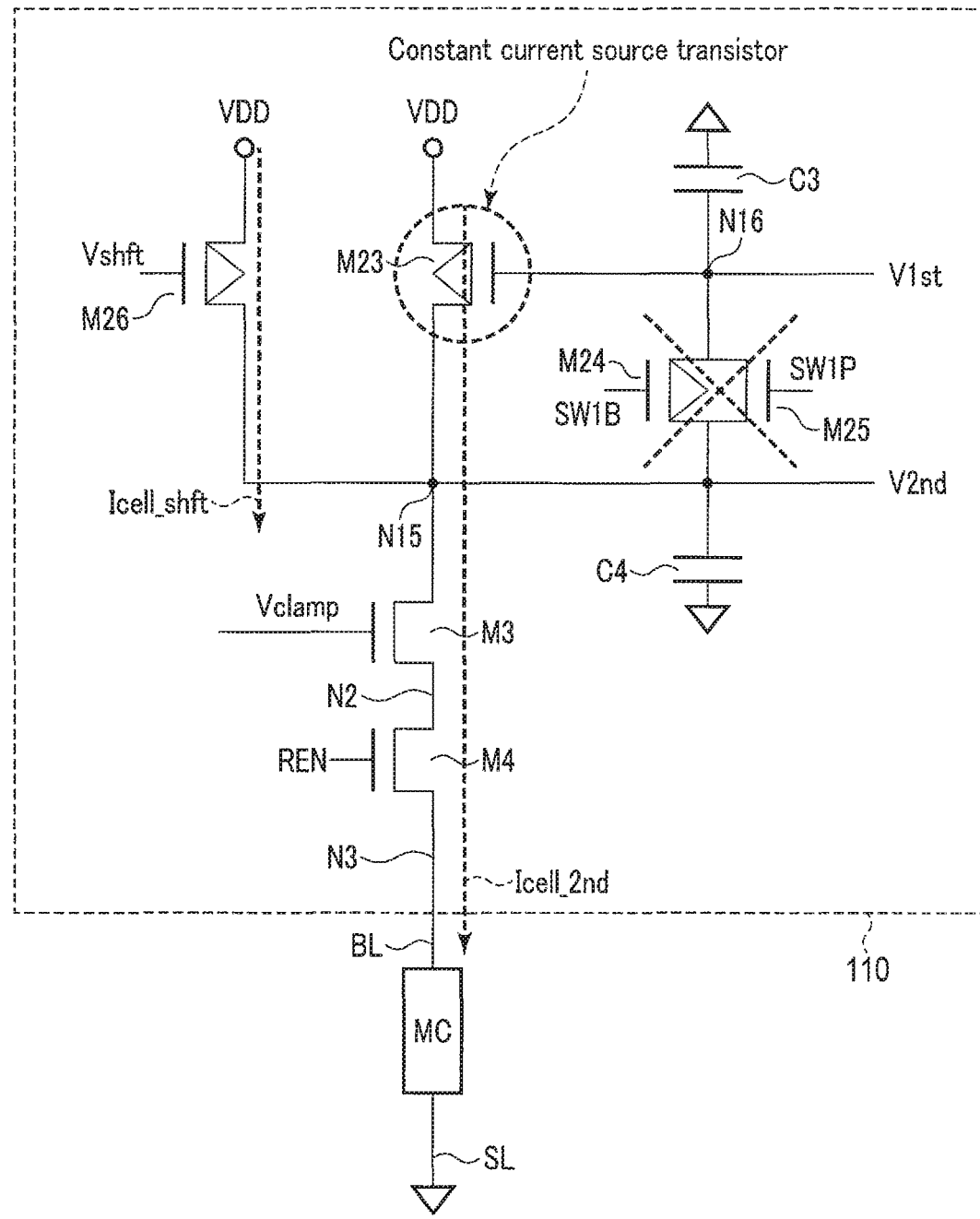
F I G. 15

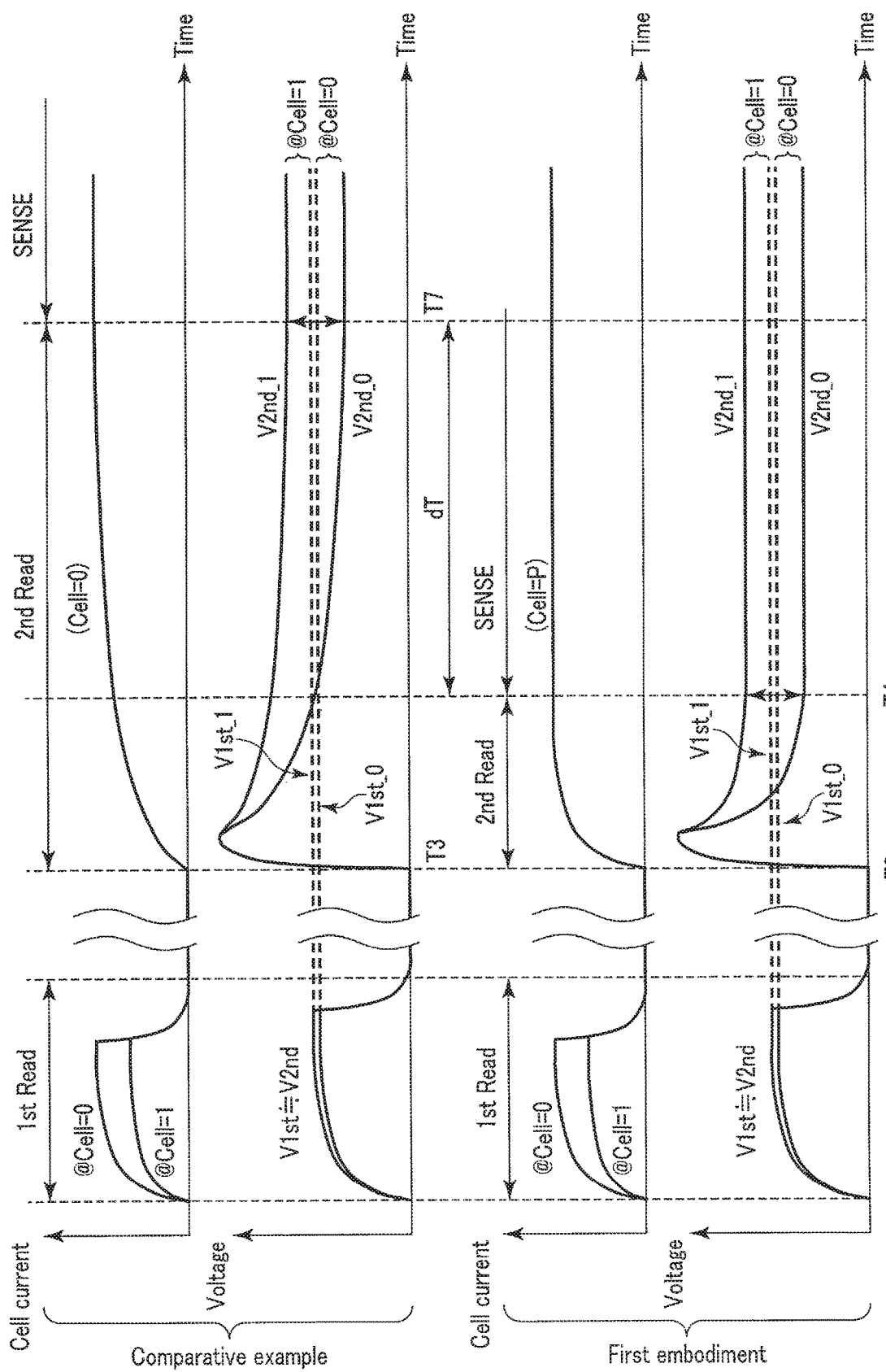
F I G. 16

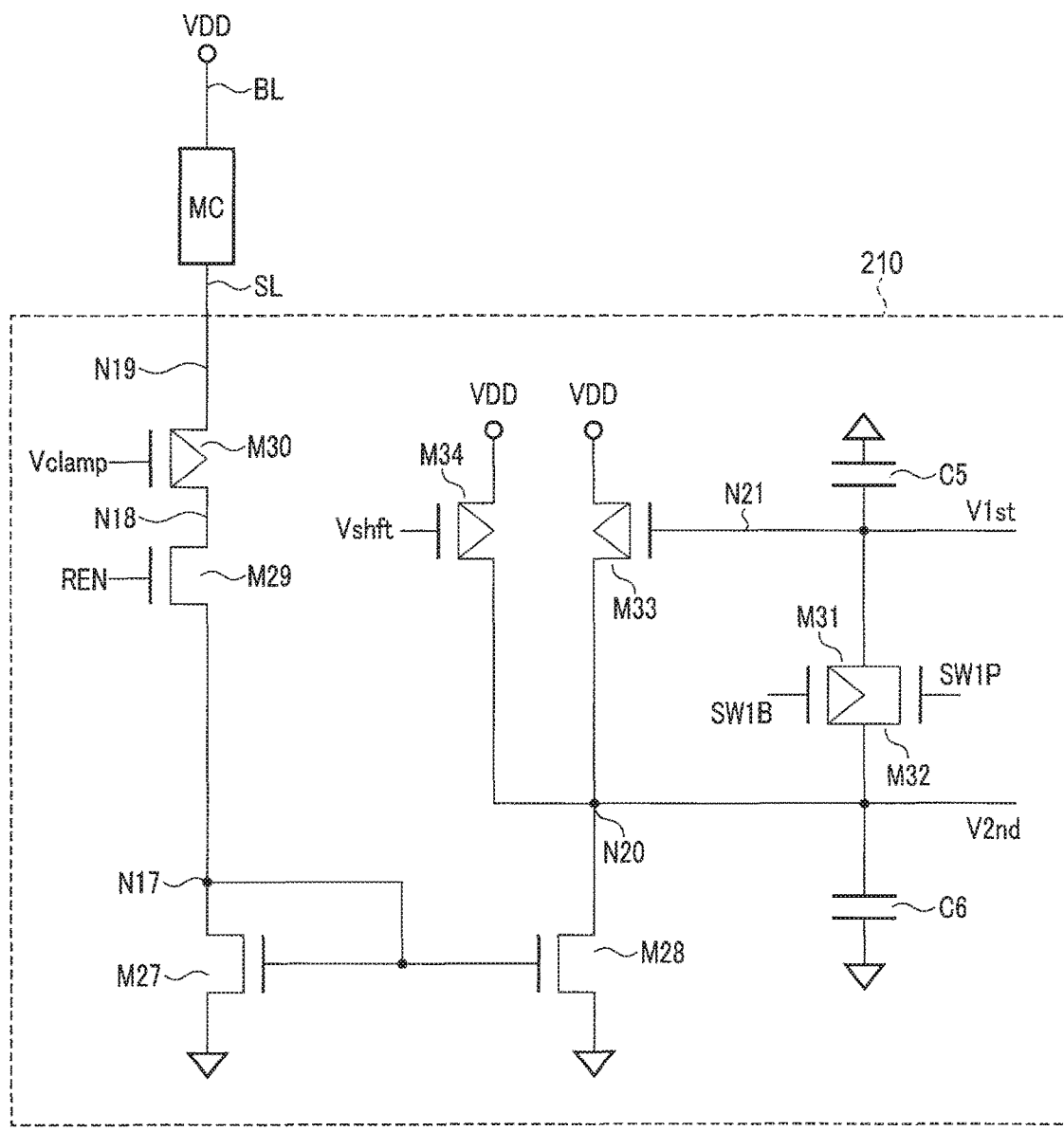
F I G. 18

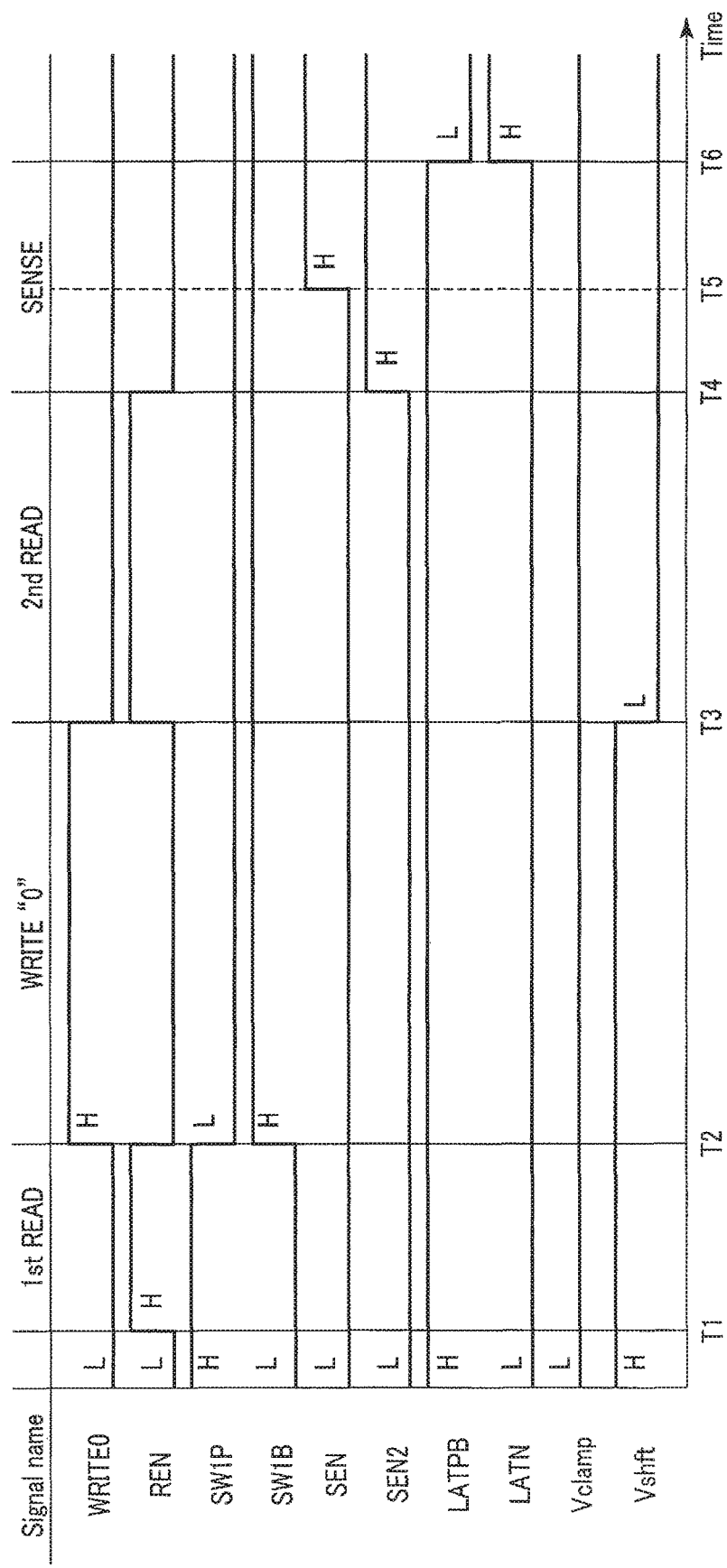
F I G. 19

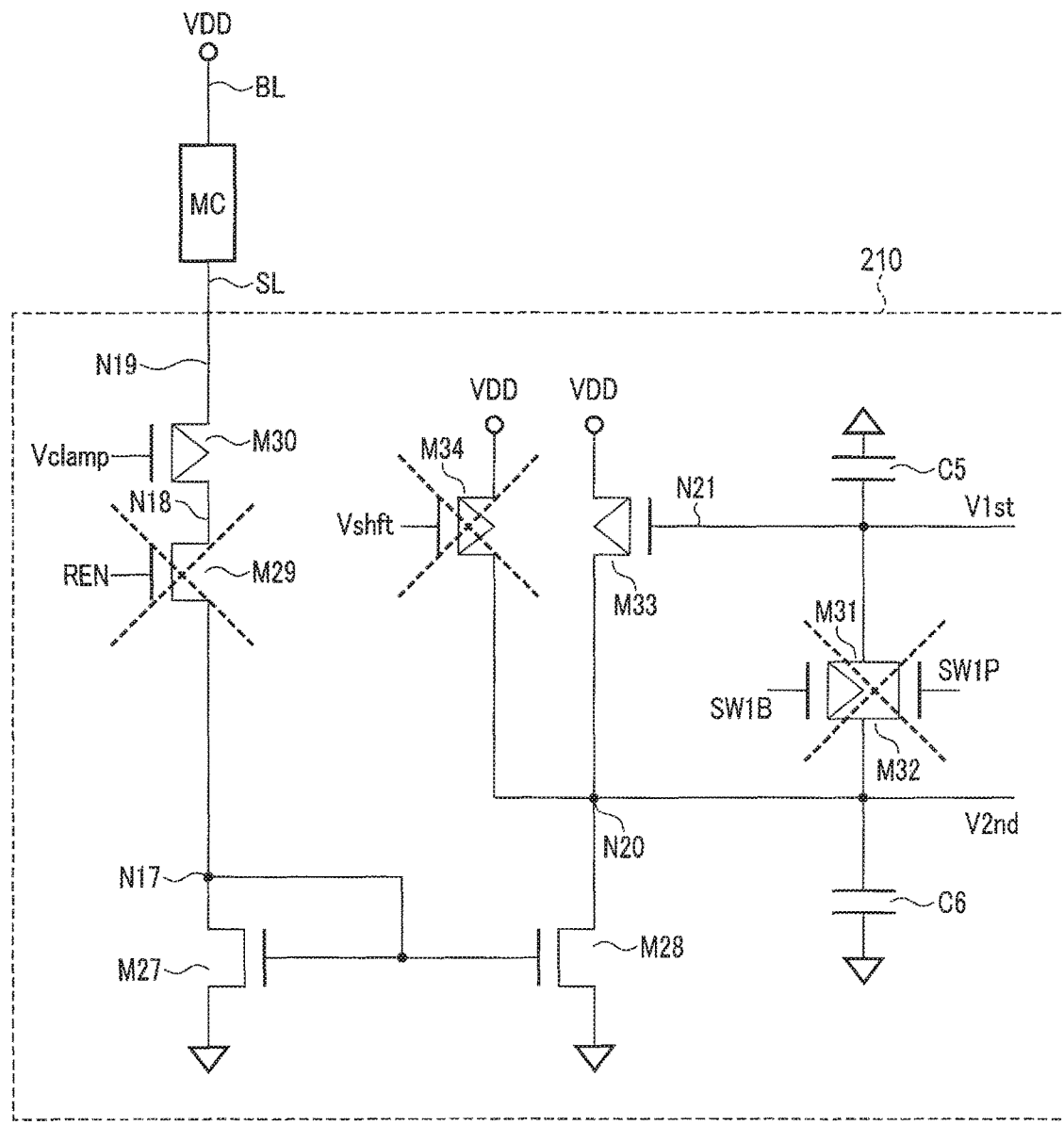
F I G. 21

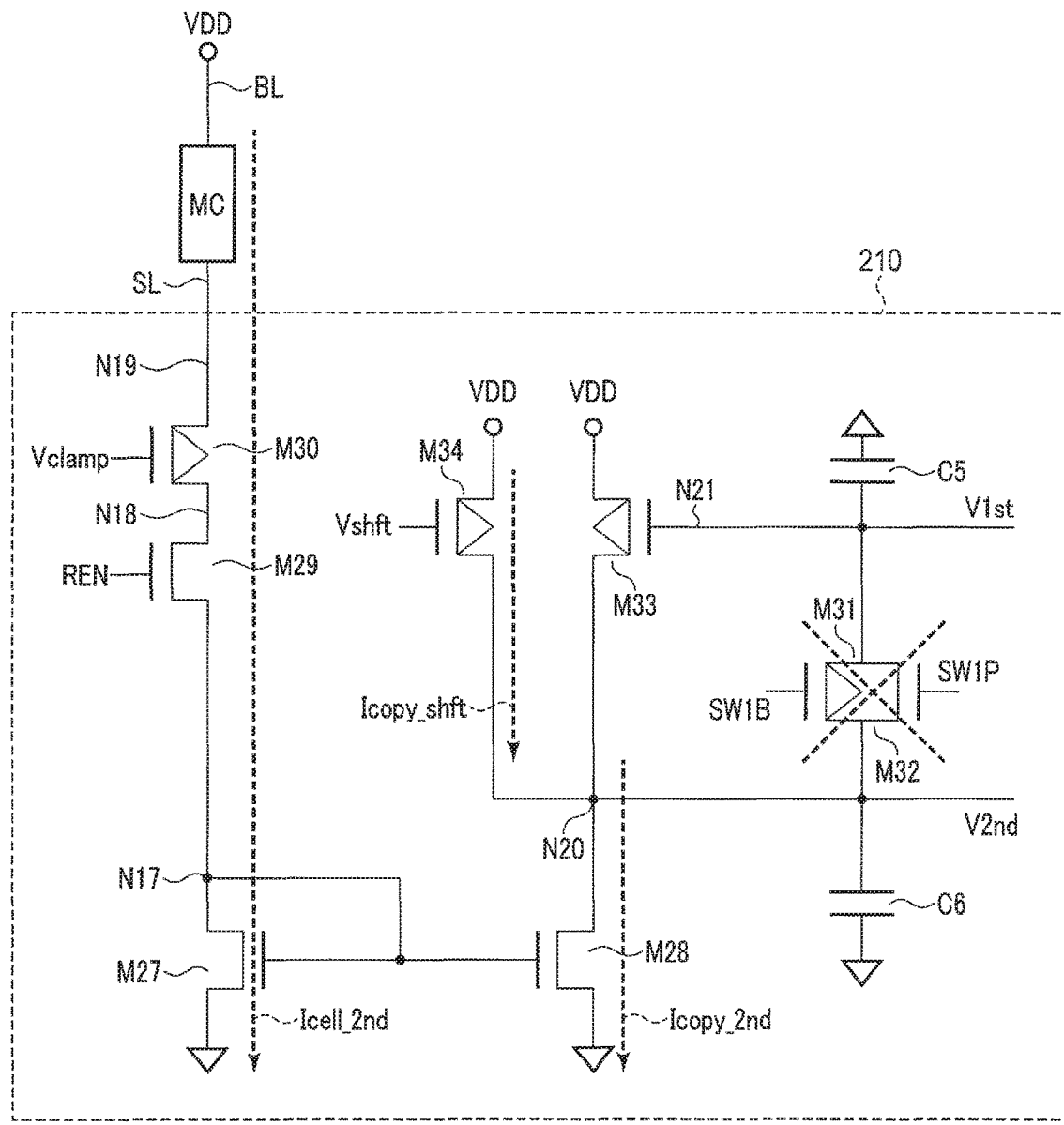
F I G. 22

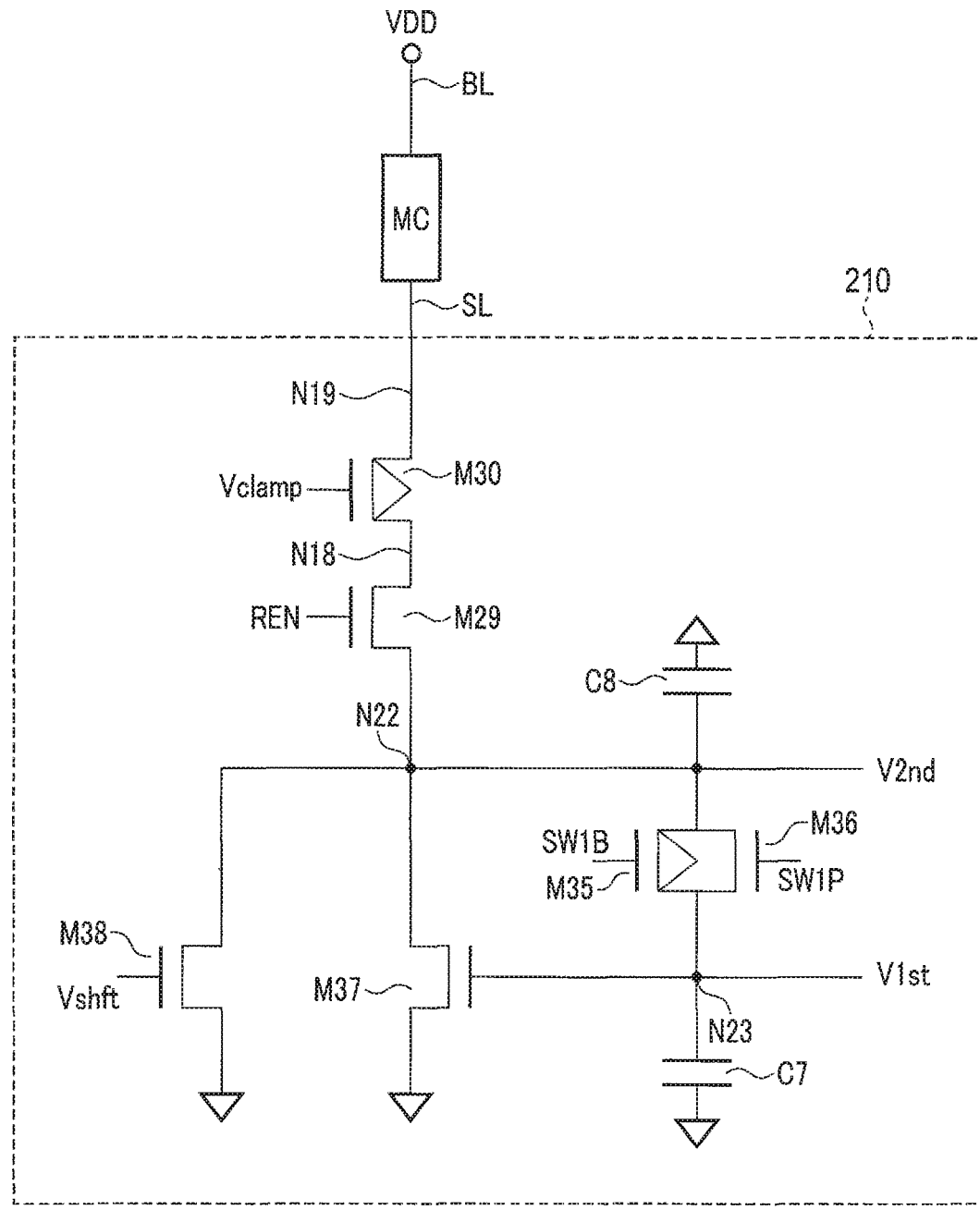
F I G. 24

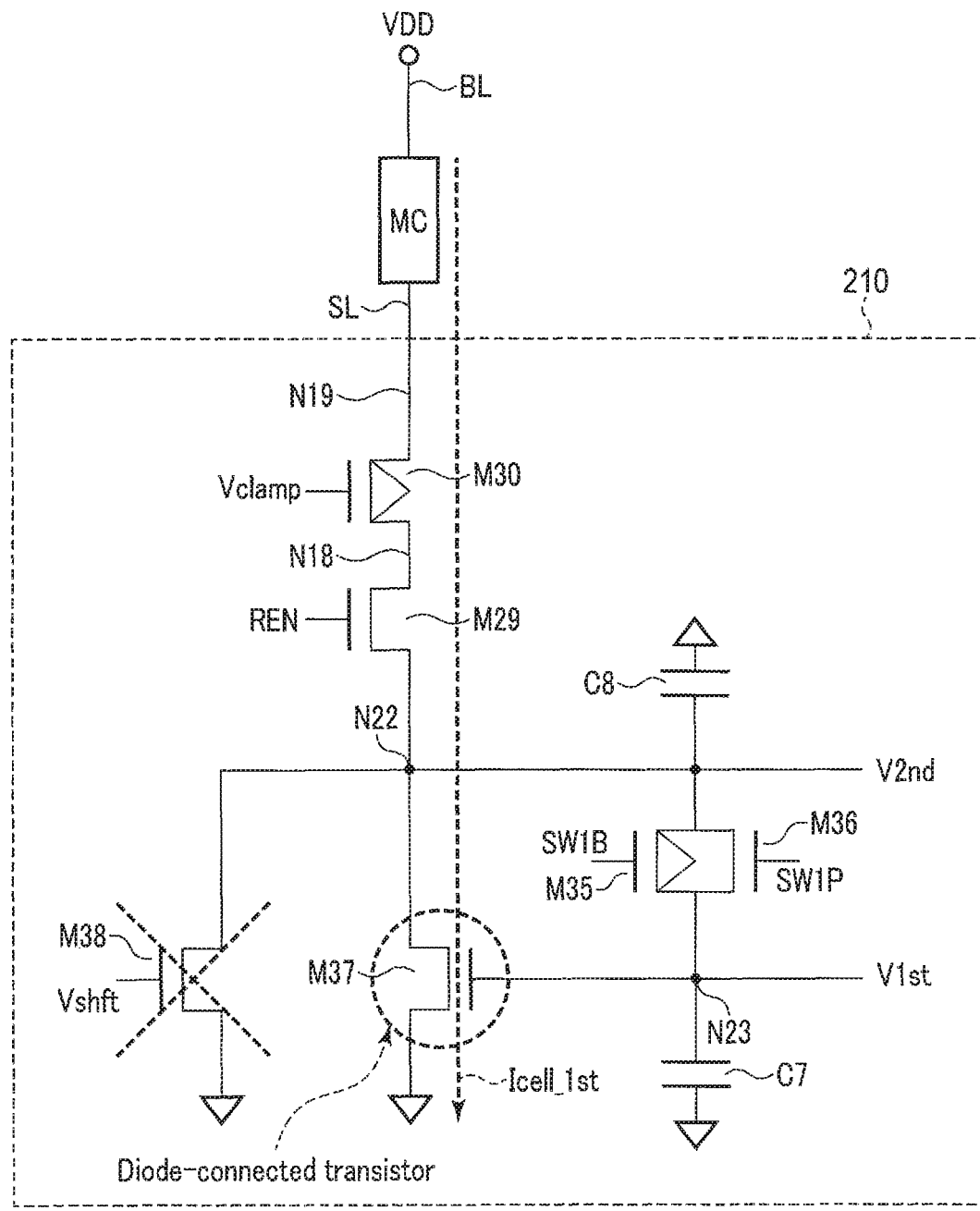
F I G. 25

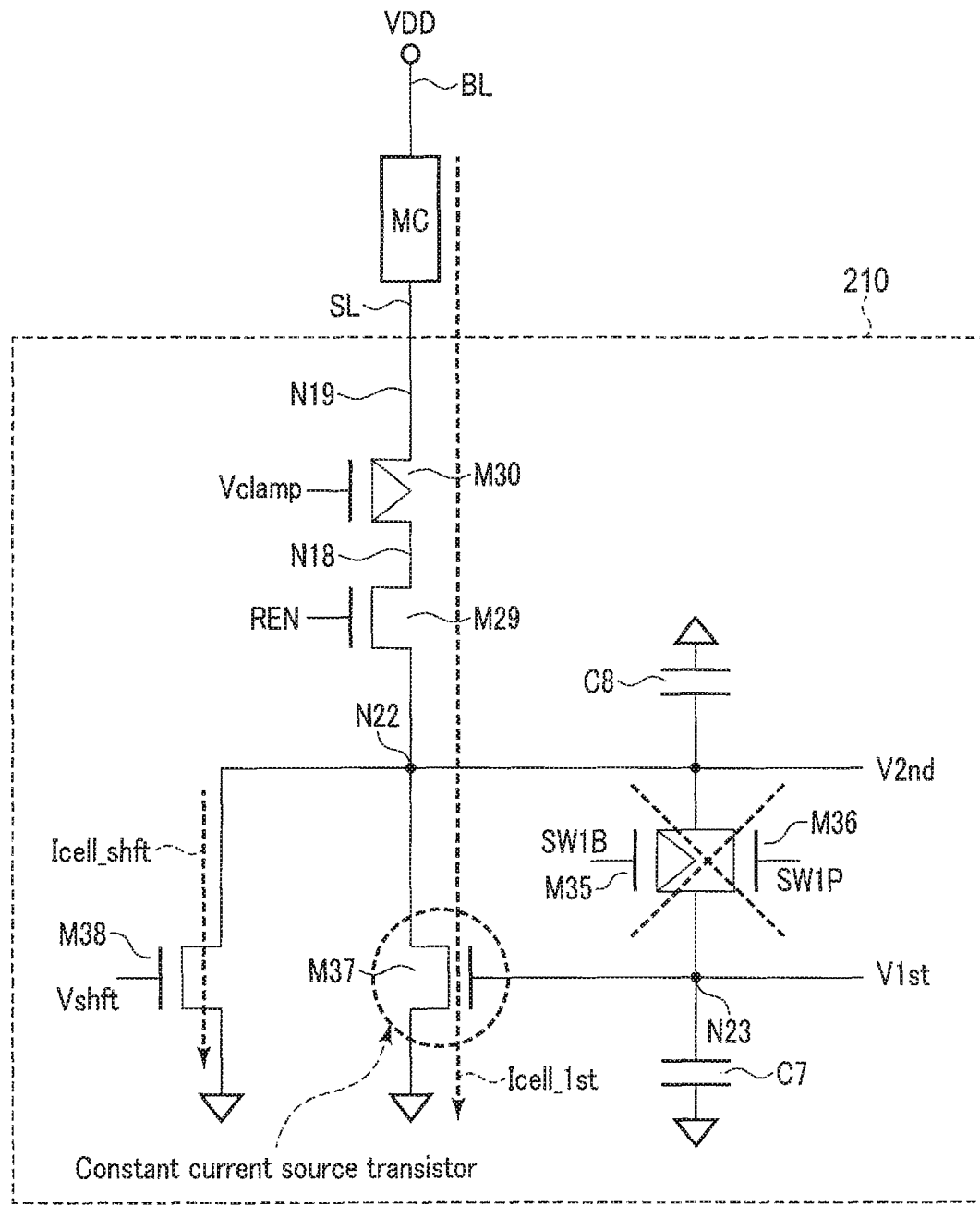
F I G. 26

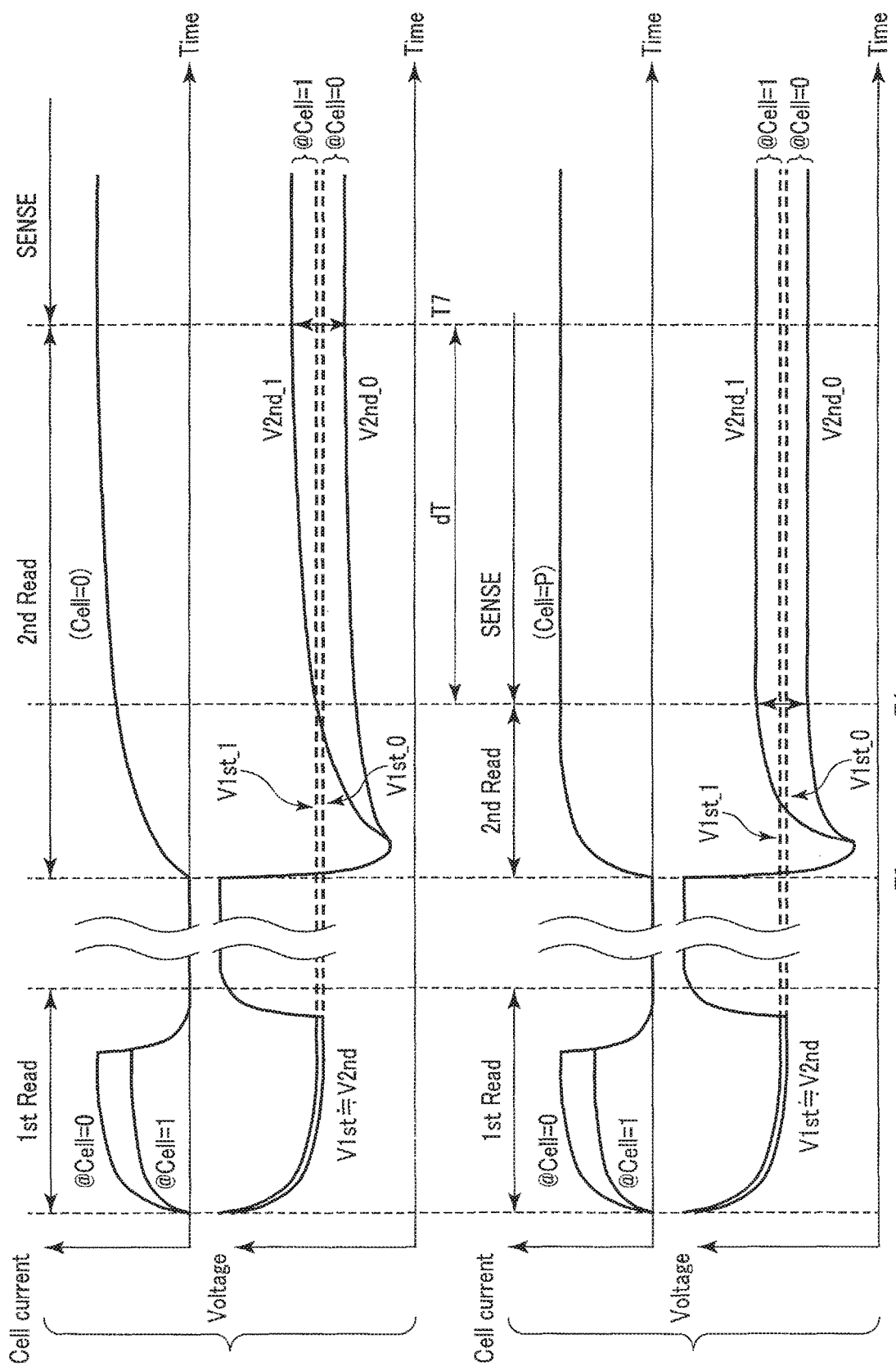
F I G. 27

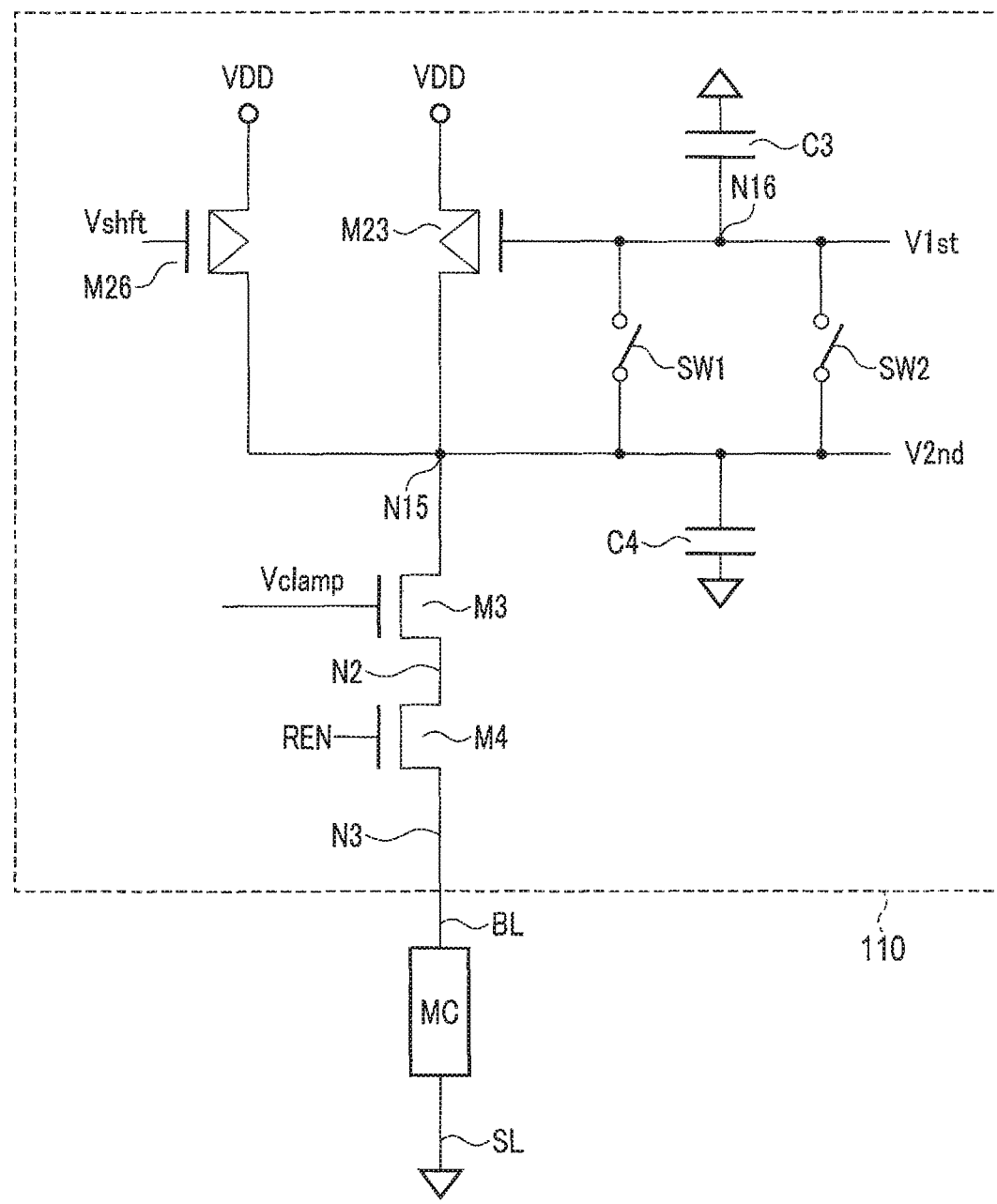
F I G. 28

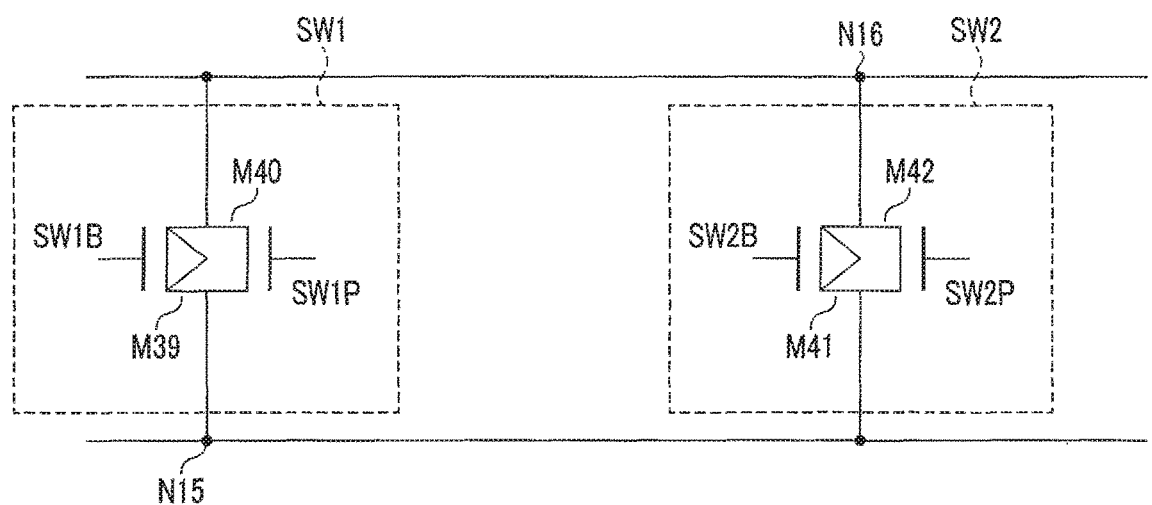
F I G. 29

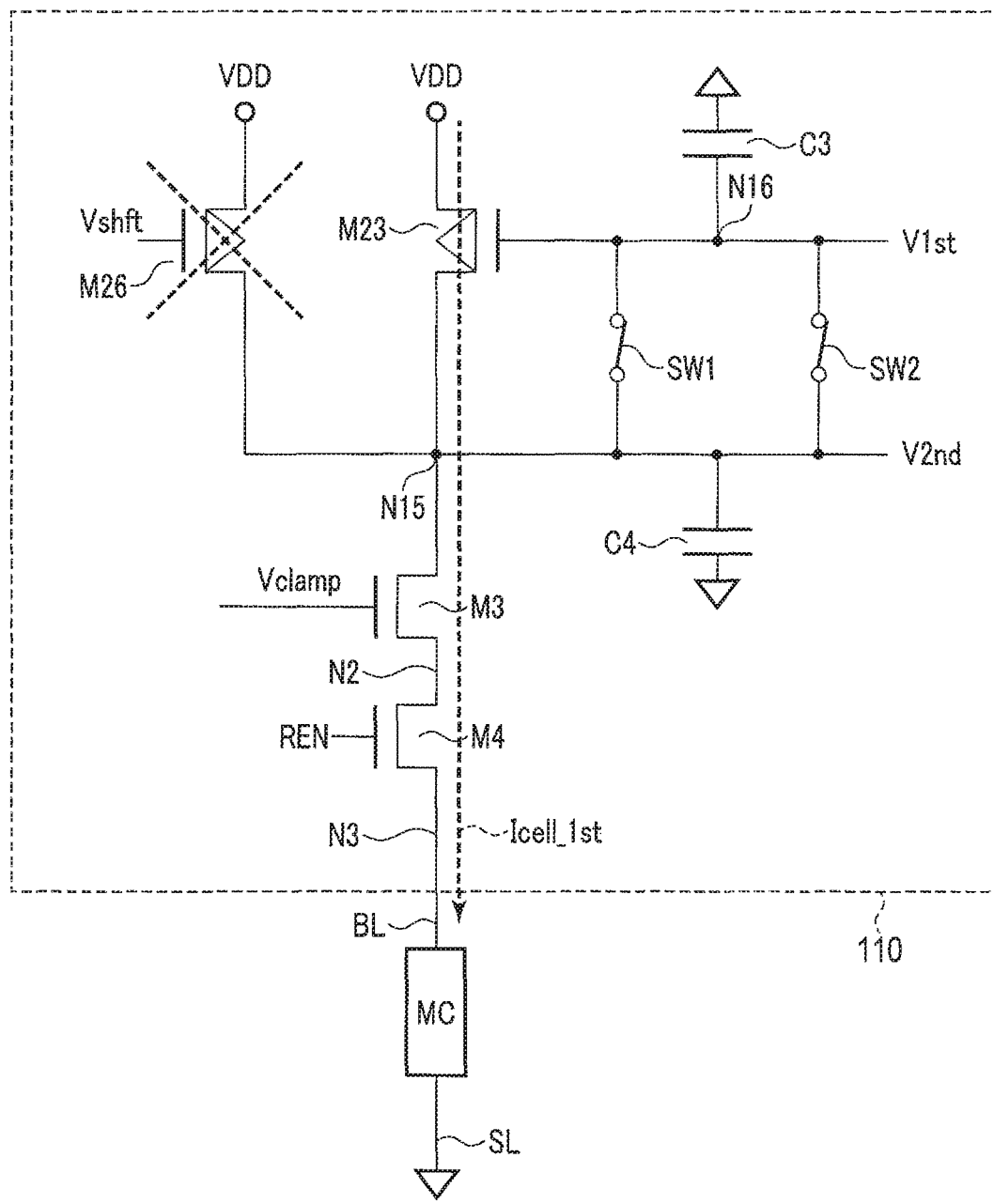
F I G. 31

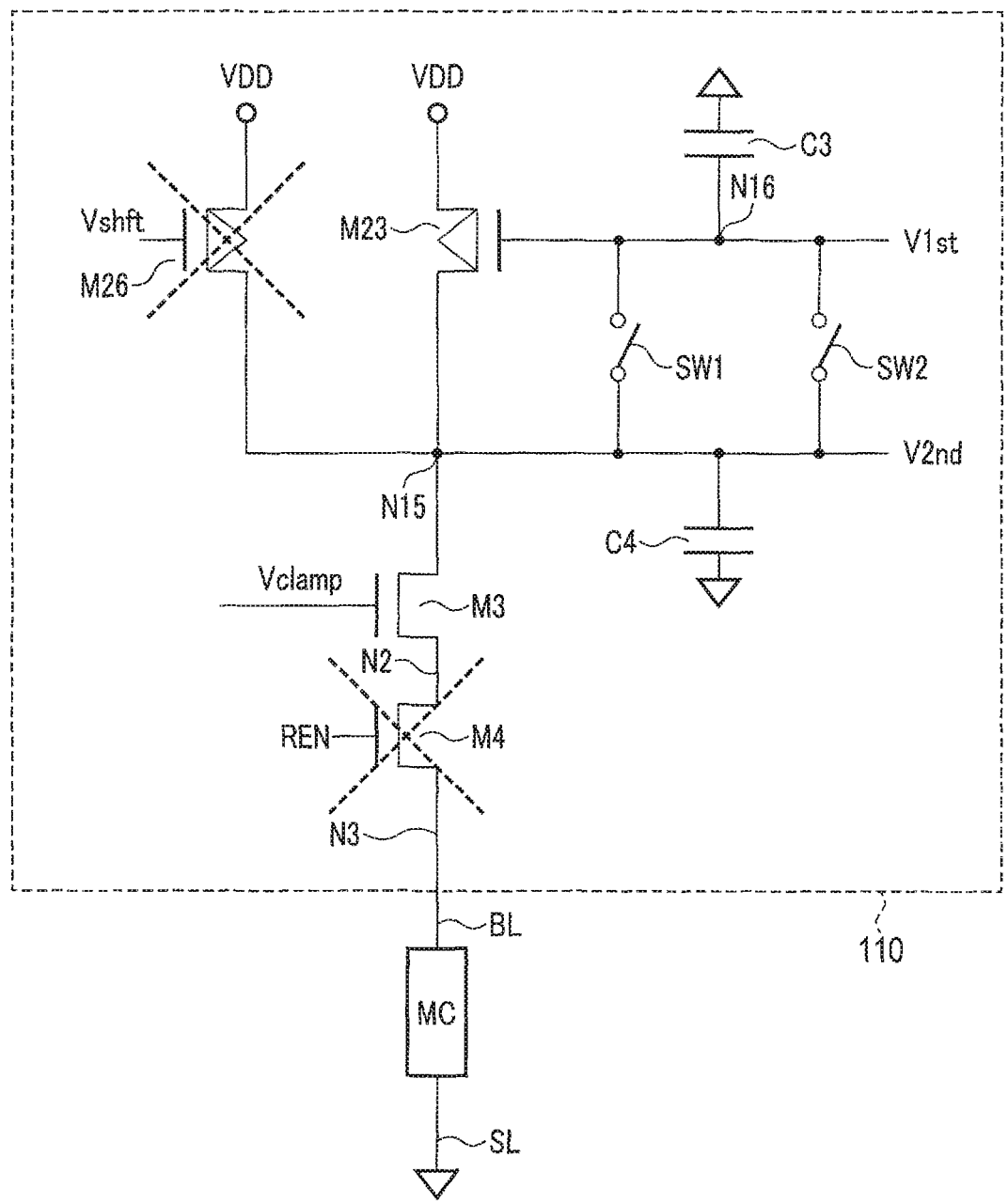
F I G. 33

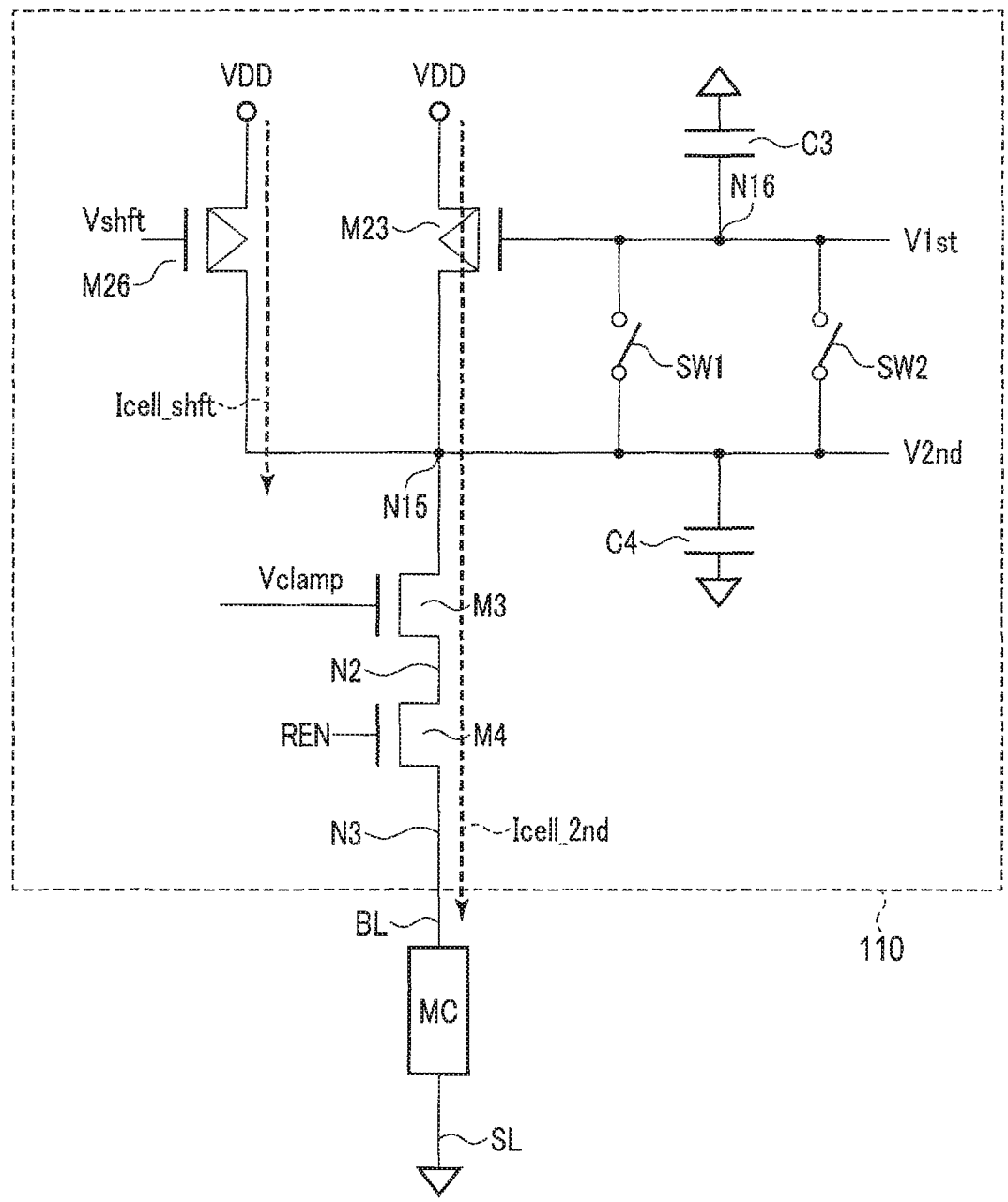
F I G. 34

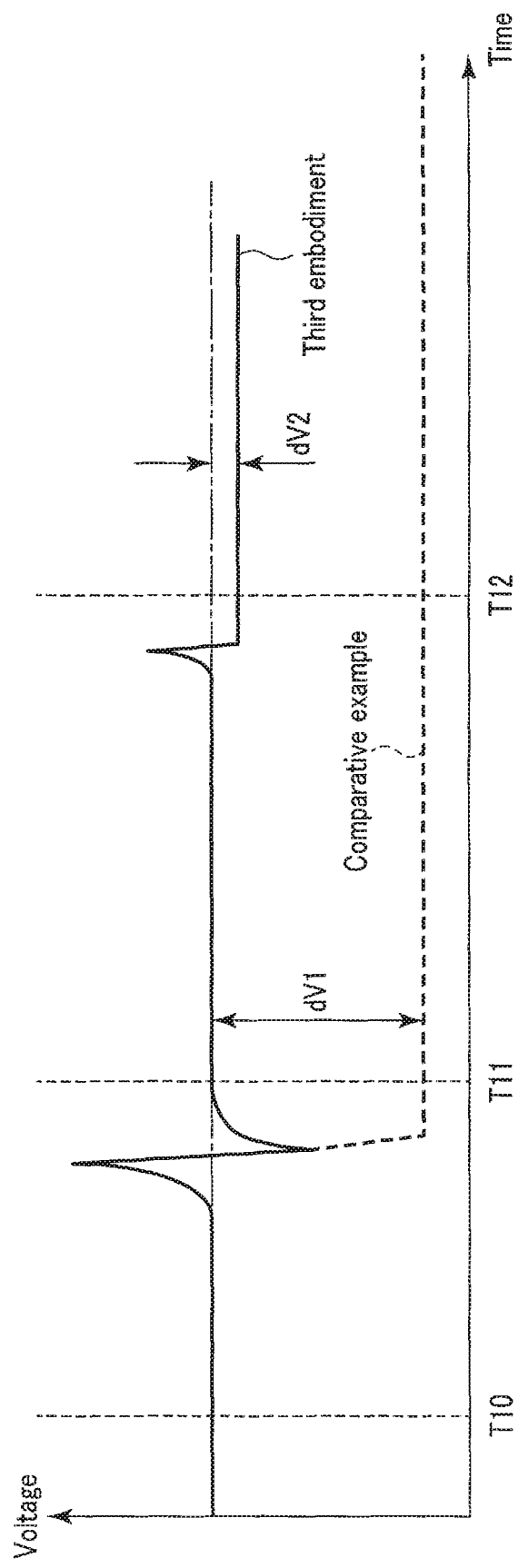
F I G. 35

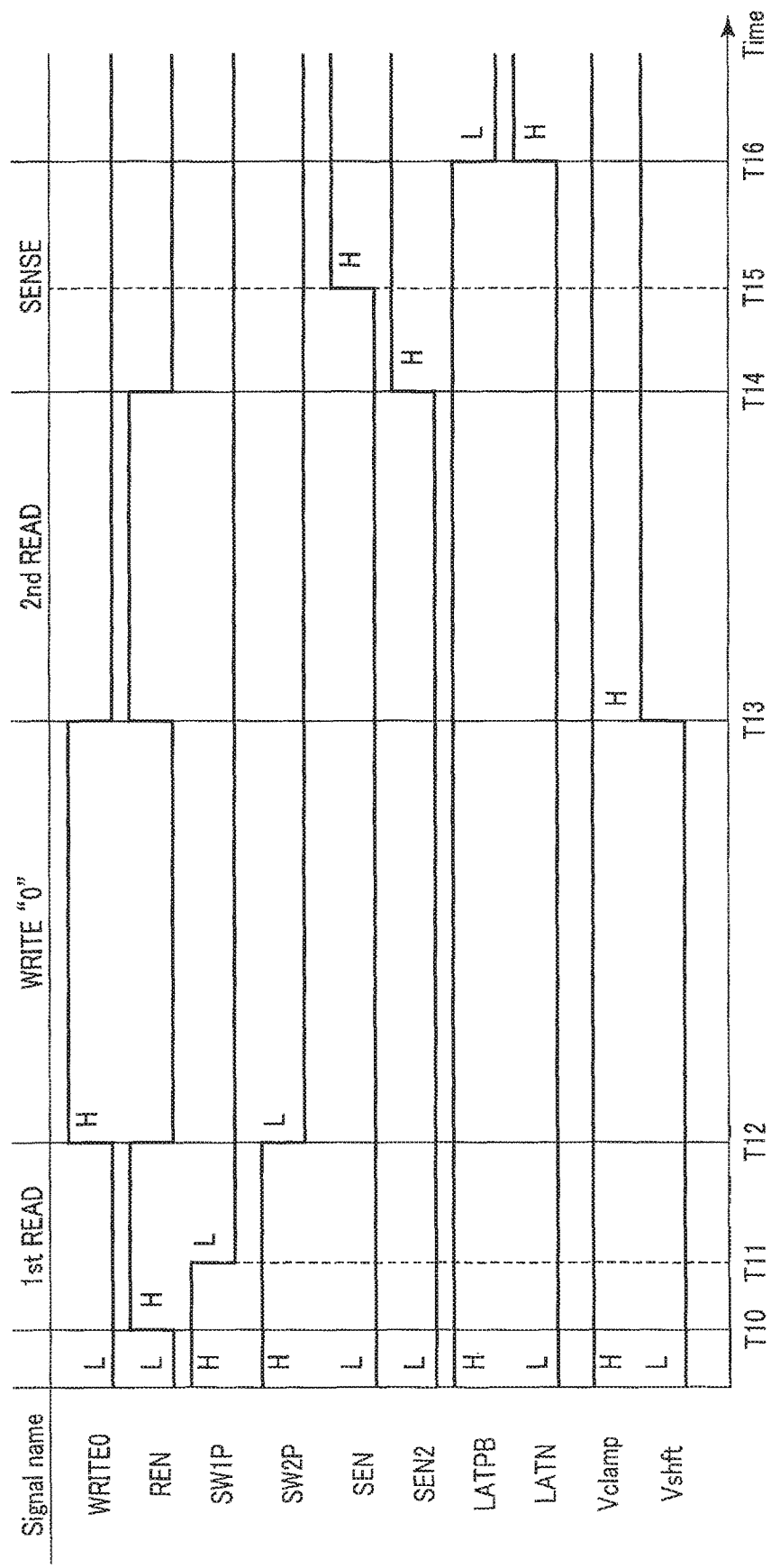
F I G. 37

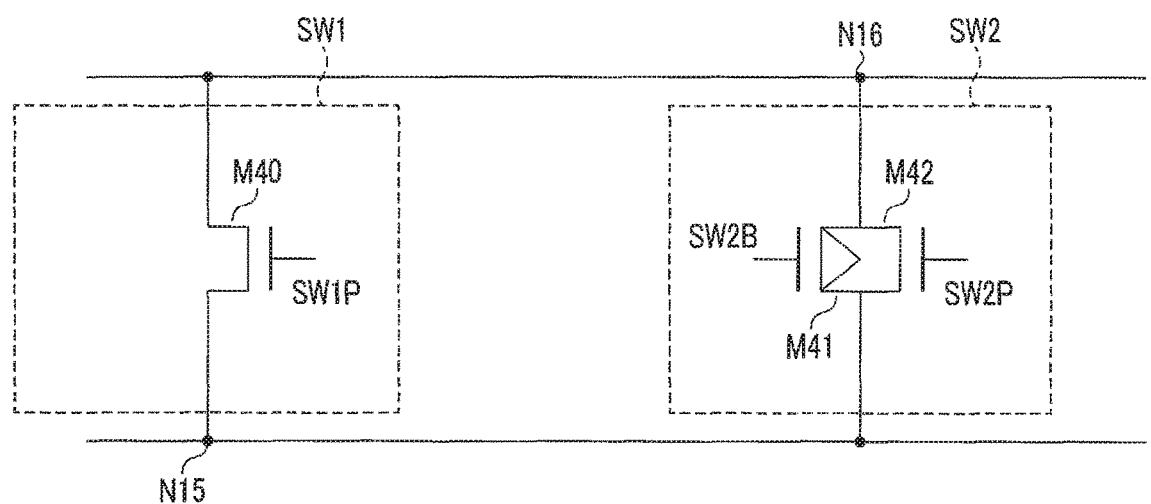
F I G. 38

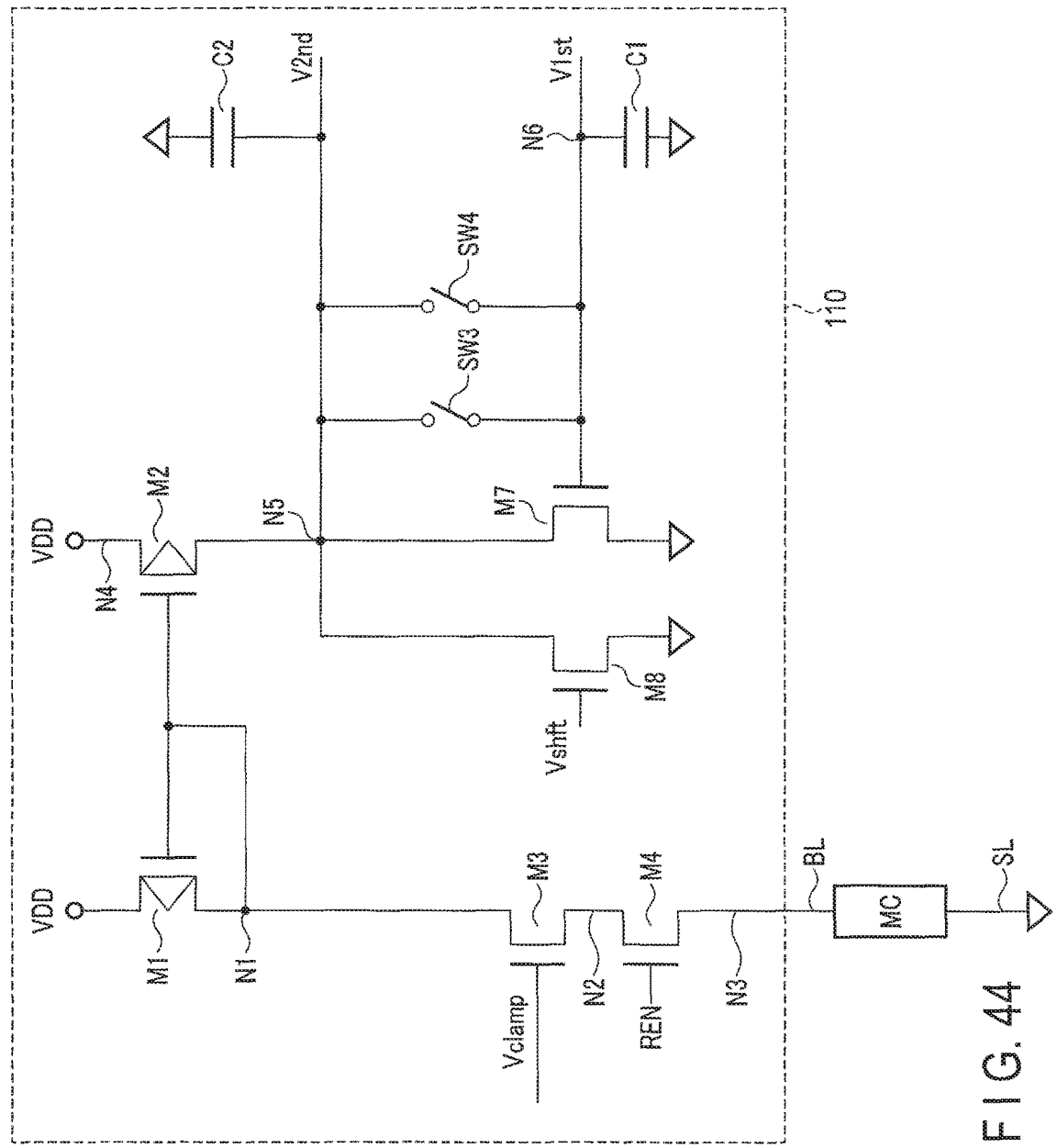
F I G. 44

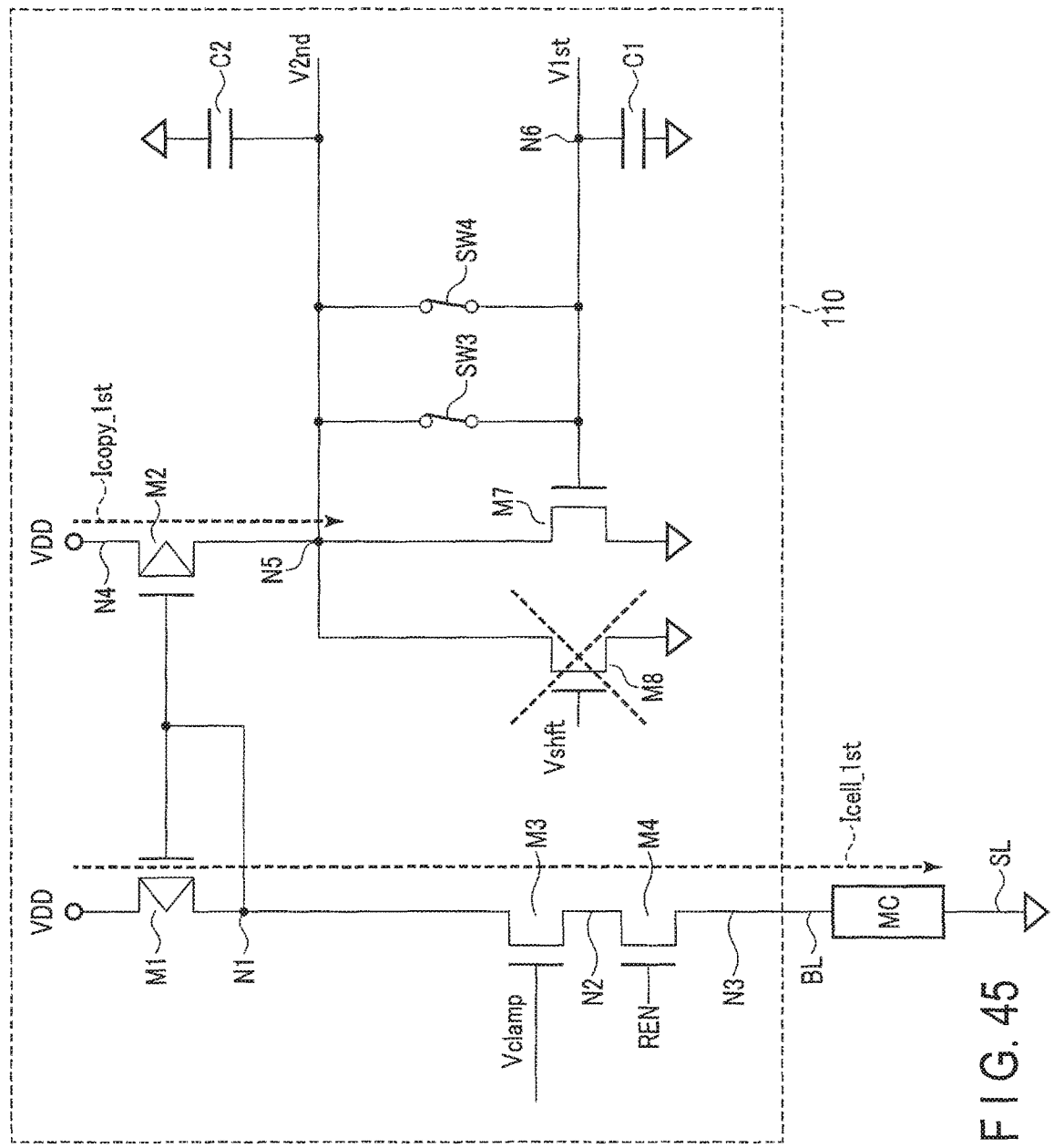
F I G. 45

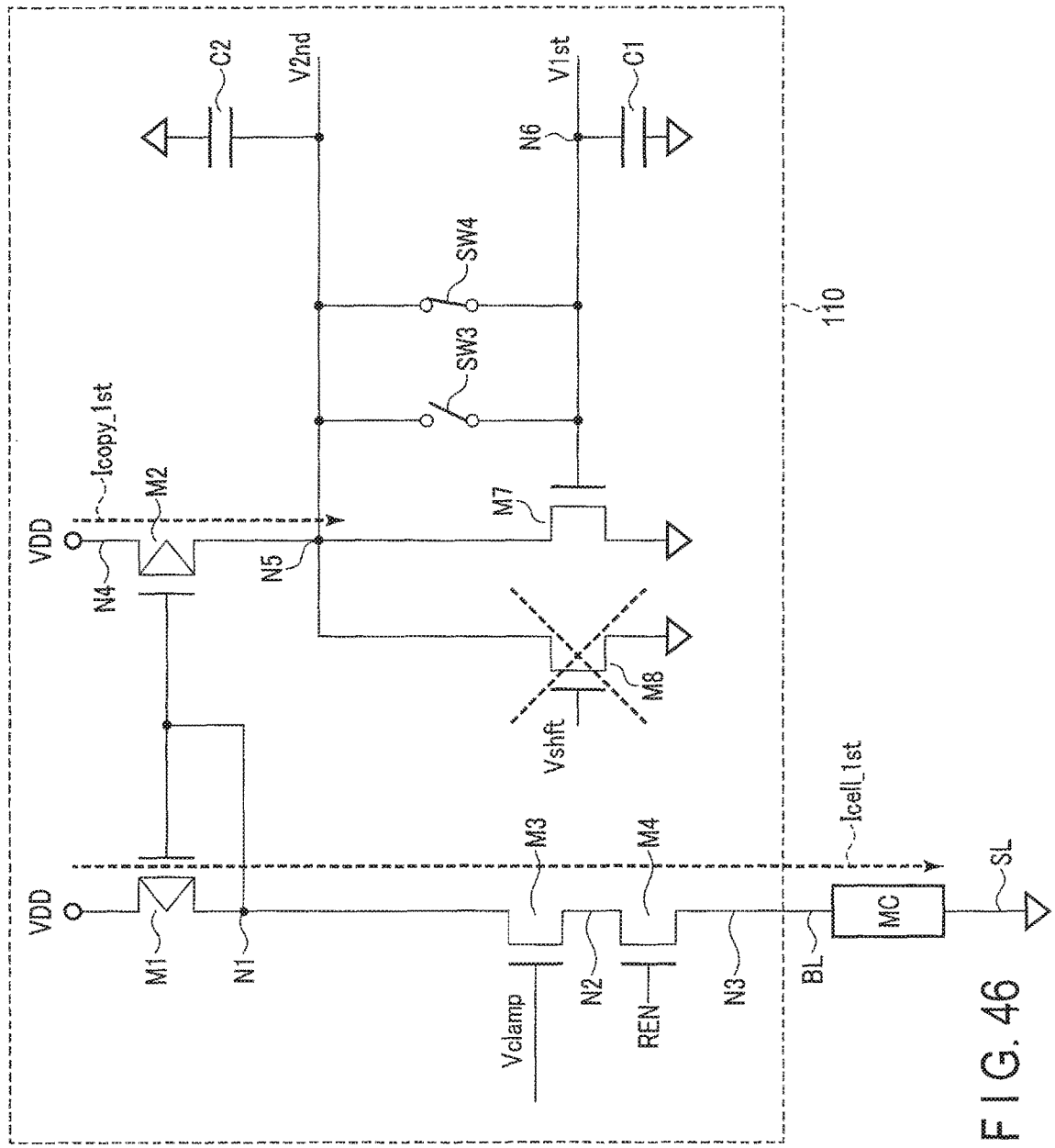
F I G. 46

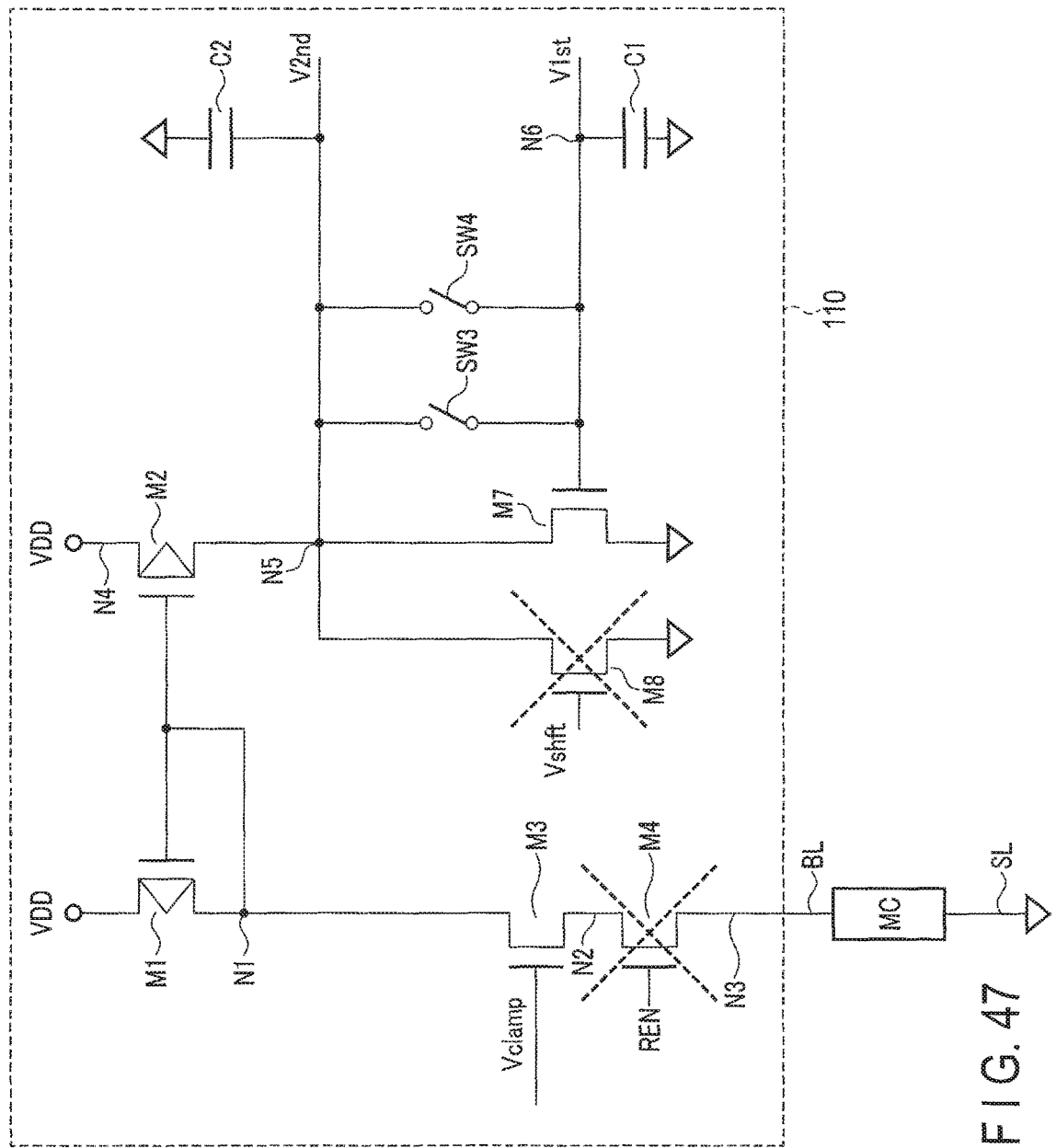
F I G. 47

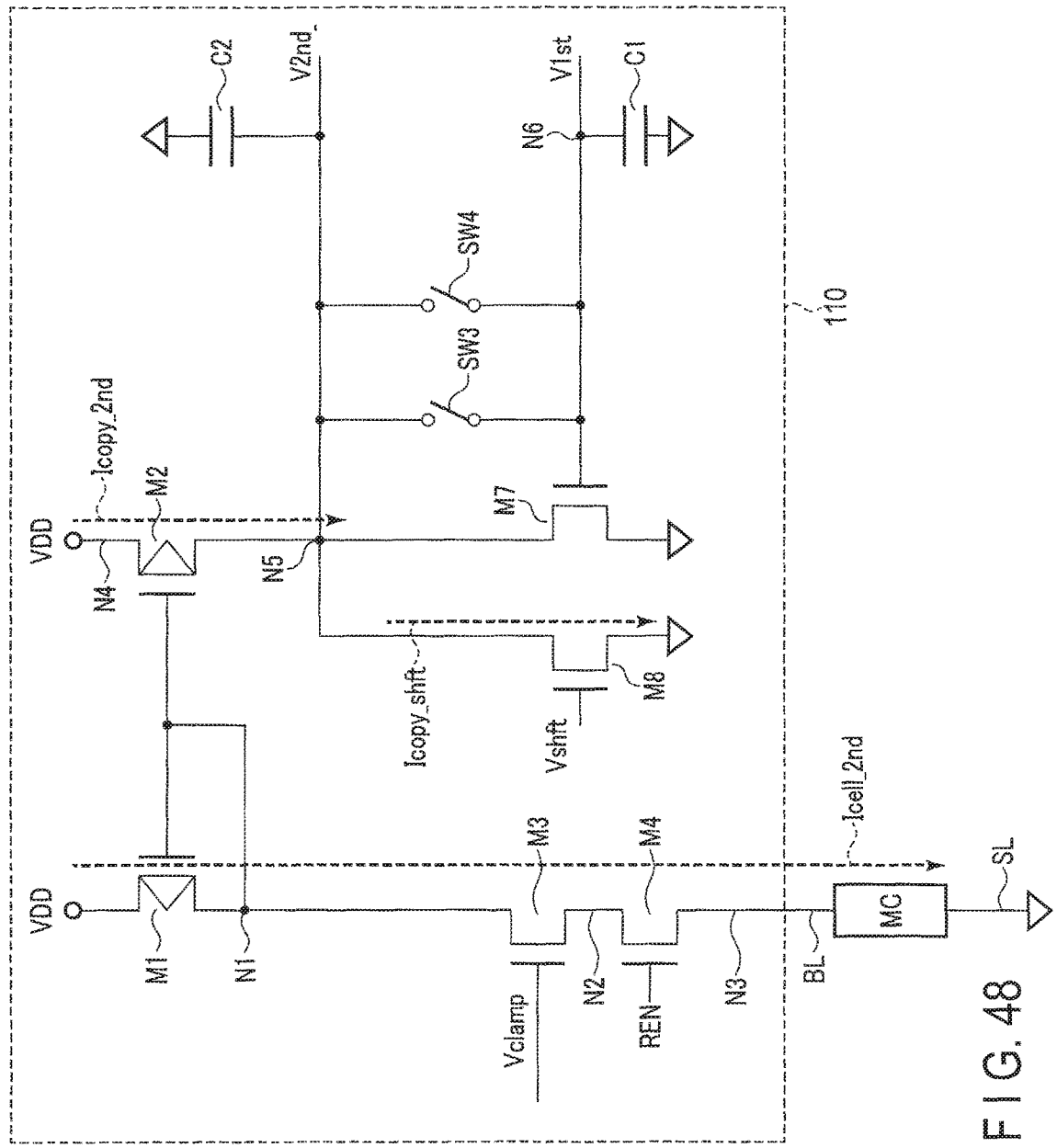
F I G. 48

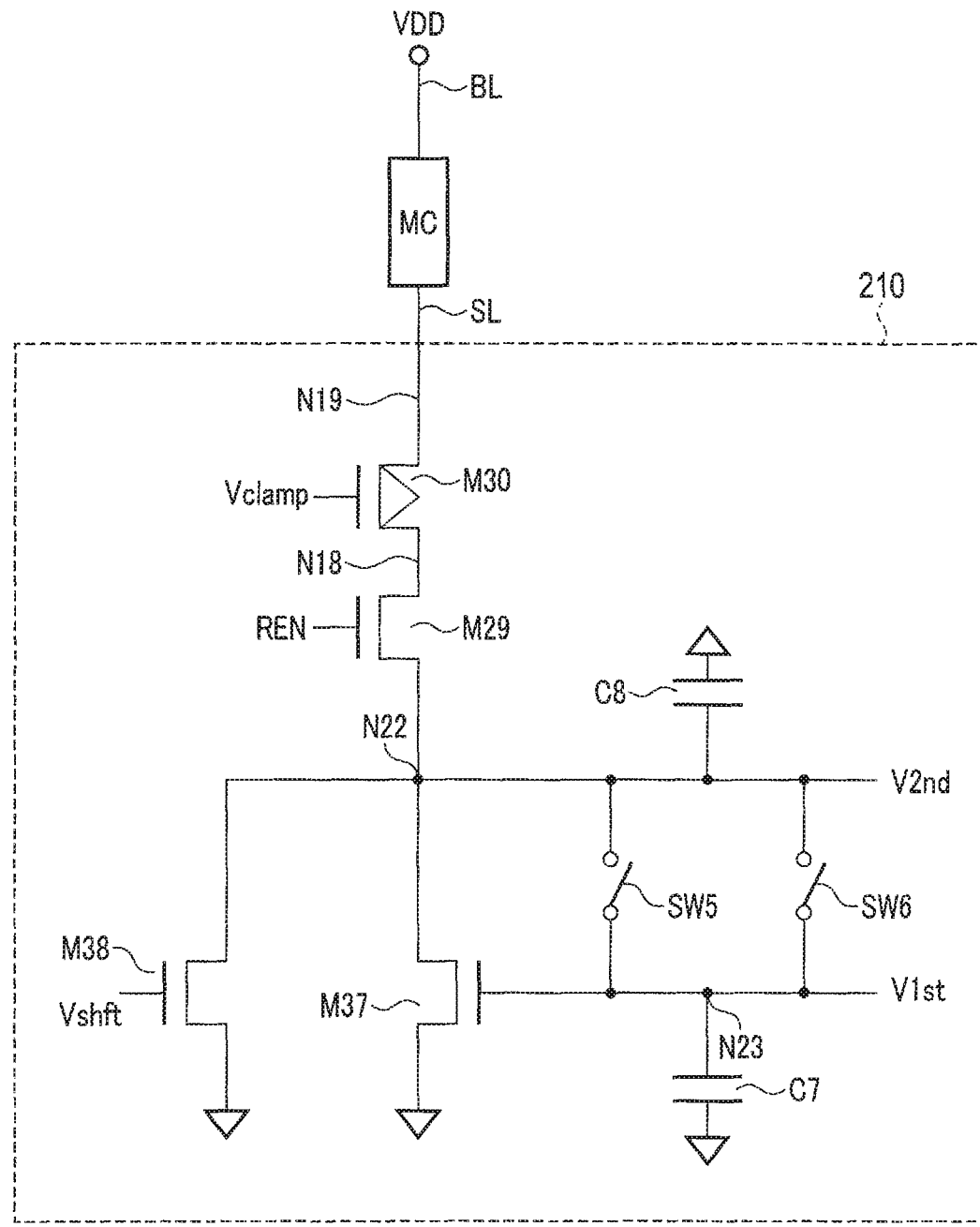
F I G. 49

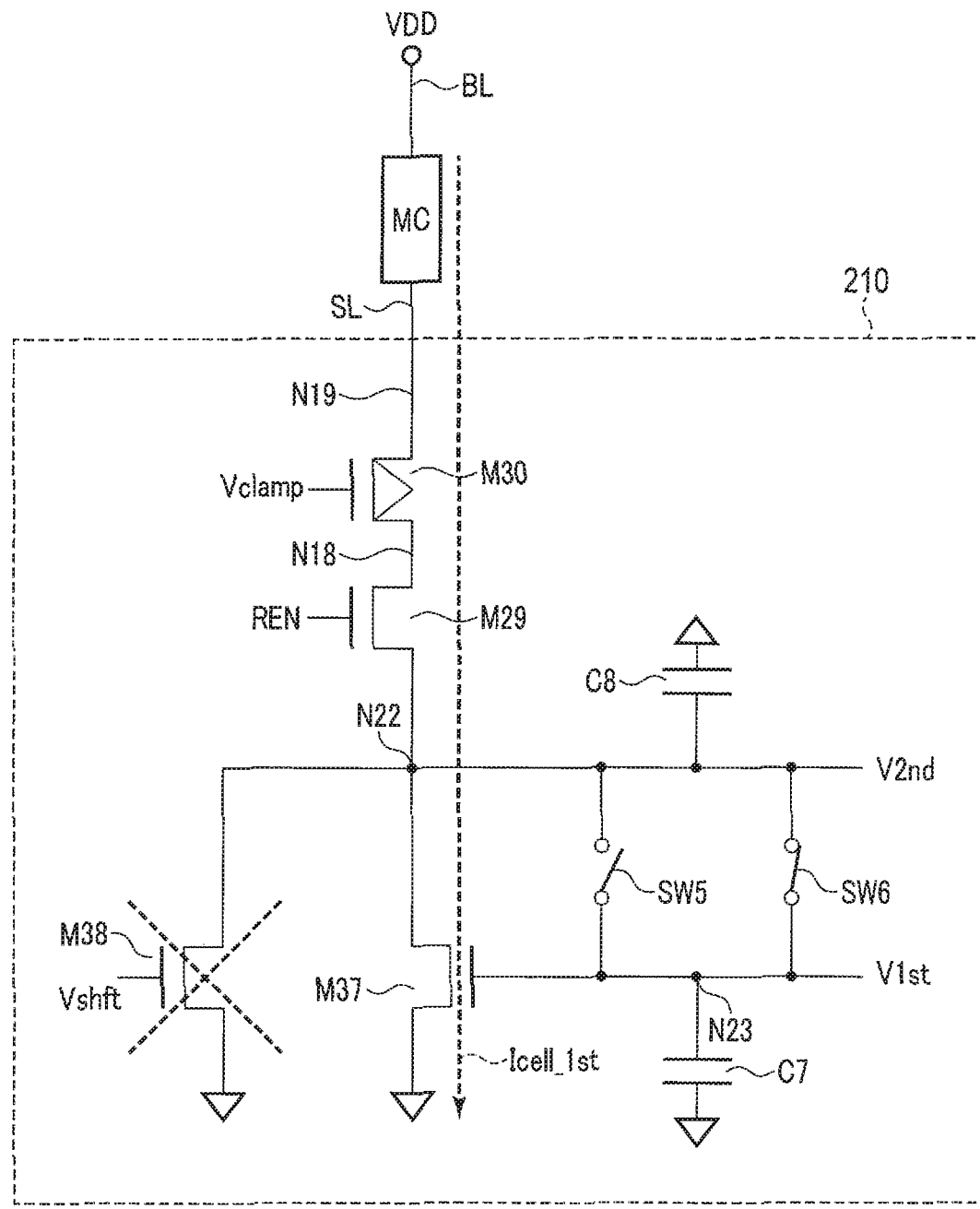
F I G. 52

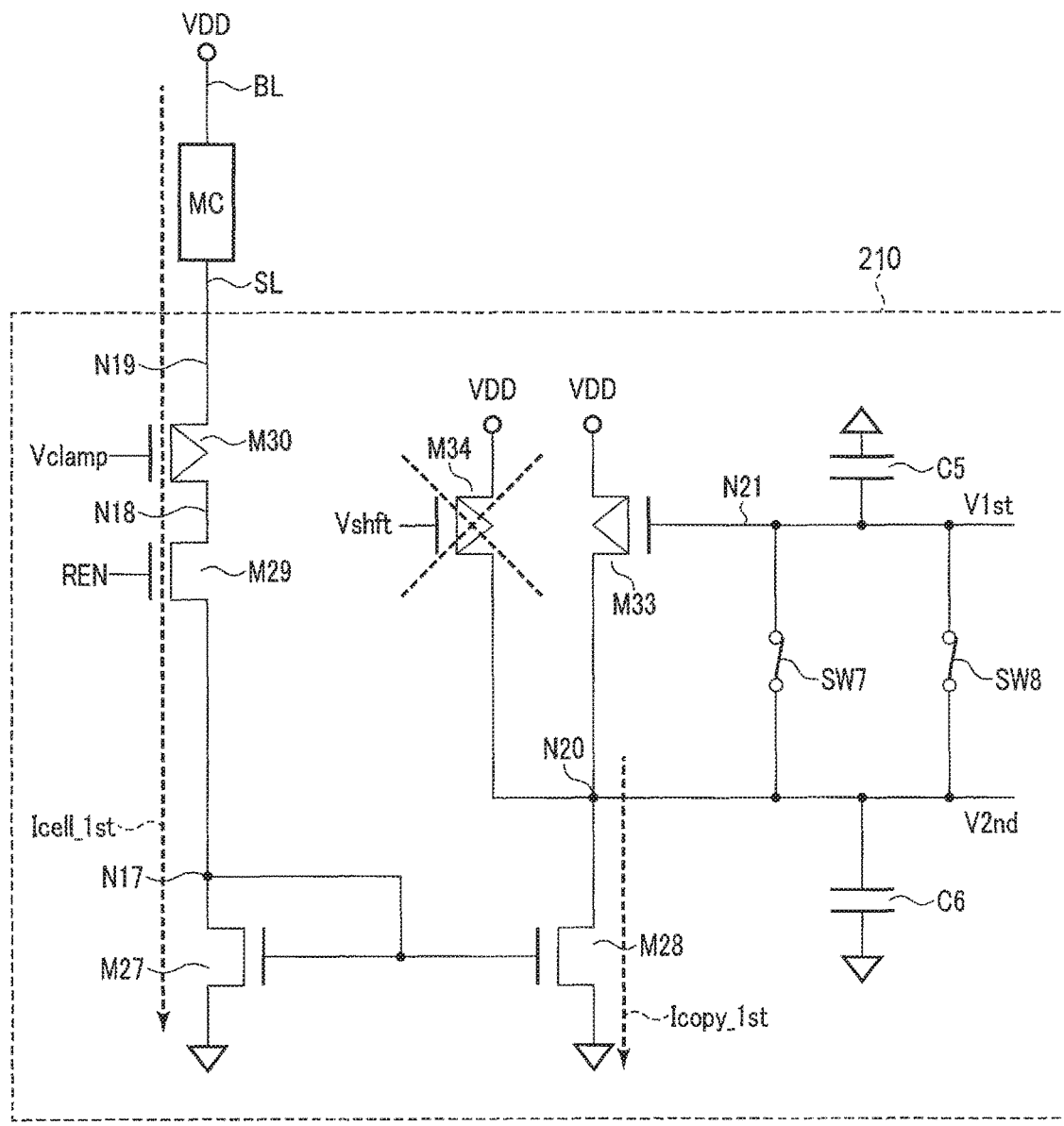
F I G. 56

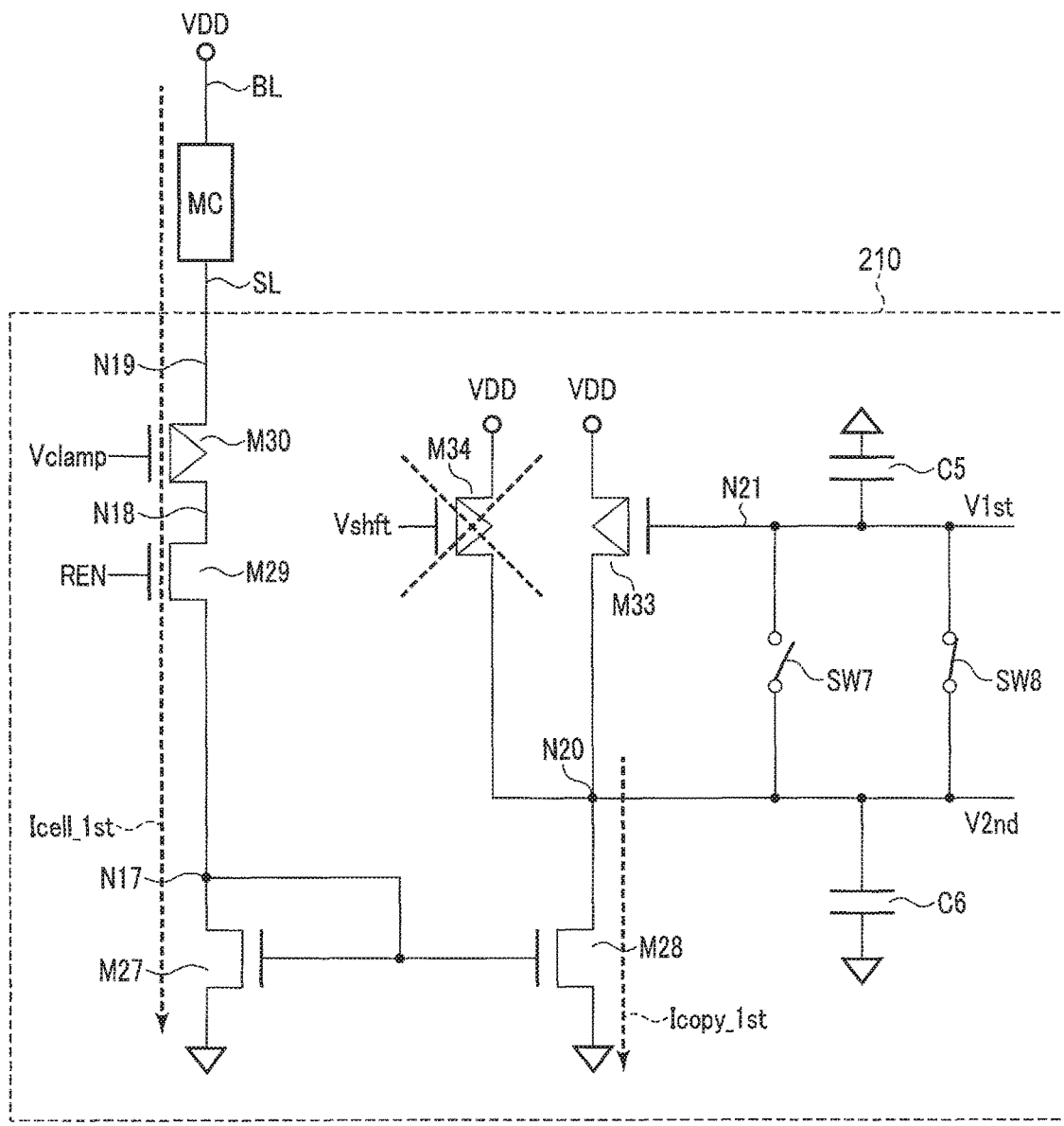
F I G. 57

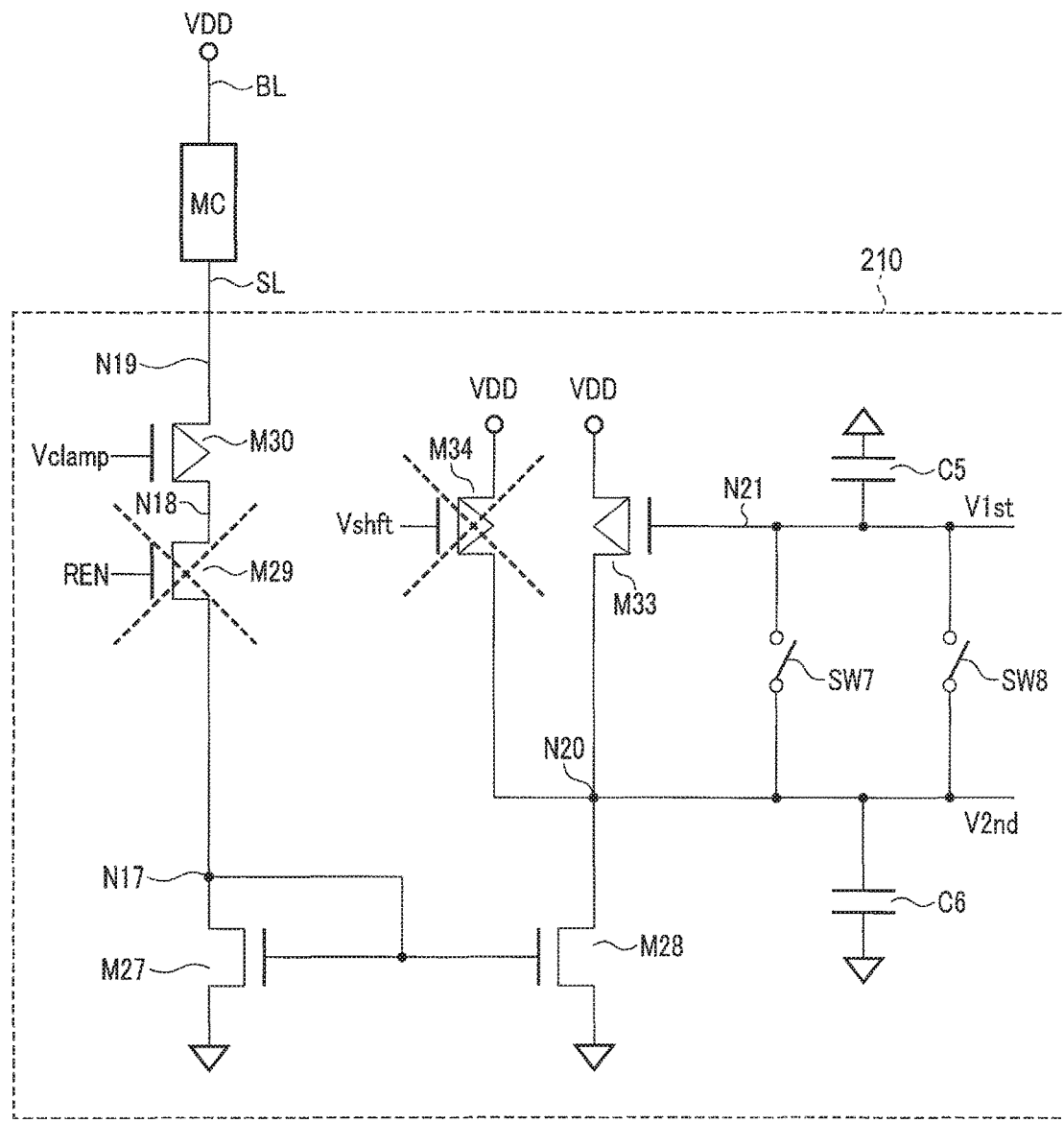
F I G. 58

MEMORY DEVICE

CROSS-REFERENCE TO RELATED APPLICATIONS

This application is based upon and claims the benefit of priority from prior Japanese Patent Application No. 2017-180935, filed Sep. 21, 2017; the entire contents of which are incorporated herein by reference.

FIELD

Embodiments described herein relate generally to a memory device.

BACKGROUND

Magnetoresistive random access memory (MRAM) is a memory device comprising magnetic elements each having a magnetoresistive effect and serving as a memory cell storing information. MRAM has been gathering attention as a next-generation memory device characterized by its high-speed operation, large capacity, and non-volatility. Every effort has been made to research and develop MRAM as a replacement for volatile memory such as dynamic random access memory (DRAM) and static random access memory (SRAM). In this case, MRAM is desirably operated in accordance with the same specifications as those for DRAM and SRAM in order to reduce development costs and to allow the replacement to be smoothly achieved.

BRIEF DESCRIPTION OF THE DRAWINGS

FIG. 1 is a block diagram illustrating a memory system including a memory device according to a first embodiment;

FIG. 5 is a circuit diagram illustrating a preamplifier in the memory device according to the first embodiment;

FIG. 7 is a flow diagram illustrating a read operation of the memory system including the memory device according to the first embodiment;

FIG. 8 is a diagram of waveforms during the read operation of the memory system according to the first embodiment;

FIG. 12 is a diagram illustrating the relationship between a cell current and a voltage during the read operation of the memory system including the memory device according to the first embodiment;

FIG. 14 is a circuit diagram illustrating an operation of the preamplifier in the memory device according to the comparative example of the first embodiment in a first read operation;

FIG. 15 is a circuit diagram illustrating an operation of the preamplifier in the memory device according to the comparative example of the first embodiment in a second read operation;

FIG. 16 is a diagram illustrating the relationship between the cell current and the voltage during a read operation of the memory system including the memory device according to the comparative example of the first embodiment and the relationship between the cell current and the voltage during the read operation of the memory system including the memory device according to the first embodiment;

FIG. 18 is a circuit diagram illustrating a preamplifier in the memory device according to the second embodiment;

FIG. 19 is a diagram of waveforms during a read operation of the memory system according to the second embodiment;

FIG. 21 is a circuit diagram illustrating an operation of the preamplifier in the memory device according to the second embodiment in a write operation;

FIG. 22 is a circuit diagram illustrating an operation of the preamplifier in the memory device according to the second embodiment in a second read operation;

FIG. 24 is a circuit diagram illustrating a preamplifier in a memory device according to a comparative example of the second embodiment;

FIG. 25 is a circuit diagram illustrating an operation of the preamplifier in the memory device according to the comparative example of the second embodiment in a first read operation;

FIG. 26 is a circuit diagram illustrating an operation of the preamplifier in the memory device according to the comparative example of the second embodiment in a second read operation;

FIG. 27 is a diagram illustrating the relationship between the cell current and the voltage during a read operation of the memory system including the memory device according to the comparative example of the second embodiment and the relationship between the cell current and the voltage during the read operation of the memory system including the memory device according to the second embodiment;

FIG. 28 is a circuit diagram illustrating a preamplifier in a memory device according to a third embodiment;

FIG. 29 is a circuit diagram illustrating switches which control connection between a node storing V1st and a node storing V2nd in the preamplifier in the memory device according to the third embodiment;

FIG. 31 is a circuit diagram illustrating an operation of a preamplifier in the memory device according to the third embodiment in a first read operation;

FIG. 33 is a circuit diagram illustrating an operation of the preamplifier in the memory device according to the third embodiment in a write operation;

FIG. 34 is a circuit diagram illustrating an operation of the preamplifier in the memory device according to the third embodiment in a second read operation;

FIG. 35 is a diagram illustrating a voltage during a read operation of a memory system including a memory device according to a comparative example of the third embodiment and a voltage during a read operation of the memory system including the memory device according to the third embodiment;

FIG. 37 is a diagram of waveforms during a read operation of a memory system according to Modification 1 of the third embodiment;

FIG. 38 is a circuit diagram illustrating switches which control connection between a node storing V1st and a node storing V2nd in a preamplifier in a memory device according to Modification 2 of the third embodiment;

FIG. 44 is a circuit diagram illustrating a preamplifier in a memory device according to a fourth embodiment;

FIG. 45 is a circuit diagram illustrating an operation of the preamplifier in the memory device according to the fourth embodiment in a first read operation;

FIG. 46 is a circuit diagram illustrating an operation of the preamplifier in the memory device according to the fourth embodiment in the first read operation;

FIG. 47 is a circuit diagram illustrating an operation of the preamplifier in the memory device according to the fourth embodiment in a write operation;

FIG. 48 is a circuit diagram illustrating an operation of the preamplifier in the memory device according to the fourth embodiment in a second read operation;

FIG. 49 is a circuit diagram illustrating a preamplifier in a memory device according to a fifth embodiment;

FIG. 52 is a circuit diagram illustrating an operation of the preamplifier in the memory device according to the fifth embodiment in the first read operation;

FIG. 56 is a circuit diagram illustrating an operation of the preamplifier in the memory device according to the sixth embodiment in a first read operation;

FIG. 57 is a circuit diagram illustrating an operation of the preamplifier in the memory device according to the sixth embodiment in the first read operation;

FIG. 58 is a circuit diagram illustrating an operation of the preamplifier in the memory device according to the sixth embodiment in a write operation.

DETAILED DESCRIPTION

Figure 2:
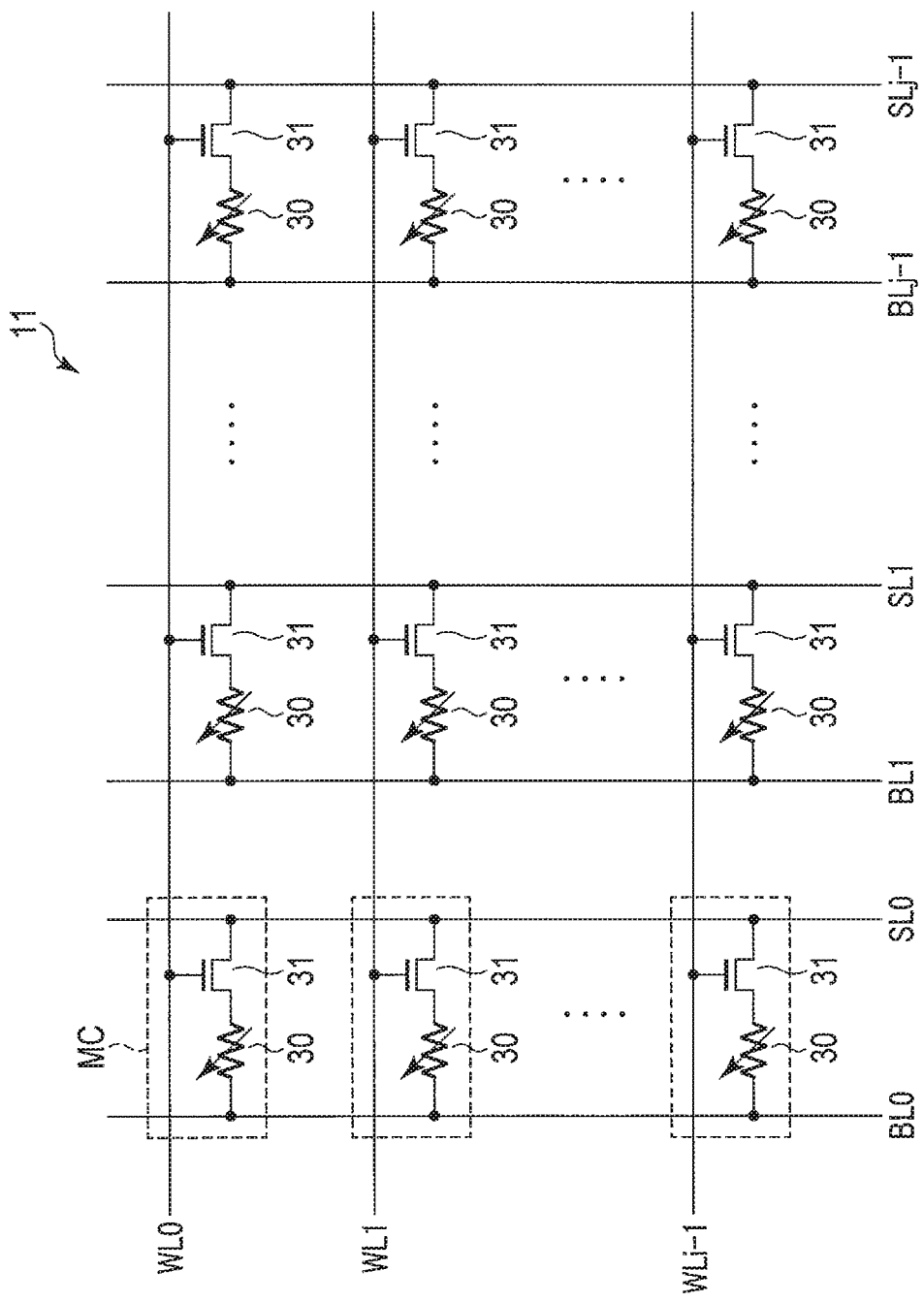
FIG. 2 is a circuit diagram illustrating a memory array in the memory device according to a first embodiment.

In general, according to one embodiment, a memory device includes a preamplifier configured to execute a first read in which a first current relating to a memory cell is passed through a first path and a second current relating to the first current is passed through a second path, to generate a first voltage, to write first data to the memory cell; and to execute a second read in which a third current relating to the memory cell with the first data written thereto is passed through the first path and a fourth current relating to the third current is passed through the second path, to generate a second voltage; and a sense amplifier configured to determine data stored in the memory cell during execution of the first read based on the first voltage and the second voltage.

Embodiments will be described below with reference to the drawings. Components having substantially the same functions and configurations are hereinafter denoted by the same reference numerals, and duplicate description of the components is given only when needed. The embodiments disclosed below illustrate apparatuses and methods adapted to embody technical concepts of the embodiments, and the technical concepts of the embodiments are not intended to limit materials, shapes, structures, arrangements, and the like of the components to those described below. Various changes may be made to the technical concepts of the embodiments without departing from the scope of the claims.

Functional blocks may be implemented in hardware, computer software, or a combination thereof. Thus, the blocks will generally be described below in terms of the functions thereof in order to clarify that the blocks may be in hardware, computer software, or a combination thereof. Whether these functions are implemented in hardware or software depends on the specific embodiment or design constraints imposed on the overall system. Those skilled in the art may implement the functions using various methods, and determination of such implementation is included in the scope of the present invention.

In the embodiments described below, application of MRAM to a memory array will be described.

<1> First Embodiment

<1-1> Configuration

<1-1-1> Configuration of the Memory System

A basic configuration of a memory system according to a first embodiment will be described in brief using FIG. 1. The memory system 1 comprises a memory device 10 and a memory controller 20.

<1-1-2> Configuration of the Memory Controller

The memory controller 20 writes and reads data to and from, the memory device 10 in response to instructions from a host (external equipment) 2 such as a personal computer.

The memory controller 20 comprises a host interface (I/F) 21, a data buffer 22, a register 23, a CPU 24, a device interface (I/F) 25, and an error correcting code (ECC) circuit 26.

The host interface 21 is connected to the host 2. Via the host interface 21, data transmissions, receptions, and the like are performed between the host 2 and the memory system 1.

The data buffer 22 is connected to the host interface 21. The data buffer 22 receives data transmitted from the host 2 to the memory system 1 via the host interface 21 to temporarily store the data. The data buffer 22 also temporarily stores data transmitted from the memory system 1 to the host 2 via the host interface 21. The data buffer 22 may be a volatile memory or a non-volatile memory.

The register 23 is, for example, a volatile memory and stores setting information, commands, status, and the like which relate to execution of the CPU 24. The register may be a volatile memory or a non-volatile memory.

The CPU 24 is responsible for operations of the overall memory system 1. The CPU 24 executes prescribed processes on the memory device 10 in accordance with commands received from, for example, the host 2.

The device interface 25 transmits various signals and the like from the memory controller 20 to the memory device 10 and receives various signals and the like from the memory device 10.

The ECC circuit 26 receives, via the data buffer 22, write data received from the host 2. The ECC circuit 26 then adds error correcting codes to the write data. The ECC circuit 26 supplies the write data with the error correcting codes added thereto to, for example, the data buffer 22 or the device interface 25.

The ECC circuit 26 also receives data supplied from the memory device 10, via the device interface 25. The data corresponds to data stored in memory cells in the memory array 11. The ECC circuit 26 determines whether or not the data received from the memory device 10 has an error. In a case of determining that the received data has an error, the ECC circuit 26 executes an error correcting process on the received data using an error correcting code. The ECC circuit 26 then supplies the data subjected to the error correcting process to, for example, the data buffer 22, the device interface 25, and the like.

<1-1-3> Configuration of the Memory Device

The memory device 10 according to the first embodiment comprises the memory array 11, a sense amplifier/write driver 12, a column decoder 13, a word line driver 14, a row decoder 15, an IO circuit 16, a controller 17, and a command address input circuit 18.

The command address input circuit 18 receives, from the memory controller 20, various external control signals, for example, chip select signal CS, a clock signal CK, a clock enable signal CKE, and a command address signal CA. The command address input circuit 18 transfers the command address signal CA to the controller 17.

The controller 17 discriminates commands from addresses. The controller 17 controls the memory device 10.

The memory array 11 is MRAM and comprises a plurality of memory cells MC. Each of the memory cells MC includes a magnetic tunnel junction (MTJ) element 30 (not illustrated in the drawings) and a select transistor 31 (not illustrated in the drawings). The MTJ element 30 is a magnetic tunnel junction element which stores data based on a change in resistance state and which enables data to be rewritten by current. The select transistor 31 is provided in association with the MTJ element 30 and configured to be brought into a conductive state when a current is passed through the corresponding MTJ element 30. The MTJ element 30 may be referred to as a resistance change element.

A plurality of word lines WL extends in a row direction, and a plurality of the word lines WL and the bit lines BL are routed in such a manner as to intersect one another. Two adjacent bit lines form a pair, and each of the memory cells MC is provided in association with intersection points between the word line WL and the bit line pair (in the present embodiments, the bit line pair is referred to as a bit line BL and a source line SL for convenience of description). The MTJ element 30 and the select transistor 31 of each memory cell MC are connected together in series between the bit line BL and the source line SL (between the bit lines of the bit line pair). Furthermore, a gate of the select transistor 31 is connected to the word line WL.

The word line driver 14 is arranged at least along one side of the memory array 11. During a data read or a data write, the word line driver 14 is configured to apply a voltage to the corresponding word line WL.

The row decoder 15 decodes an address in the command address signal supplied from the command address input circuit 18. More specifically, the row decoder 15 supplies a decoded row address to the word line driver 14. Consequently, the word line driver 14 can apply a voltage to a selected word line WL.

The column decoder 13 decodes an address in the command address signal CA supplied from the command address input circuit 18. The column decoder 13 supplies a decoded column address to the sense amplifier/write driver 12.

The sense amplifier/write driver 12 comprises a sense amplifier and a write driver. The sense amplifier/write driver 12 is arranged at least along one side of the memory array 11. The sense amplifier connected to the bit lines BL via global bit lines GBL to sense a current flowing through memory cells MC connected to the selected word line WL to read data stored in the memory cells MC. The write driver is connected to the bit lines BL via the global bit lines GBL or to the source line SL via a global source line GSL. To write data to selected memory cells MC, the write driver passes a current through the selected memory cells MC connected to the selected word line WL.

The sense amplifier/write driver 12 also comprises a page buffer not illustrated in the drawings. The page buffer is, for example, a volatile memory and stores data read from the sense amplifier or write data transferred via the IO circuit 16.

Data is transferred between the sense amplifier/write driver 12 and a data line DQ via the IO circuit 16.

<1-1-4> Memory Array

Now, a specific configuration of the memory array in the memory device according to the first embodiment will be described using FIG. 2. As described above, the memory array 11 comprises a plurality of memory cells MC arrayed in a matrix. Specifically, the memory array 11 is provided with a plurality of word lines WL0 to WLi−1 (i: an integer of 2 or larger), a plurality of bit lines BL0 to BLj−1, and a plurality of source lines SL0 to SLj−1 (j: an integer of 2 or larger).

The memory cell MC comprises the MTJ element 30 and the select transistor 31. The select transistor 31 comprises, for example, an N channel metal oxide field effect transistor (MOSFET).

The MTJ element 30 comprises a first end connected to the corresponding bit line BL and a second end connected to a drain of the select transistor 31. The select transistor 31 comprises a gate connected to the corresponding word line WL and a source connected to the source line SL.

<1-1-5> Memory Cell

Now, the memory cell in the memory device according to the first embodiment will be described in brief using FIG. 3.

Figure 3:
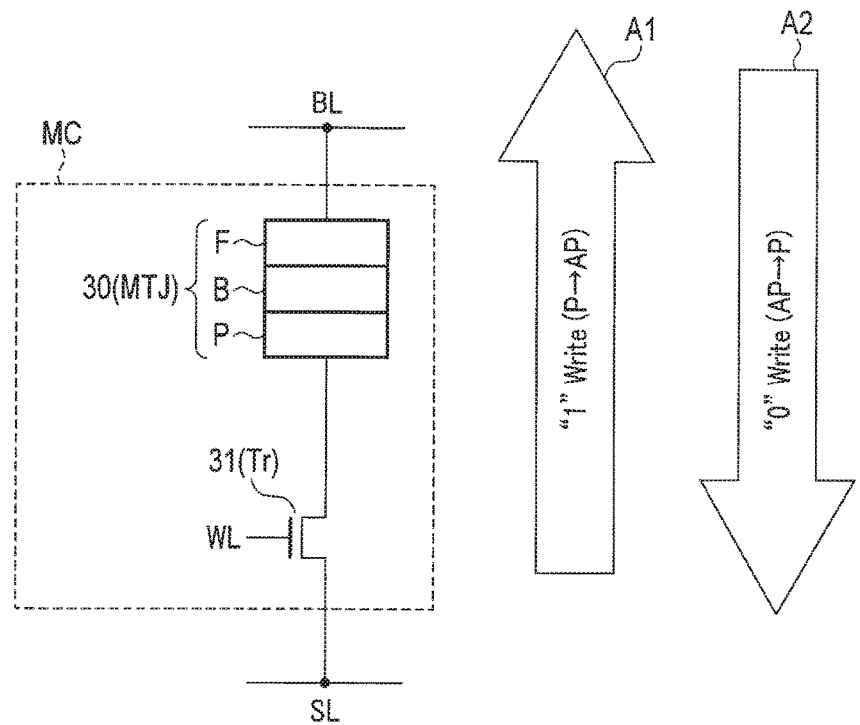
FIG. 3 is a diagram illustrating a basic configuration of a memory cell in the memory device according to the first embodiment.

As illustrated in FIG. 3, the MTJ element 30, which utilizes a tunneling magnetoresistive (TMR) effect, comprises two ferromagnetic layers F, P and a non-magnetic layer (tunnel insulating film) B between the ferromagnetic layers F, P to store digital data based on a change in magnetic resistance resulting from a spin polarization tunnel effect. The MTJ element 30 may be brought into a low resistance state or a high resistance state depending on magnetization sequences of the two ferromagnetic layers F, P. For example, when the low resistance state is defined as "0" data and the high resistance state is defined as "1" data, 1-bit data can be recorded in the MTJ element 30. Of course, the low resistance state is defined as "1" data, and the high resistance state may be defined as "0" data.

For example, the MTJ element 30 comprises a fixed layer (pinned layer) P, a tunnel barrier layer B, a recording layer (free layer) F stacked in this order. The pinned layer P is a layer in which the direction of a magnetization sequence is fixed, and the free layer has a magnetization sequence with a variable direction. Data is stored based on the direction of the magnetization. The pinned layer P and the free layer F are formed of a ferromagnetic substance, and the tunnel barrier layer B is formed of an insulating film.

Specifically, the free layer F may be formed of, for example, ferrocobalt boron (CoFeB) or iron boride (FeB). The pinned layer P may be formed of, for example, cobalt platinum (CoPt), cobalt nickel (CoNi), or cobalt palladium (CoPd). The tunnel barrier layer B is formed of a non-magnetic material, for example, a non-magnetic metal, a non-magnetic semiconductor, or an insulator. The tunnel barrier layer B may be formed of, for example, magnesium oxide (MgO) or aluminum oxide ($Al_2O_3$).

During a write, when a current is passed in the direction of arrow A1, the direction of the magnetization sequence of the free layer F becomes anti-parallel to the direction of the magnetization sequence of the pinned layer P (AP state), leading to the high resistance state ("1" data). Such a write operation may be referred to as a "1" write operation. During a write, when a current is passed in the direction of arrow A2, the direction of the magnetization sequence of the free layer F becomes parallel to the direction of the magnetization sequence of the pinned layer P (P state), leading to the low resistance state ("0" data). Such a write operation may be referred to as a "0" write operation. In this manner, data that can be written to the MTJ element can be varied depending on the direction in which a current is passed.

The above-described phrase "the magnetization direction is variable" indicates that the magnetization direction is changed with respect to a prescribed write current. The above-described phrase "the magnetization direction is fixed" indicates that the magnetization direction is not changed with respect to the prescribed write current.

<1-1-6> Sense Amplifier/Write driver

The sense amplifier/write driver 12 in the memory device according to the first embodiment will be described using FIG. 4.

Figure 4:
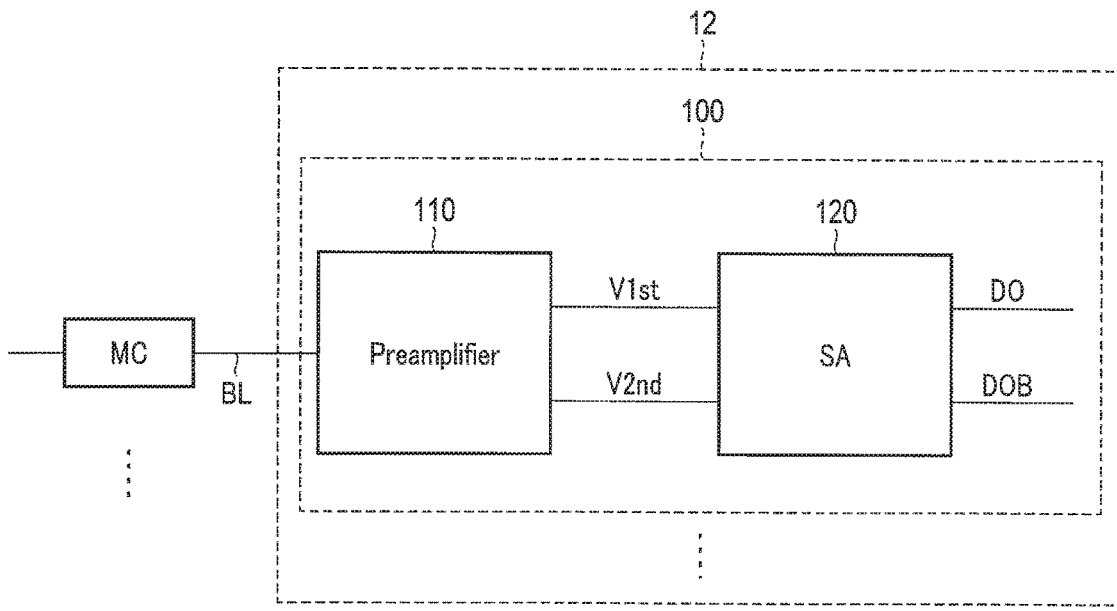
FIG. 4 is a block diagram illustrating a sense amplifier/write driver in the memory device according to the first embodiment.

As illustrated in FIG. 4, the sense amplifier/write driver 12 comprises a plurality of sense circuits 100. Each of the plurality of sense circuits 100 is provided for a corresponding one of the bit lines (global bit lines). Each of the plurality of sense circuits 100 comprises a preamplifier 110 and a sense amplifier (SA) 120.

The preamplifier 110 supplies a current (cell current) to each memory cell MC via the corresponding bit line BL and stores voltages V1st and V2nd based on the cell current.

The sense amplifier 120 determines data (DO, DOB) based on the voltages V1st and V2nd stored in the preamplifier 110.

<1-1-6-1> Configuration of the Preamplifier

Now, a configuration of the preamplifier 110 in the memory device 10 according to the first embodiment will be described using FIG. 5.

As illustrated in FIG. 5, the preamplifier 110 comprises PMOS transistors M1, M2, and M5, CMOS transistors M3, M4, M6, M7, and M8, and capacitances C1 and C2.

The transistor M1 comprises a first end to which a power-supply voltage VDD is applied and a second end and a gate electrode both connected to a node N1.

The transistor M2 comprises a first end to which the power-supply voltage VDD is applied, a second end connected to a node N5, and a gate electrode connected to the node N1.

The transistor M1 and the transistor M2 function as a current mirror.

The transistor M3 comprises a first end connected to the node N1, a second node connected to a node N2, and a gate electrode to which a signal Vclamp is supplied.

The transistor M4 comprises a first end connected to the node N2, a second node connected to the bit line (global bit line), and a gate electrode to which the signal REN is supplied.

The transistor M5 comprises a first end connected to the node N5, a second end connected to a node N6, and a gate electrode to which a signal SW1B is supplied.

The transistor M6 comprises a first end connected to the node N5, a second end connected to the node N6, and gate electrode to which a signal SW1P is supplied.

The transistor M5 and the transistor M6 function as one switch.

The transistor M7 comprises a first end connected to the node N5, a second node to which a ground voltage VSS is applied, and a gate electrode connected to the node N6.

The transistor M8 comprises a first end connected to the node N5, a second node to which the ground voltage VSS is applied, and a gate electrode to which a signal Vshft is supplied.

The capacitance C1 comprises a first end connected to the node N6 and a second end to which the ground voltage VSS is applied.

The capacitance C1 comprises a first end connected to the node N5 and a second end to which the ground voltage VSS is applied.

A potential of the node N5 is supplied to the sense amplifier 120 as V2nd. The transistors M2, M7, and M8, the node N5, and the capacitance C2 may be considered to be a V2nd generation unit.

A potential of the node N6 is supplied to the sense amplifier 120 as V1st. The transistors M2, M5, M6, and M7, the node N6, and the capacitance C1 may be considered to be a V1st generation unit.

Operations of the preamplifier 110 will be described below.

<1-1-6-2> Configuration of the Sense Amplifier

Now, a configuration of the sense amplifier 120 in the memory device according to the first embodiment will be described using FIG. 6.

Figure 6:
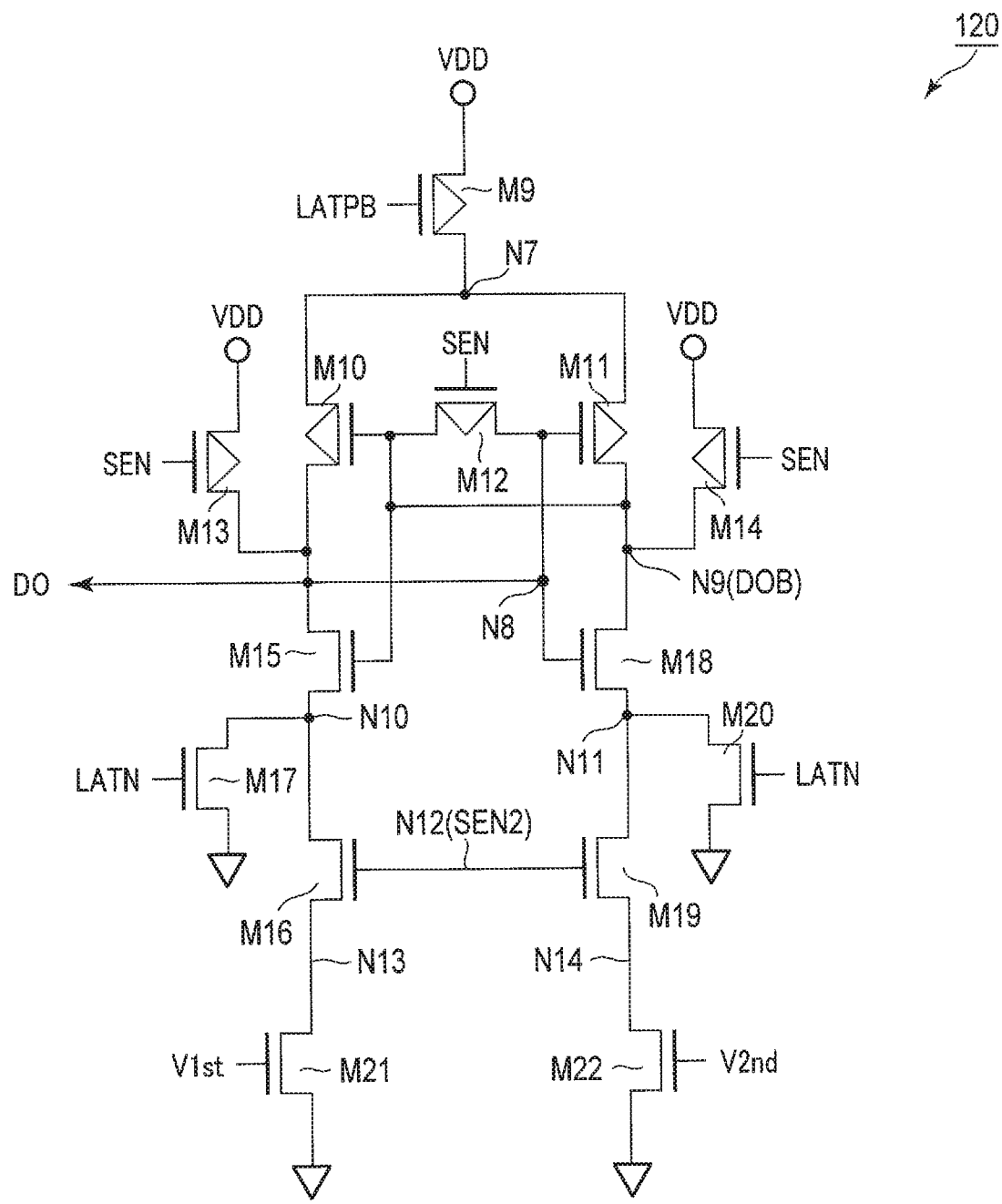
FIG. 6 is a circuit diagram illustrating the sense amplifier in the memory device according to the first embodiment.

As illustrated in FIG. 6, the sense amplifier 120 comprises PMOS transistors M9, M10, M11, M12, M13, and M14, and NMOS transistors M15, M16, M17, M18, M19, M20, M21, and M22.

The transistor M9 comprises a first end to which the power-supply voltage VDD is applied, a second node connected to a node N7, and a gate electrode to which a signal LATPB is supplied.

The transistor M10 comprises a first end connected to the node N7, a second node connected to a node N8, and a gate electrode connected to a node N9.

The transistor M11 comprises a first end connected to the node N7, a second node connected to the node N9, and a gate electrode connected to the node N8.

The transistor M12 comprises a first end connected to the node N8, a second node connected to the node N9, and a gate electrode to which a signal SEN is supplied.

The transistor M13 comprises a first end to which the power-supply voltage VDD is applied, a second node connected to the node N8, and a gate electrode to which the signal SEN is supplied.

The transistor M14 comprises a first end to which the power-supply voltage VDD is applied, a second node connected to the node N9, and a gate electrode to which the signal SEN is supplied.

The transistor M15 comprises a first end connected to the node N8, a second node connected to a node N10, and a gate electrode connected to the node N9.

The transistor M16 comprises a first end connected to a node N10, a second node connected to a node N13, and a gate electrode to which a signal SEN2 is supplied via a node N12.

The transistor M17 comprises a first end connected to the node N10, a second node to which the ground voltage VSS is applied, and a gate electrode to which a signal LATN is supplied.

The transistor M18 comprises a first end connected to the node N9, a second node connected to a node N11, and a date electrode connected to the node N8.

The transistor M19 comprises a first end connected to the node N11, a second node connected to a node N14, and a gate electrode to which the signal SEN2 is supplied via the node N12.

The transistor M20 comprises a first end connected to the node N11, a second node to which the ground voltage VSS is applied, and a gate electrode to which the signal LATN is supplied.

The transistor M21 comprises a first end connected to the node N13, a second node to which the ground voltage VSS is applied, and a gate electrode to which the signal V1st is supplied.

The transistor M22 comprises a first end connected to a node N14, a second node to which the ground voltage VSS is applied, and a gate electrode to which the signal V2nd is supplied.

A potential of the node N8 is supplied to the IO circuit 16 as DO.

A potential of the node N9 is supplied to the IO circuit 16 as DOB.

Operations of the sense amplifier 120 will be described below.

<1-2> Operation

As described above, each of the MTJ elements in the memory device according to the first embodiment stores data using a change in resistance value. To read information stored in such an MTJ element, the memory device passes a read current (also referred to as a cell current) through the MTJ element. Then, by converting the resistance value of the MTJ element into a current value or a voltage value and comparing the resultant value with a reference value, the memory device can determine the resistance state.

However, an increase in variation in resistance among the MTJ elements may reduce the interval between resistance value distributions for the "0" state and the "1" state. Consequently, read margins may be significantly reduced in the case of a reading method of setting a reference value for the interval between the resistance value distributions and determining the state of each MTJ element based on comparison with the reference value.

Thus, in the first embodiment, for the "0" state and "1" state of the MTJ element, signal information (current value or voltage value) on one of these resistance states is provided, and shift signal information is added to the signal information to obtain a reference signal. A self-referencing reading method will be described in which the initial state of the MTJ element is determined based on the reference signal.

Now, a read operation of the memory system according to the first embodiment will be described.

<1-2-1> Outline of the Read Operation

An outline of the read operation of the memory system according to the first embodiment will be provided using FIG. 7.

[Step S1001]

Upon receiving a read instruction from the host 2, the memory controller 20 issues an active command and a read command to the memory device 10.

Upon receiving the active command and the read command from the memory controller 20, the memory device 10 performs a first read operation (1st READ) on each read target memory cell. As a result of the first read operation, the preamplifier 110 stores the resistance state of the read target memory cell as voltage information (signal voltage) V1st.

[Step S1002]

The memory device 10 performs a "0" write operation (WRITE "0") on the memory cell corresponding to a target of the first read operation. Consequently, the memory cell corresponding to the target of the first read operation is overwritten with the "0" data. This operation sets the memory cell to a reference state (in this case, "0") in order to generate V2nd described below. In other words, this write operation may be referred to as a normalizing operation.

[Step S1003]

The memory device 10 performs a second read operation (2nd READ) on the memory cell corresponding to the target of the first read operation. As a result of the second read operation, the preamplifier 110 generates voltage information (signal voltage) V2nd.

[Step S1004]

Based on V2nd generated by step S1003, the sense amplifier 120 determines the result of V1st generated by step S3001. Specifically, the sense amplifier 12o compares V1st with V2nd to determine the data stored in the memory cell.

As a method for writing back data after step S1004, one example of a method for writing back data will be described below. However, the present embodiment is not limited to this.

After data stored in the memory cell is determined, the memory controller 20 writes back data to the memory cell.

With this, it is possible to restore data stored in the memory cell from the beginning in the memory cell.

<1-2-2> Details of the Read Operation

Details of the read operation of the memory system according to the first embodiment will be described in accordance with a waveform diagram in FIG. 8.

[Time T1] through [Time T2]

In the first read operation (step S1001), the controller 17 sets the signal REN, the signal SW1P, and the signal Vclamp to an "H (High)" level, and sets the signal SW1B and the signal Vshft to an "L (Low)" (L<H) level.

Figure 9:
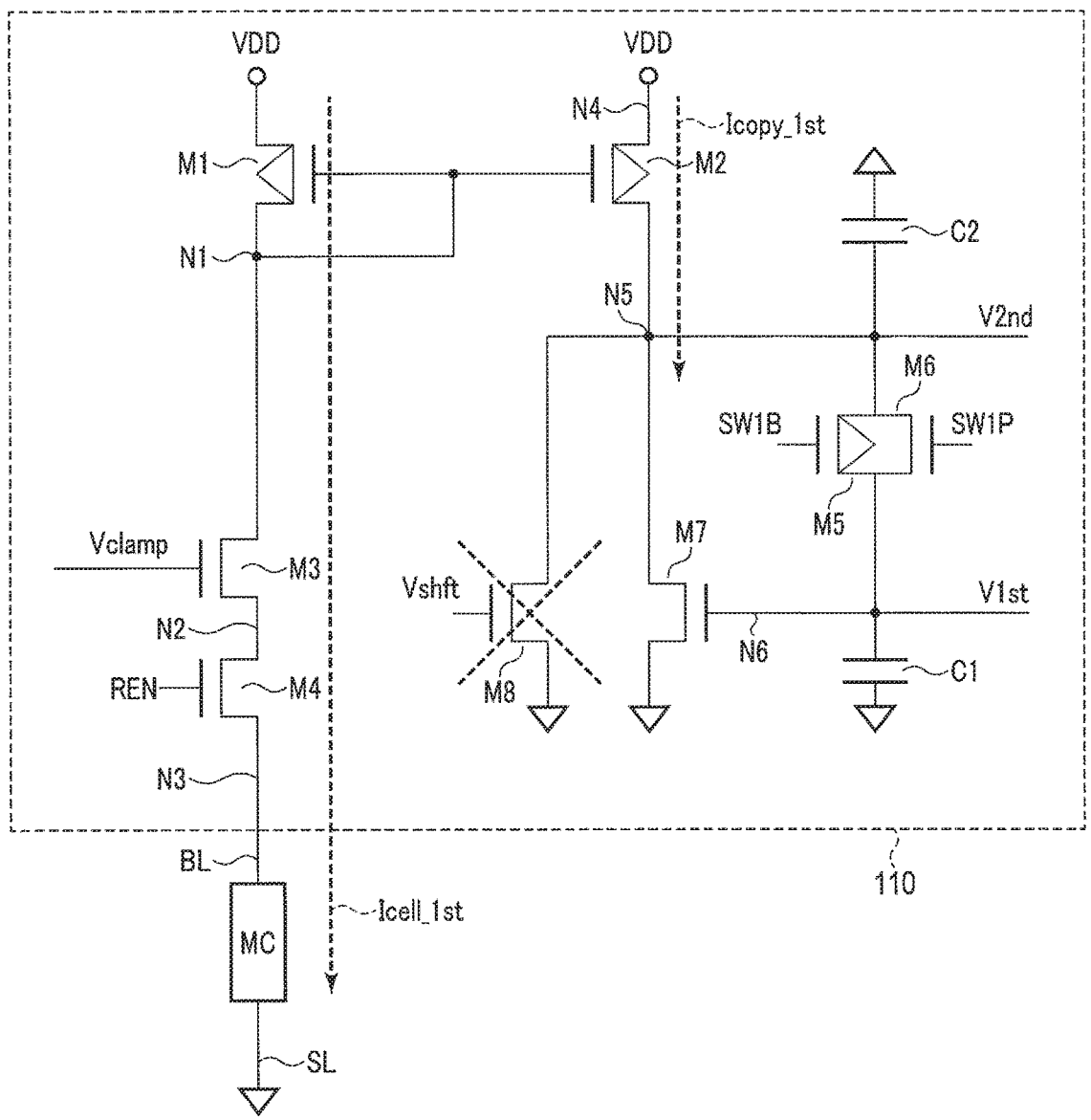
FIG. 9 is a circuit diagram illustrating an operation of the preamplifier in the memory device according to the first embodiment in a first read operation.

Consequently, as illustrated in FIG. 9, the transistors M3, M4, M5, and M6 are set to an on (conductive) state. Consequently, the node N1 is grounded via the bit line (global bit line), the memory cell MC, and the source line (global source line). As a result, the potential of the node N1 decreases to set the transistors M1 and M2 to the on state. The transistors M1 and M2 are driven as diode-connected transistors.

When the transistor M1 is set to the on state, the transistor M1 supplies a cell current (Icell_1st) to the memory cell MC.

The transistor M2 is driven based on the potential of the node M1. Thus, the transistor M2 supplies a copied current (Icopy_1st) of the cell current (Icell_1st) to the node N5. The copied current as used herein refers to a current resulting from referencing of the cell current (Icell_1st). In other words, the copied current means a current proportional to the cell current. That is, the copied current need not necessarily have the same magnitude as that of the cell current. For example, the copied current as used herein is applicable to the present embodiment even if the magnitude of the copied current is double or half the magnitude of the cell current. This is also applicable to the copied current used in the description below and thus, description of the copied current is omitted below.

As described above, the transistors M1 and M2 form a current mirror.

Then, the potential of the node N6 is set to correspond to voltage information (signal voltage) V1st based on the copied current (Icopy_1st).

As described above, the preamplifier 110 passes the cell current (Icell_1st) through the memory cell MC via a first current path comprising the transistors M1, M3, and M4. The preamplifier 110 passes the copied current (Icopy_1st) through the node N6 via a second current path comprising the transistors M2. The first current path and the second current path are electrically separated from each other.

The transistor M8 is set to the off state (non-conductive state).

[Time T2] through [Time T3]

In the "0" write operation (step S1002), the controller 17 lowers the levels of the signal REN and the signal SW1P to "L" and raises the levels of the signal WRITE0 and the signal SW1B to "H". The signal WRITE0 is a signal relating to the "0" write operation. When the signal WRITE0 is at the "H" level, the write driver performs the "0" write operation.

Figure 10:
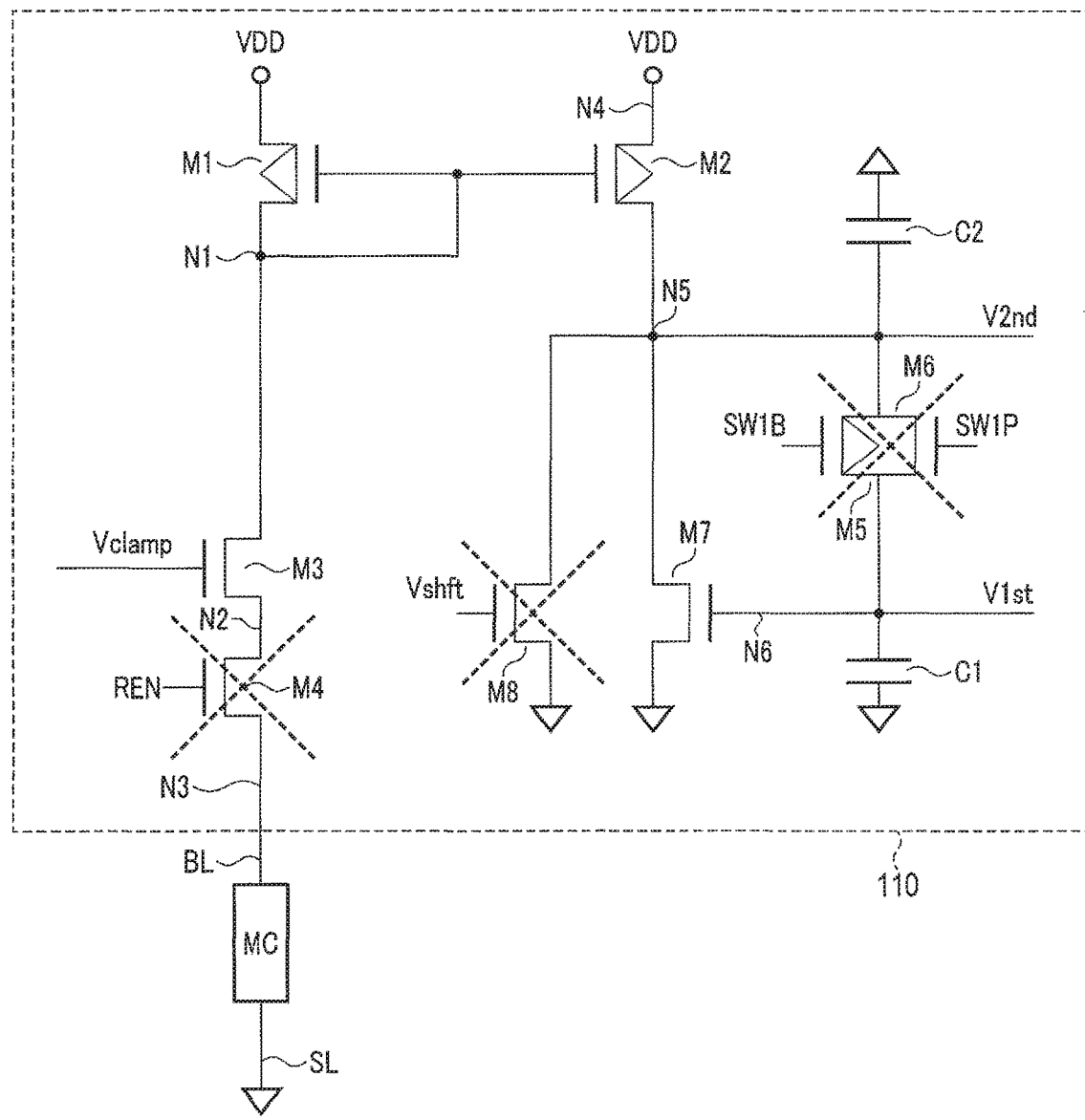
FIG. 10 is a circuit diagram illustrating an operation of the preamplifier in the memory device according to the first embodiment in a write operation.

As illustrated in FIG. 10, the transistors M1, M2, M4, M5, M6, and M8 are set to the off state.

Consequently, the write driver not illustrated in the drawings writes "0" data to the memory cell.

[Time T3] through [Time T4]

In the second read operation (step S1003), the controller 17 raises the levels of the signal REN and the signal Vshft to "H" and lowers the level of the signal WRITE0 to "L".

Figure 11:
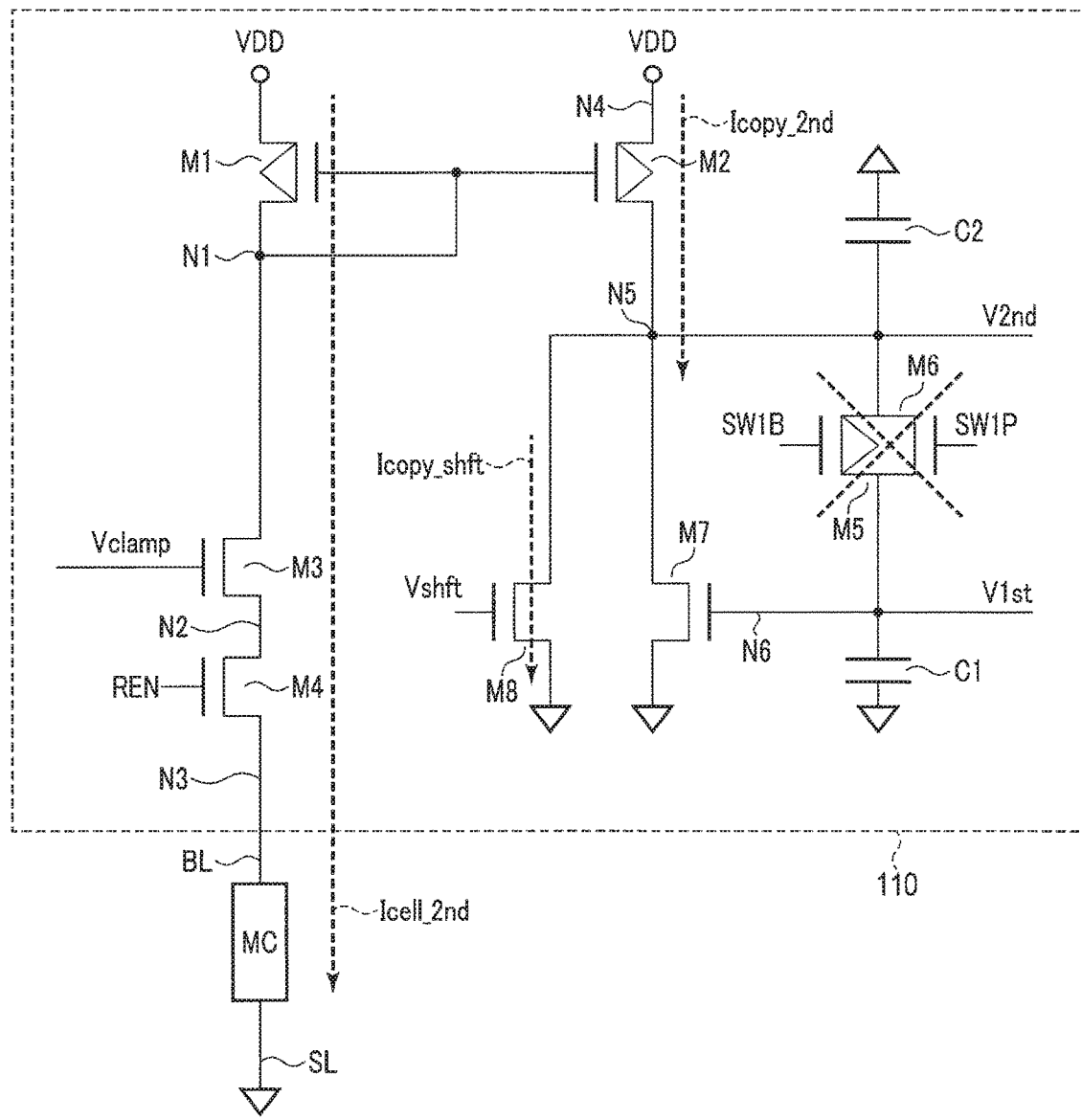
FIG. 11 is a circuit diagram illustrating an operation of the preamplifier in the memory device according to the first embodiment in a second read operation.

Consequently, as illustrated in FIG. 11, the transistors M3 and M4 are set to the on state. Accordingly, the node N1 is grounded via the bit line (global bit line), the memory cell MC, and the source line (global source line). As a result, the potential of the node N1 decreases to set the transistors M1 and M2 to the on state. The transistors M1 and M2 are driven as diode-connected transistors.

When the transistor M1 is set to the on state, the transistor M1 supplies a cell current (Icell_2nd) to the memory cell MC.

The transistor M2 is driven based on the potential of the node M1. Thus, the transistor M2 supplies a copied current (Icopy_2nd) of the cell current (Icell_2nd) to the node N4.

The transistor M7 is set to the on state based on V1st.

The transistor M8 is set to the on state based on Vshft. Thus, the transistor M8 provides a shift current (Icopy_shft).

Then, the potential of the node N5 is set to correspond to voltage information (signal voltage) V2nd based on the cell current (Icell_2nd), the shift current (Icopy_shft), and V1st.

Specifically, as illustrated in FIG. 12, if V1st results in V1st_0, which is indicative of 0 data, V2nd results in V2nd_0, which is lower than V1st_0. If V1st results in V1st_1, which is indicative of 1 data, V2nd results in V2nd_1, which is higher than V1st_1. At time T4, the difference between V1st_0 and V2nd_0 and the difference between V1st_1 and V2nd_1 are each at least dV, which allows data to be sensed.

After [Time T4]

In a determination operation (step S1004). The controller 17 lowers the level of the signal REN to "L" and raises the level of the signal SEN2 to "H". The controller 17 also sets the signal LATPB to the "H" level and sets the signal LATN and the signal SEN to the "L" level.

In the sense amplifier 120, the transistors M12, M13, M14, M16, M18, M19, M21, and M22 to the on state.

Consequently, the transistor M21 passes a current I1st corresponding to V1st, and the transistor M22 passes a current I2nd corresponding to V2nd.

When the signal SEN is set to the "H" level, the transistors M13 and M14 are set to the off state to disrupt the current supply from the transistors M13 and M14. Consequently, the potential of the node N8 is determined based on the current I1st. The potential of the node N9 is determined based on the current I2nd. This leads to a difference in voltage between the node N8 and the node N9, and the difference in voltage increases at once as a result of positive feedback from the transistors M10, M11, M15, and M18.

Consequently, the sense amplifier 120 determines the signal DO and the signal DOB.

When the determination operation (step S1004) ends, the controller 17 lowers the level of the signal LATPB to "L" and raises the level of the signal LATN to "H". Consequently, the transistors M9, M17, and M20 of the sense amplifier 120 are set to the on state. This increases the difference in potential between the signal DO and the signal DOB, which becomes equal to the difference between the "H" and the "L" level.

<1-3> Effects

According to the above-described embodiment, the first read operation and the second read operation are performed using the current mirror comprising the diode-connected transistors.

To facilitate understanding of the above-described embodiment, a comparative example will be described below. In the comparative example described below, in the second read operation, each transistor which charges the bit line (global bit line) is driven as a constant current transistor.

Figure 13:
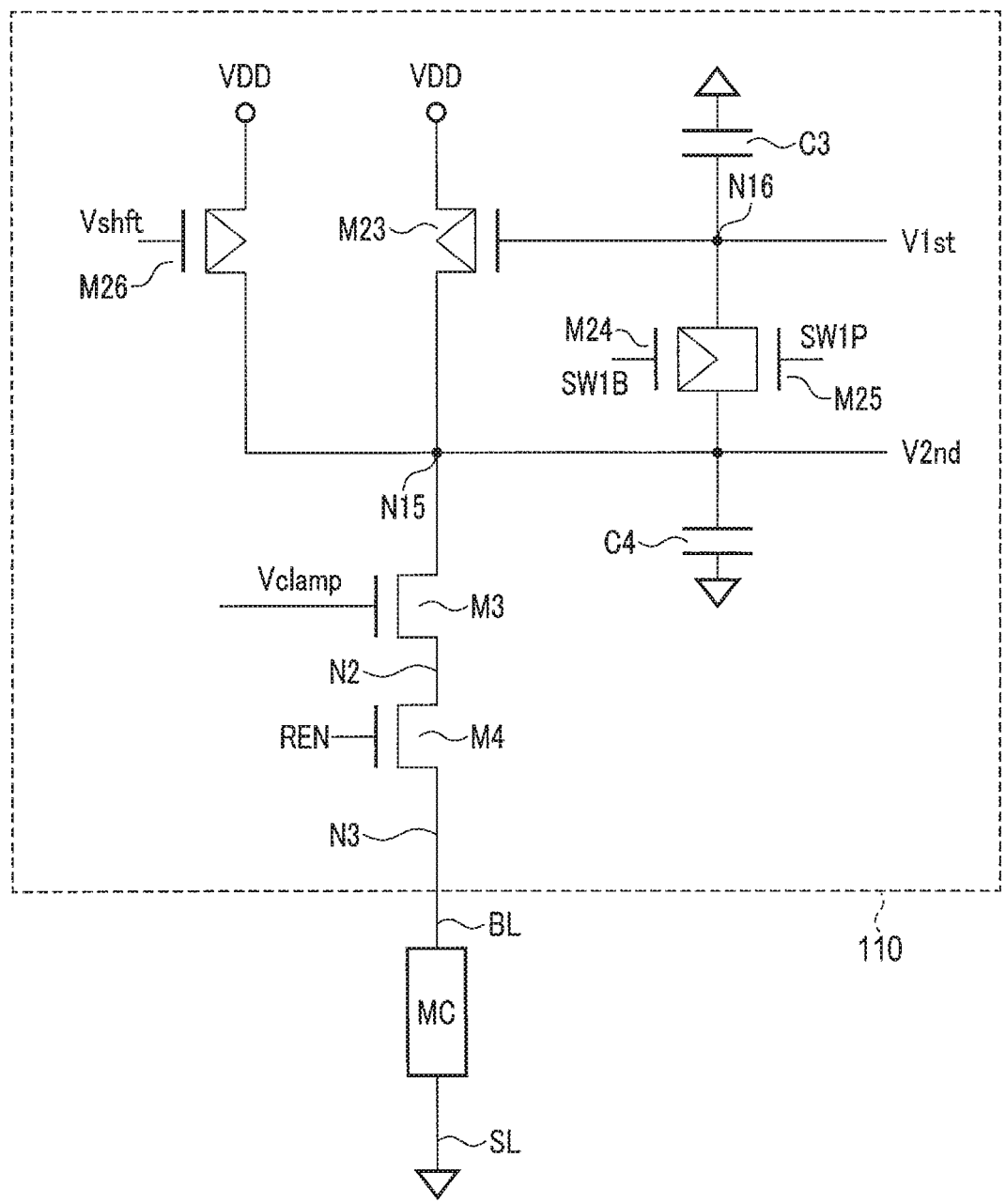
FIG. 13 is a circuit diagram illustrating a preamplifier in a memory device according to a comparative example of the first embodiment.

FIG. 13 illustrates a preamplifier in a memory device according to the comparative example. As illustrated in FIG. 13, the preamplifier in the memory device according to the comparative example comprises PMOS transistors M23, M24, and M26, NMOS transistors M3, M4, and M25, and capacitances C3 and C4.

As illustrated in FIG. 14, during the first read operation, the cell current (Icell_1st) is supplied via the transistor M23. As a result, the voltage V1st is stored according to the data in the memory cell.

Subsequently, in the second read operation, the transistors M24 and M25 are set to the off state as illustrated in FIG. 15, Consequently, the transistor M23 serves as a constant current transistor to supply the cell current (Icell_2nd). However, if the read current during the first read operation is small and thus V1st is high, then the speed of bit line charging decreases. As a result, the time needed for the second read operation in the comparative example may be longer than the time needed for the second read operation in the first embodiment by a period of time dT (T7-T4) as illustrated in FIG. 16. The read current needs to be reduced with progression of scaling for reducing the size of MTJ elements. This means a reduced read speed in the comparative example.

According to the above-described embodiment, the current path for charging of the bit line BL is electrically separated from the paths for generation of V1st and V2nd. Thus, the current path for charging of the bit line allows the bit line to be charged utilizing diode connection. As a result, the preamplifier according to the above-described embodiment allows the bit line to be charged utilizing diode connection regardless of the magnitude of V1st even if the first read result is small and thus V1st is high.

As described above, according to the above-described embodiment, a memory device can be provided which can perform a high-quality read operation under easy control.

<2> Second Embodiment

A second embodiment will be described. In the second embodiment described below, a sense circuit is connected to a source line. A basic configuration and a basic operation of the second embodiment are similar to those of the above-described first embodiment. Therefore, the matters described above in the first embodiment and matters which can be easily inferred from the above-described first embodiment will not be described below.

<2-1> Configuration

<2-1-1> Sense Amplifier/Write Driver

The sense amplifier/write driver 12 in the memory device according to the second embodiment will be described using FIG. 17.

Figure 17:
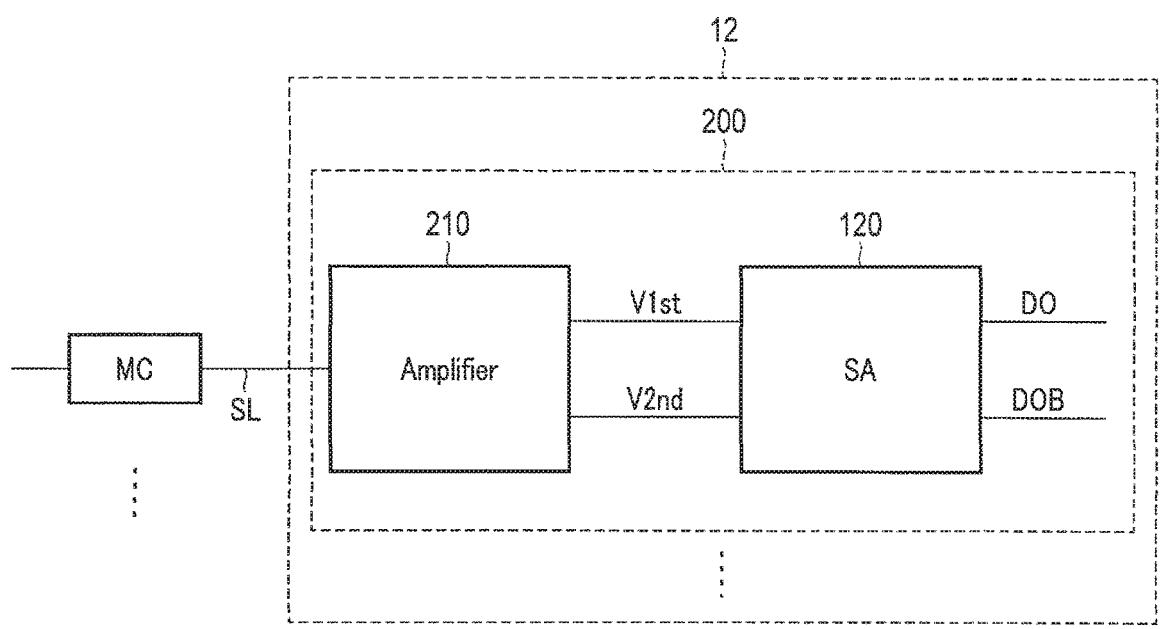
FIG. 17 is a block diagram illustrating a sense amplifier/write driver in a memory device according to a second embodiment.

As illustrated in FIG. 17, the sense amplifier/write driver 12 comprises a plurality of sense circuits 200. Each of the plurality of sense circuits 200 is provided for a corresponding one of the source lines (global source lines). Each of the plurality of sense circuits 200 comprises a preamplifier 210 and the sense amplifier 120.

The preamplifier 210 receives a current (cell current) from the memory cell MC via the source line and stores the voltages V1st and V2nd based on the cell current.

<2-1-2> Configuration of the Preamplifier

Now, a configuration of the preamplifier 210 in the memory device according to the second embodiment will be described using FIG. 18.

As illustrated in FIG. 18, the preamplifier 110 comprises PMOS transistors M30, M31, M33, and M34, NMOS transistors M27, M28, M29, and M32, and capacitances C5 and C6.

The transistor M27 comprises a first end to which the ground voltage VSS is applied, and a second node and a gate electrode connected to a node N17.

The transistor M28 comprises a first end to which the ground voltage VSS is applied, and a second node connected to a node N20, and a gate electrode connected to the node N17.

The transistor M27 and the transistor M28 function as a current mirror.

The transistor M29 comprises a first end connected to the node N17, a second node connected to the node N18, and a gate electrode to which the signal REN is supplied.

The transistor M30 comprises a first end connected to the node N18, a second node connected to the source line (global source line), and a gate electrode to which the signal Vclamp is supplied.

The transistor M31 comprises a first end connected to the node N20, a second node connected to a node N21, and a gate electrode to which the signal SW1B is supplied.

The transistor M32 comprises a first end connected to the node N20, a second node connected to the node N21, and a gate electrode to which the signal SW1P is supplied.

The transistor M31 and the transistor M32 function as one switch.

The transistor M33 comprises a first end connected to the node N20, a second node to which the power-supply voltage VDD is applied, and a gate electrode connected to the node N21.

The transistor M34 comprises a first end connected to the node N20, a second node to which the power-supply voltage VDD is applied, and a gate electrode to which the signal Vshft is supplied.

The capacitance C5 comprises a first end connected to the node N21 and a second node to which the ground voltage VSS is applied.

The capacitance C6 comprises a first end connected to the node N20 and a second node to which the ground voltage VSS is applied.

A potential of the node N20 is supplied to the sense amplifier 120 as V2nd. The transistors M28, M33, and M34, the node N20, and the capacitance C6 may be considered to be a V2nd generation unit.

A potential of the node N21 is supplied to the sense amplifier 120 as V1st. The transistors M28, M31, M32, and M33, the node N21, and the capacitance C5 may be considered to be a V1st generation unit.

Operations of the preamplifier 110 will be described below.

<2-2> Details of the Read Operation

Details of a read operation of a memory system according to the second embodiment will be described in accordance with a waveform diagram in FIG. 9.

[Time T1] through [Time T2]

In the first read operation (step S1001), the controller 17 sets the levels of the signal REN, the signal SW1P, and the signal Vshft to "H" and sets the levels of the signal SW1B and the signal Vclamp to "L".

Figure 20:
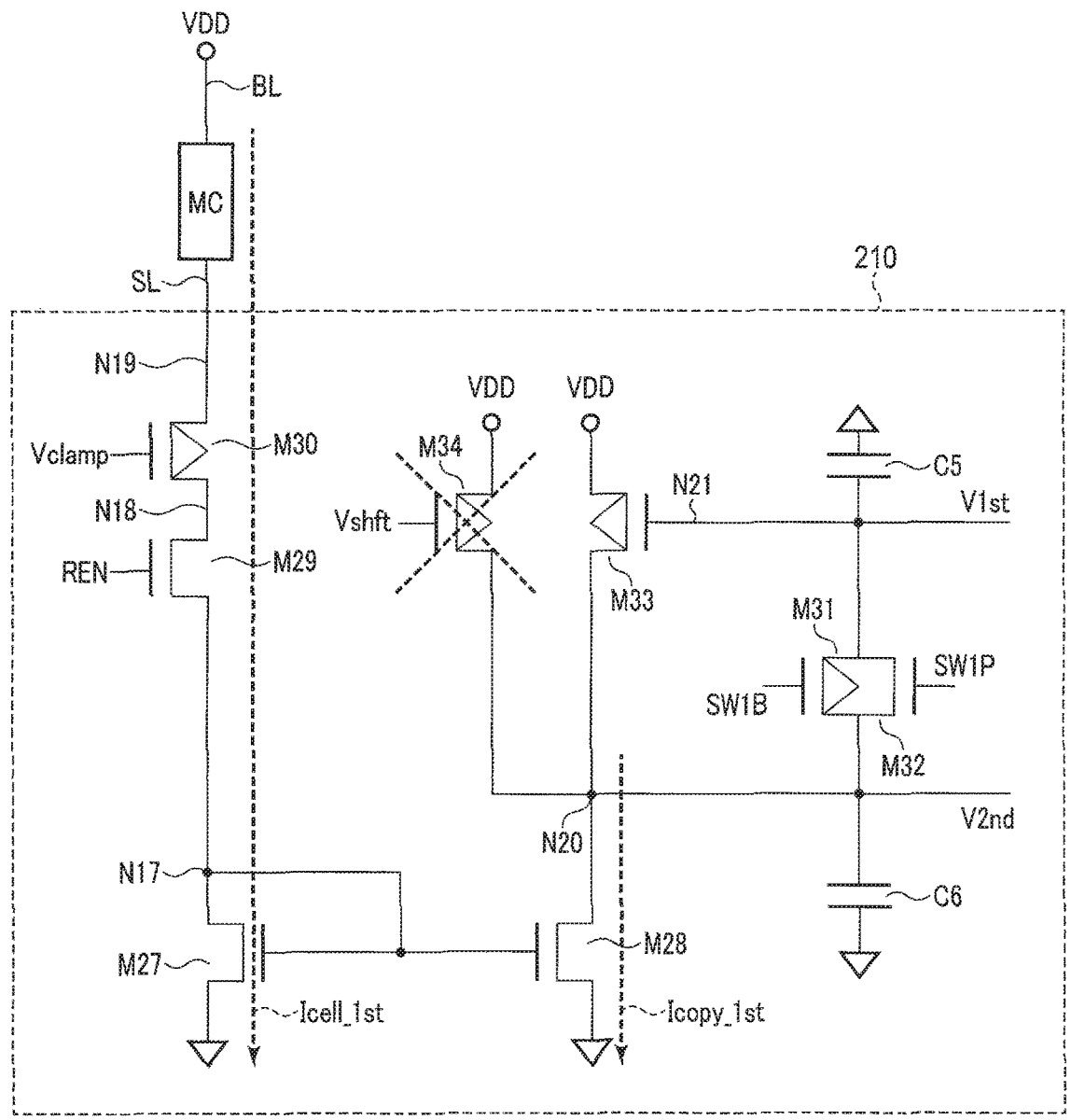
FIG. 20 is a circuit diagram illustrating an operation of the preamplifier in the memory device according to the second embodiment in a first read operation.

Consequently, as illustrated in FIG. 20, the transistors M29, M30, M31, and M32 are set to the on state. This allows the node N17 to be supplied with a voltage via the bit line (global bit line), the memory cell MC, and the source line (global source line). As a result, the potential of the node N17 increases to set the transistors M27 and M28 to the on state. The transistors M27 and M28 are driven as diode-connected transistors.

When the transistor M27 is set to the on state, the cell current (Icell_1st) from the memory cell MC flows through the transistor M27.

The transistor M28 is driven based on the potential of the node N17. Thus, the copied current (Icopy_1st) of the cell current (Icell_1st) flows through the transistor M28.

As described above, the transistors M27 and M28 form a current mirror.

Then, the potential of the node N21 is set to correspond to the voltage information (signal voltage) V1st based on the copied current (Icopy_1st).

As described above, in the preamplifier 210, the cell current (Icell_1st) from the memory cell MC flows via a first current path comprising the transistors M27, M29, and M30. Furthermore, in the preamplifier 210, the copied current (Icopy_1st) from the node N20 flows via a second current path comprising the transistor M28. The first current path and the second current path are electrically separated from each other.

The transistor M34 is set to the off state.

[Time T2] through [Time T3]

In the "0" write operation (step S1002), the controller 17 lowers the levels of the signal REN and the signal SW1P to "L" and raises the levels of the signal WRITE0 and the signal SW1B "H". The signal WRITE0 is a signal relating to the "0" write operation. When the signal WRITE0 is at the "H" level, the write driver performs the "0" write operation.

As illustrated in FIG. 20, the transistors M27, M28, M29, M31, M32, and M34 are set to the on state.

Consequently, the write driver not illustrated in the drawings writes "0" data to the memory cell.

[Time T3] through [Time T4]

In the second read operation (step S1003), the controller 17 raises the level of the signal REN to "H" and lowers the levels of the signal WRITE0 and the signal Vshft to "L".

Consequently, as illustrated in FIG. 22, the transistor M29 is set to the on state. Consequently, the node N17 is supplied with a voltage via the bit line (global bit line), the memory cell MC, and the source line (global source line). As a result, the potential of the node N17 increases to set the transistors M27 and M28 to the on state. The transistors M27 and M28 are driven as diode-connected transistors.

When the transistor M27 is set to the on state, the cell current (Icell_2nd) from the memory cell MC flows through the transistor M27.

The transistor M28 is driven based on the potential of the node N17. Thus, the copied current (Icopy_2nd) of the cell current (Icell_2nd) flows through the transistor M28.

The transistor M33 is set to the on state based on V1st.

The transistor M34 is set to the on state based on Vshft. Thus, the transistor M34 provides the shift current (Icopy_shft).

Then, the potential of the node N20 is set to correspond to the voltage information (signal voltage) V2nd based on the cell current (Icell_2nd), the shift current (Icopy_shft), and V1st.

Figure 23:
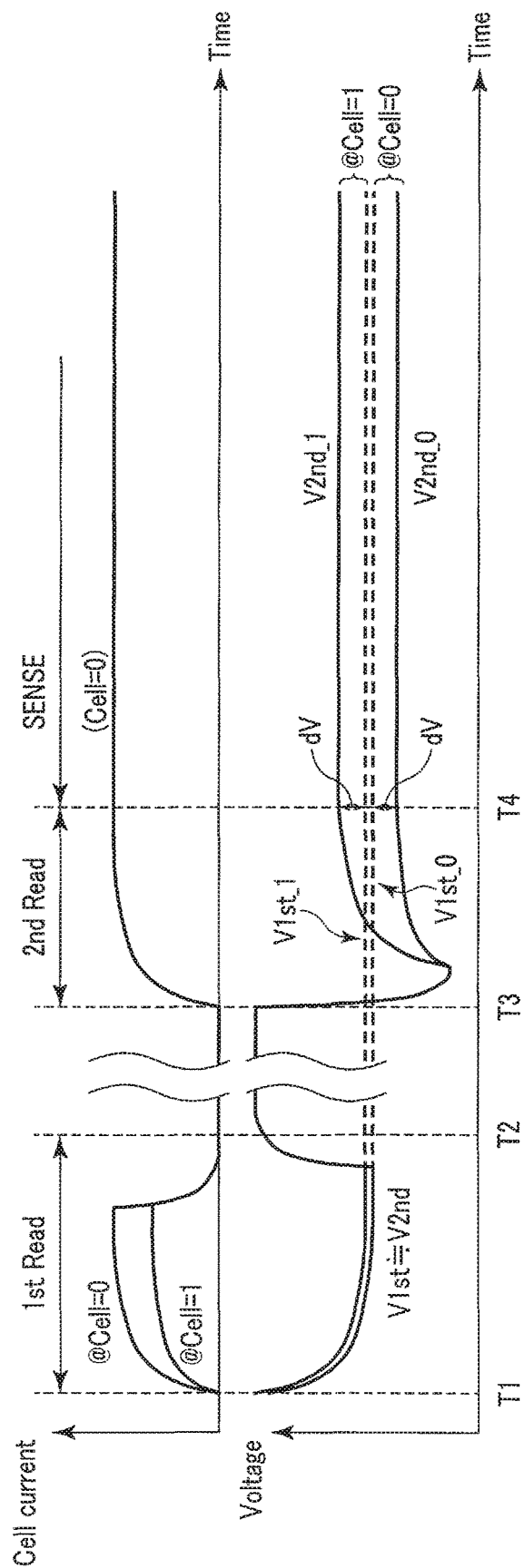
FIG. 23 is a diagram illustrating the relationship between the cell current and the voltage during a read operation of the memory system including the memory device according to the second embodiment.

Specifically, as illustrated in FIG. 23, if V1st results in V1st_0, which is indicative of 0 data, V2nd results in V2nd_0, which is lower than V1st_0. If V1st results in V1st_1, which is indicative of 1 data, V2nd results in V2nd_1, which is higher than V1st_1. At time T4, the difference between V1st_0 and V2nd_0 and the difference between V1st_1 and V2nd_1 are each at least dV, which allows data to be sensed.

After [Time T4]

Operations after time T4 are similar to the operations after time T4 described using FIG. 12.

<2-3> Effects

According to the above-described embodiment, the first read operation and the second read operation are performed using the current mirror comprising the diode-connected transistors.

To facilitate understanding of the above-described embodiment, a comparative example will be described below. In the comparative example described below, in the second read operation, each transistor which charges the source line (global source line) is driven as a constant current transistor.

FIG. 24 illustrates a preamplifier in a memory device according to the comparative example. As illustrated in FIG. 24, the preamplifier in the memory device according to the comparative example comprises PMOS transistors M30 and M35, NMOS transistors M29, M36, M37, and M38, and capacitances C7 and C8.

As illustrated in FIG. 25, during the first read operation, the cell current (Icell_1st) flows via the transistor M37. As a result, the voltage V1st is stored according to the data in the memory cell.

Subsequently, during the second read operation, the transistors M35 and M36 are set to the off state as illustrated in FIG. 26. Consequently, the transistor M37 serves as a constant current transistor, and the cell current (Icell_2nd) flows through the transistor M37. However, if the read current during the first read operation is small and thus V1st is high, then the speed of bit line charging decreases. As a result, the time needed for the second read operation in the comparative example may be longer than the time needed for the second read operation in the first embodiment by the period of time dT (T7-T4) as illustrated in FIG. 27. The read current needs to be reduced with progression of scaling for reducing the size of MTJ elements. This means a reduced read speed in the comparative example.

According to the above-described embodiment, the current path for charging of the bit line BL is electrically separated from the paths for generation of V1st and V2nd. Thus, the current path for charging of the bit line allows the bit line to be charged utilizing diode connection. As a result, the preamplifier according to the above-described embodiment allows the bit line to be charged utilizing diode connection regardless of the magnitude of V1st even if the first read result is small and thus V1st is high.

As described above, according to the above-described embodiment, a memory device can be provided which can perform a high-quality read operation under easy control.

<3> Third Embodiment

A third embodiment will be described. In the third embodiment described below, the connection between a node storing V1st and a node storing V2nd is controlled using a plurality of switches. A basic configuration and a basic operation of the third embodiment are similar to those of the above-described first embodiment. Therefore, the matters described above in the first embodiment and matters which can be easily inferred from the above-described first embodiment will not be described below.

<3-1> Configuration
<3-1-1> Configuration of the Preamplifier

A configuration of the preamplifier 110 in the memory device according to the third embodiment will be described using FIG. 28.

As illustrated in FIG. 28, the preamplifier 110 comprises the PMOS transistors M23 and M26, the NMOS transistors M3 and M4, a plurality of switches (in this case, by way of example, switches SW1 and SW2), and the capacitances C3 and C4.

The transistor M23 comprises a first end to which the power-supply voltage VDD is applied, a second node connected to the node N15, and a gate electrode connected to the node N16.

The transistor M3 comprises a first end connected to the node N15, a second node connected to the node N2, and a gate electrode to which the signal Vclamp is supplied.

The transistor M4 comprises a first end connected to the node N2, a second node connected to the bit line (global bit line), and a gate electrode to which the signal REN is supplied.

The switch SW1 comprises a first end connected to the node N15 and a second end connected to the node N16.

The switch SW2 comprises a first end connected to the node N15 and a second end connected to the node N16.

The switch SW1 has a channel area at least equal to or larger than that of the switch SW2.

The transistor M26 comprises a first end to which the power-supply voltage VDD is applied, a second node connected to the node N15, and a gate electrode to which the signal Vshft is supplied.

The capacitance C3 comprises a first end connected to the node N16 and a second node to which the ground voltage VSS is applied.

The capacitance C4 comprises a first end connected to the node N15 and a second node to which the ground voltage VSS is applied.

The potential of the node N15 is supplied to the sense amplifier 120 as V2nd. The transistors M23 and M26, the node N15, and the capacitance C4 may be considered to be a V2nd generation unit.

The potential of the node N16 is supplied to the sense amplifier 120 as V1st. The transistor M23, the switches SW1 and SW2, the node N16, and the capacitance C3 may be considered to be a V1st generation unit.

Operations of the preamplifier 110 will be described below.

<3-1-2> Configuration of the Switches

A configuration of the switches controlling the connection between the node storing V1st and the node storing V2nd will be described using FIG. 29.

As illustrated in FIG. 29, each of the switches SW1 and SW2 is a CMOS transistor.

The switch SW1 comprises a PMOS transistor M39 and an NMOS transistor M40. The PMOS transistor M39 comprises a first end connected to the node N15, a second node connected to the node N16, and a gate electrode to which the signal SW1B is supplied. The NMOS transistor M40 comprises a first end connected to the node N15, a second node connected to the node N16, and a gate electrode to which the signal SW1P is supplied.

The switch SW2 comprises a PMOS transistor M41 and an NMOS transistor M42. The PMOS transistor M41 comprises a first end connected to the node N15, a second node connected to the node N16, and a gate electrode to which a signal SW2B is supplied. The NMOS transistor M42 comprises a first end connected to the node N15, a second node connected to the node N16, and a gate electrode to which a signal SW2P is supplied.

The PMOS transistor M39 has a channel area at least equal to or larger than that of the PMOS transistor M41. Likewise, the NMOS transistor M40 has a channel area at least equal to or larger than that of the NMOS transistor M42.

<3-2> Details of the Read Operation

Details of a read operation of a memory system according to the third embodiment will be described in accordance with a waveform diagram in FIG. 30.

[Time T10] through [Time T11]

In the first read operation (step S1001), the controller 17 sets the signal REN, the signal SW1P, the signal SW2P, and the signal Vclamp to the "H" level and sets the signal SW1B, the signal SW2B, and the signal Vshft to the "L" level.

Consequently, as illustrated in FIG. 31, the transistors M3 and M4 and the switches SW1 and SW2 are set to the on state. Accordingly, the node N16 is grounded via the switches SW1 and SW2, the transistors M3 and M4, the bit line (global bit line), the memory cell MC, and the source line (global source line). As a result, the potential of the node N16 decreases to set the transistor M23 to the on state.

When the transistor M23 is set to the on state, the transistor M23 supplies the cell current (Icell_1st) to the memory cell MC.

Furthermore, the node N16 is charged by the two switches SW1 and SW2. This allows suppression of a voltage drop due to possible switching noise in the switches SW1 and SW2.

The transistor M26 is set to the off state.

[Time T11] through [Time T12]

The controller 17 sets the signal SW1B to the "H" level and sets the signal SW1P to the "L" level in the middle of the first read operation (step S1001).

Figure 32:
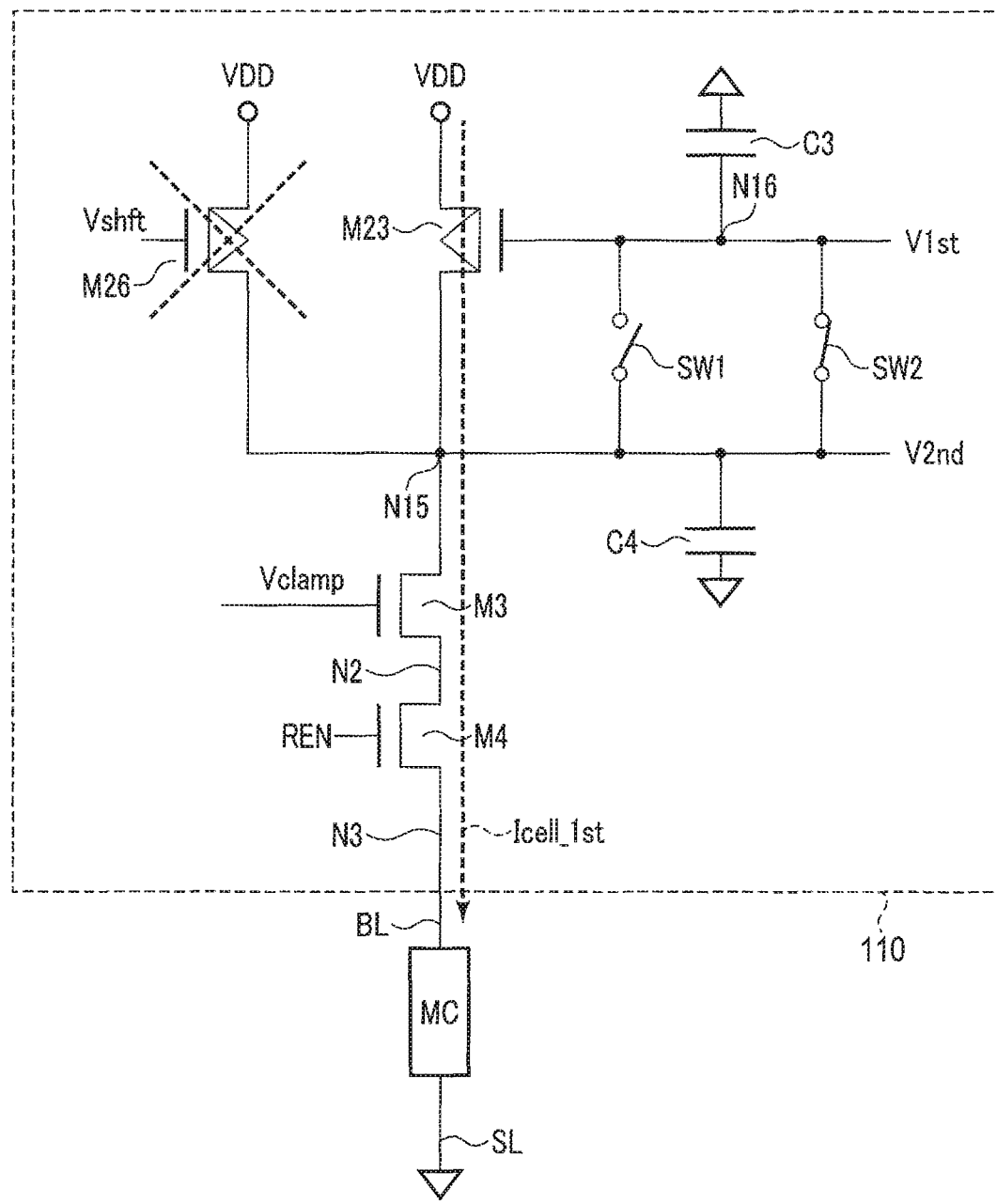
FIG. 32 is a circuit diagram illustrating an operation of the preamplifier in the memory device according to the third embodiment in the first read operation.

Consequently, as illustrated in FIG. 32, the switch SW1 is set to the off state. As a result, the node N16 is grounded via the switch SW2, the transistors M3 and M4, the bit line (global bit line), the memory cell MC, and the source line (global source line).

Then, the potential of the node N16 is set to correspond to voltage information (signal voltage) V1st based on the cell current (Icell_1st).

As described above, when the first read operation (step S1001) is started, the switches SW1 and SW2 are turned on, but in the middle of the operation, the switch SW1 is turned off.

[Time T12] through [Time T13]

In the "0" write operation (step S1002), the controller 17 lowers the levels of the signal REN and the signal SW2P to "L" and raises the levels of the signal WRITE0 and the signal SW2B to "H". The signal WRITE0 is a signal relating to the "0" write operation. When the signal WRITE0 is at the "H" level, the write driver performs the "0" write operation.

As illustrated in FIG. 33, the transistors M4 and M26 and the switches SW1 and SW2 are set to the off state.

Consequently, the write driver not illustrated in the drawings writes "0" data to the memory cell.

[Time T13] through [Time T14]

In the second read operation (step S1003), the controller 17 raises the levels of the signal REN and the signal Vshft to "H" and lowers the level of the signal WRITE 0 to "L".

Consequently, as illustrated in FIG. 34, the transistors M3 and M4 are set to the on state. As a result, the node N15 is grounded via the bit line (global bit line), the memory cell MC, and the source line (global source line).

The transistor 23 is set to the on state based on V1st.

The transistor 26 is set to the on state based on Vshft. Thus, the transistor M26 provides the shift current (Icell_shft).

Then, the potential of the node N15 is set to correspond to the voltage information (signal voltage) V2nd based on the cell current (Icell_2nd), the shift current (Icell_shft), and V1st.

After [Time T14]

Operations after time T14 are similar to the operations after time T4 described using FIG. 8.

<3-3> Effects

In the above-described embodiment, the connection between the node storing V1st and the node storing V2nd is controlled using the plurality of switches.

A slew rate may vary among the control signals as a result of a variation in the power-supply voltage or the temperature in the memory device 10 or due to location dependency of the memory device 10. In such a case, noise may be generated when the switch provided between the node storing V1st and the node storing V2nd is turned on or off.

For example, if the single switch comprising the transistors M24 and M25 in the comparative example of the first embodiment is turned on or off, possible noise may cause a voltage drop of dV1 with respect to the ideal voltage as illustrated by a dashed line in FIG. 35. V1st thus mixed with noise may reduce read margins.

On the other hand, in the present embodiment, both switches (SW1 and SW2) are set to the on state during the first read. This allows suppression of possible noise resulting from turn-on or -off of the switch. Subsequently, the switch SW1, which has a large area, is closed. At this time, noise may be generated to reduce the voltage by dV2. However, this variation is smaller than a variation resulting from turn-on or -off of the single switch comprising the transistors M24 and M25 in the comparative example of the first embodiment (dV2<dV1). Thus, V1st is restrained from being mixed with noise, enabling appropriate read margins to be provided.

As described above, according to the above-described embodiment, a memory device can be provided which can perform a high-quality read operation under easy control.

To allow for the appropriate speed of bit line charging, the switch SW1 may comprise a transistor with a large channel area. Furthermore, in order to reduce the capacity and inhibit possible noise, the switch SW2 may be a transistor with the minimum size. Additionally, in order to further increase the charging speed, a plurality of transistors connected together in parallel may be used as the switch SW1.

<3-4> Modification 1

<3-4-1> Configuration of the Switch

A configuration of switches (Modification 1) controlling the connection between the node storing V1st and the node storing V2nd will be described using FIG. 36.

Figure 36:
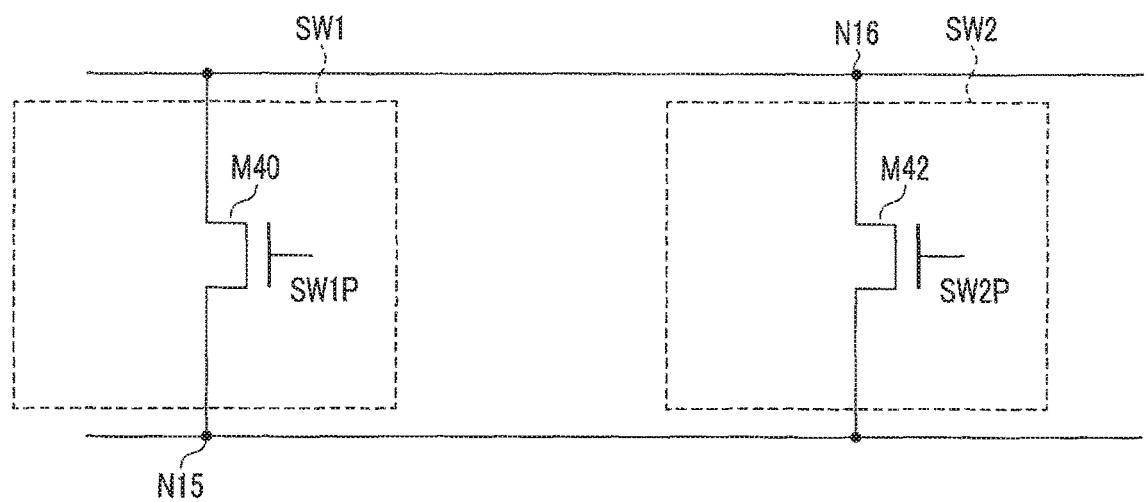
FIG. 36 is a circuit diagram illustrating switches which control connection between a node storing V1st and a node storing V2nd in a preamplifier in a memory device according to Modification 1 of the third embodiment.

As illustrated in FIG. 36, each of the switches SW1 and SW2 is an NMOS transistor.

The switch SW1 comprises an NMOS transistor M40.

The switch SW2 comprises an NMOS transistor M42.

The NMOS transistor M40 has a channel area at least equal to or larger than that of the NMOS transistor M42.

<3-4-2> Read Operation

A read operation of a memory system according to Modification 1 of the third embodiment will be described using FIG. 37.

Figure 30:
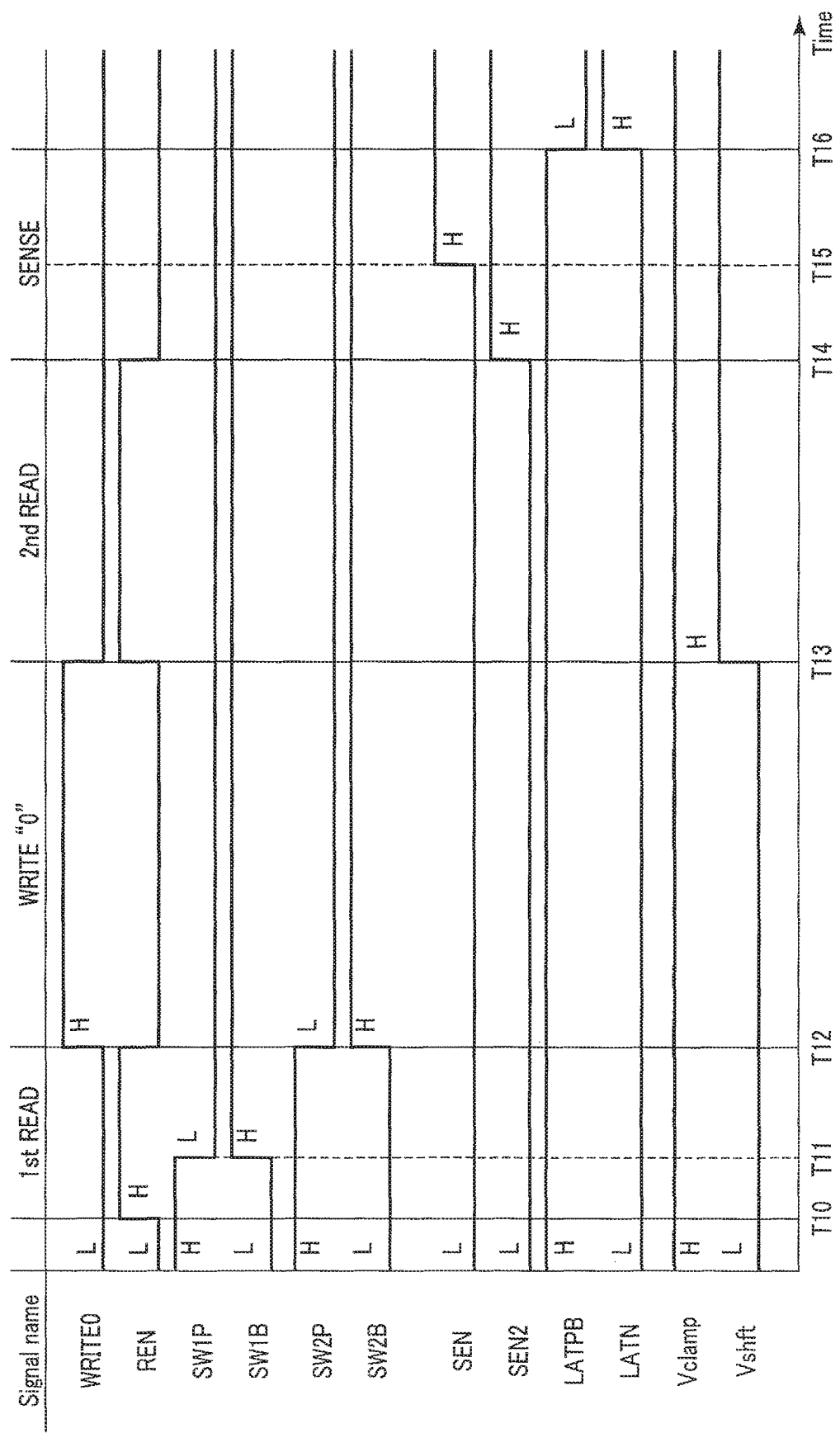
FIG. 30 is a diagram of waveforms during a read operation of a memory system according to the third embodiment.

As illustrated in FIG. 37, the read operation of the memory system according to Modification 1 of the third embodiment is similar to the operation illustrated in FIG. 30 with the signals SW1B and SW2B deleted.

<3-5> Modification 2

<3-5-1> Configuration of the Switches

A configuration of switches (Modification 2) controlling the connection between the node storing V1st and the node storing V2nd will be described using FIG. 38.

As illustrated in FIG. 38, the switch SW1 is an NMOS transistor, and the switch SW2 is a CMOS transistor.

The switch SW1 comprises the NMOS transistor M40.

The switch SW2 comprises the PMOS transistor M41 and the NMOS transistor M42.

The NMOS transistor M40 has a channel area at least equal to or larger than that of the NMOS transistor M42.

<3-5-2> Read Operation

A read operation of a memory system according to Modification 2 of the third embodiment will be described using FIG. 39.

Figure 39:
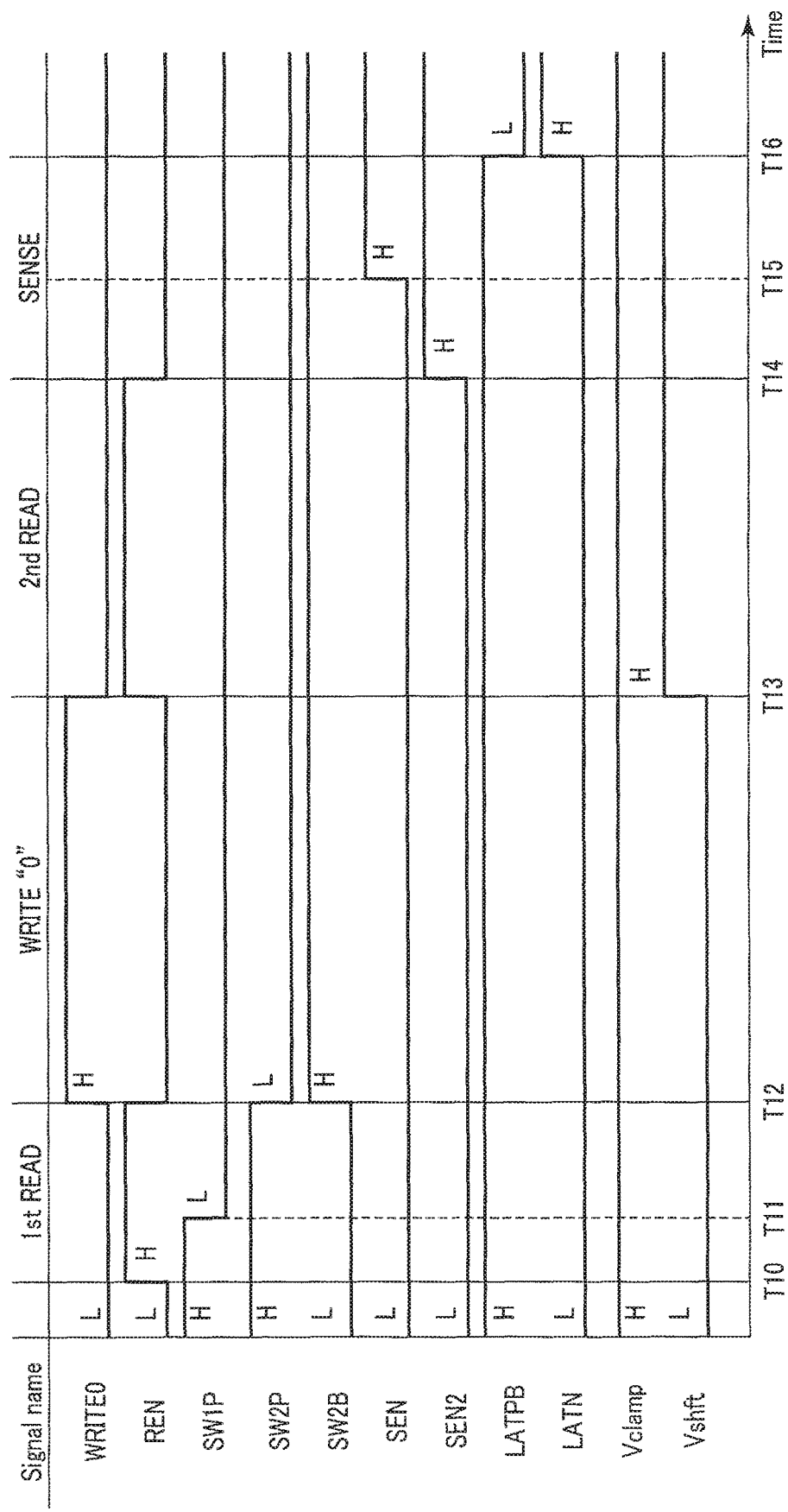
FIG. 39 is a diagram of waveforms during a read operation of a memory system according to Modification 2 of the third embodiment.

As illustrated in FIG. 39, the read operation of the memory system according to Modification 2 of the third embodiment is similar to the operation illustrated in FIG. 30 with the signal SW1B deleted.

<3-6> Modification 3

<3-6-1> Configuration of the Switches

A configuration of switches (Modification 3) controlling the connection between the node storing V1st and the node storing V2nd will be described using FIG. 40.

Figure 40:
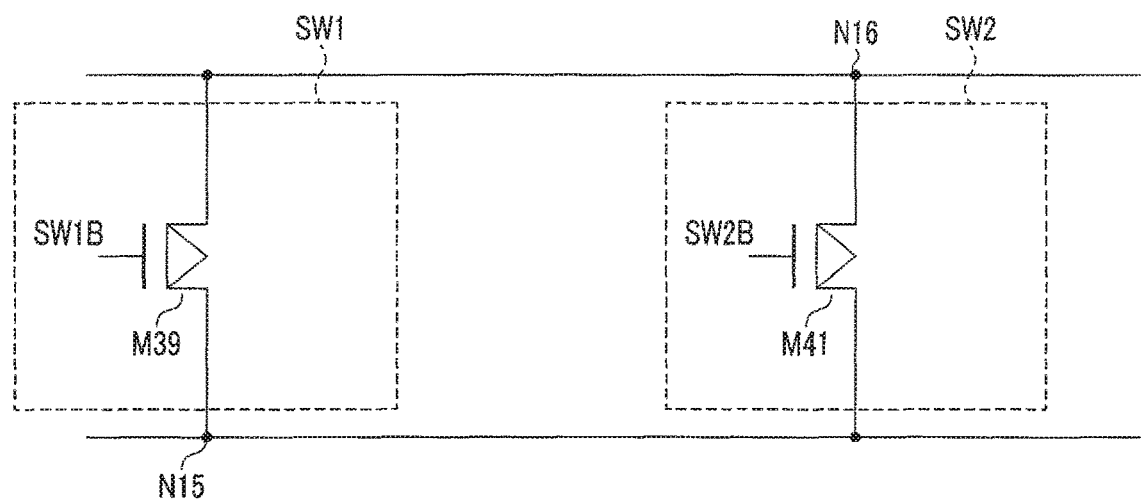
FIG. 40 is a circuit diagram illustrating switches which control connection between a node storing V1st and a node storing V2nd in a preamplifier in a memory device according to Modification 3 of the third embodiment.

As illustrated in FIG. 40, each of the switches SW1 and SW2 is a PMOS transistor.

The switch SW1 comprises a PMOS transistor M39.

The switch SW2 comprises a PMOS transistor M41.

The PMOS transistor M39 has a channel area at least equal to or larger than that of the PMOS transistor M41.

<3-6-2> Read Operation

A read operation of a memory system according to Modification 3 of the third embodiment will be described using FIG. 41.

Figure 41:
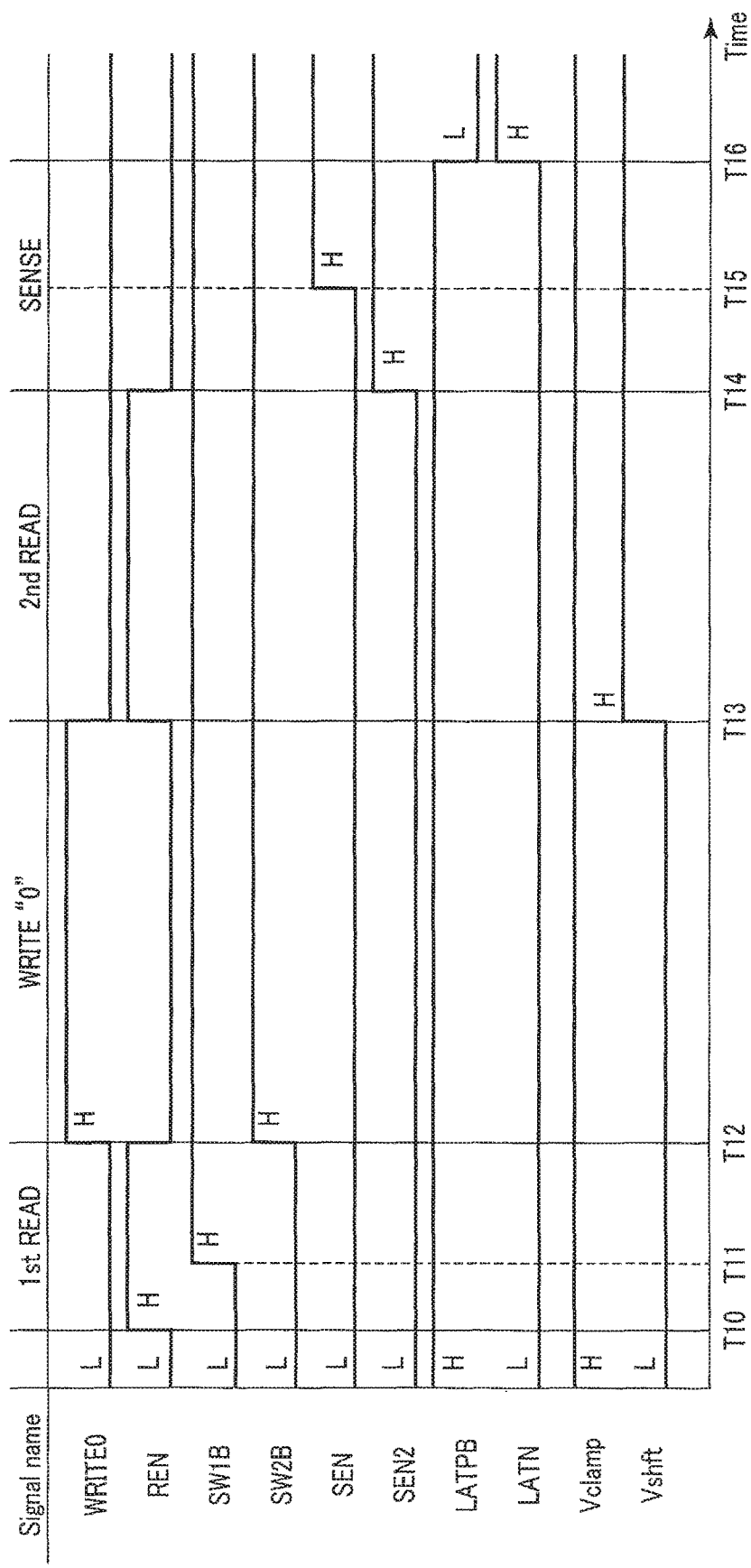
FIG. 41 is a diagram of waveforms during a read operation of a memory system according to Modification 3 of the third embodiment.

As illustrated in FIG. 41, the read operation of the memory system according to Modification 3 of the third embodiment is similar to the operation illustrated in FIG. 30 with the signals SW1P and SW2P deleted.

<3-7> Modification 4

<3-7-1> Configuration of the Switches

A configuration of switches (Modification 4) controlling the connection between the node storing V1st and the node storing V2nd will be described using FIG. 42.

Figure 42:
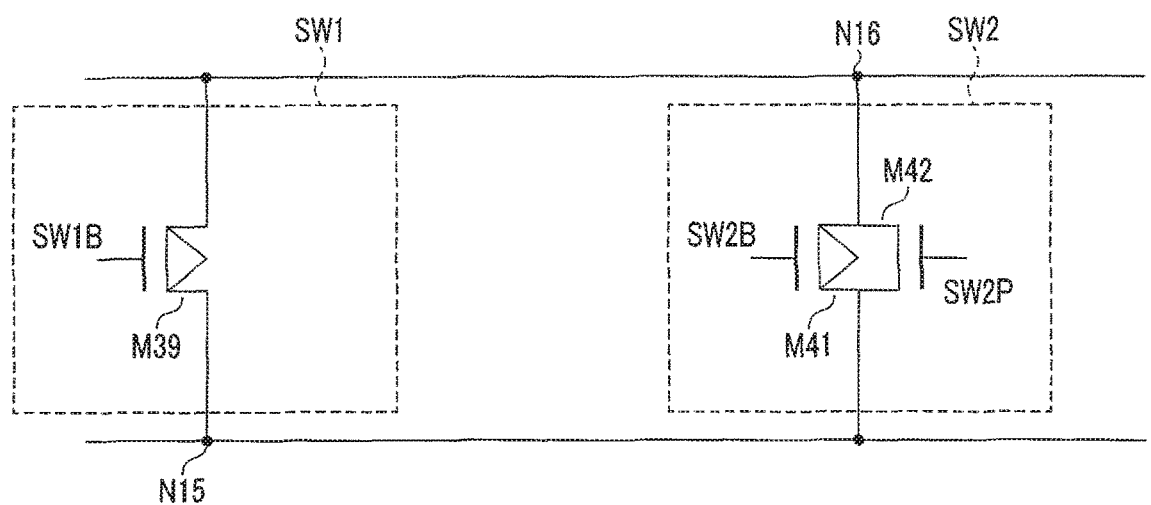
FIG. 42 is a circuit diagram illustrating switches which control connection between a node storing V1st and a node storing V2nd in a preamplifier in a memory device according to Modification 4 of the third embodiment.

As illustrated in FIG. 42, the switch SW1 is a PMOS transistor, and the switch SW2 is a CMOS transistor.

The switch SW1 comprises the PMOS transistor M39.

The switch SW2 comprises the PMOS transistor M41 and the NMOS transistor M42.

The PMOS transistor M39 has a channel area at least equal to or larger than that of the PMOS transistor M41.

<3-7-2> Read Operation

A read operation of a memory system according to Modification 4 of the third embodiment will be described using FIG. 43.

Figure 43:
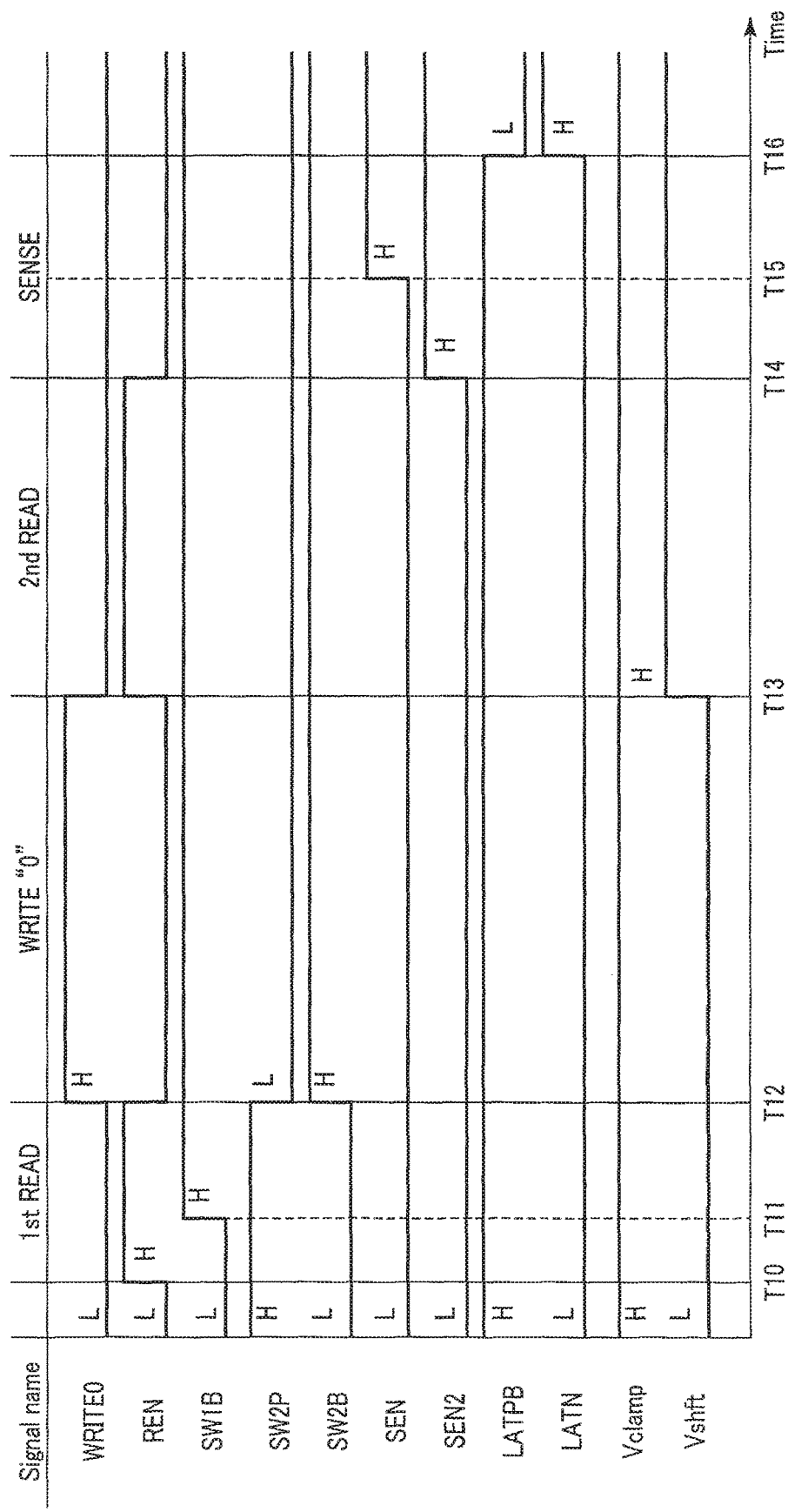
FIG. 43 is a diagram of waveforms during a read operation of a memory system according to Modification 4 of the third embodiment.

As illustrated in FIG. 43, the read operation of the memory system according to Modification 4 of the third embodiment is similar to the operation illustrated in FIG. 30 with the signal SW1P deleted.

<4> Fourth Embodiment

A fourth embodiment will be described. In the fourth embodiment described below, the first embodiment is combined with the third embodiment. A basic configuration and a basic operation of the fourth embodiment are similar to those of each of the above-described embodiments. Therefore, the matters described above in each embodiment and matters which can be easily inferred from each embodiment will not be described below.

<4-1> Configuration of the Preamplifier

A configuration of the preamplifier 110 in the memory device according to the fourth embodiment will be described using FIG. 44.

As illustrated in FIG. 44, the preamplifier 110 has the same basic configuration as that of the preamplifier described in FIG. 5. A difference from the preamplifier in FIG. 5 is that, in the preamplifier 110 in FIG. 44, the transistor M5 and the transistor M6 are deleted and switches SW3 and SW4 are added.

In the present embodiment described below, the switch SW3 has the same configuration as that of the switch SW1 illustrated in FIG. 29. Furthermore, in the description below, the switch SW4 has the same configuration as that of the switch SW2 illustrated in FIG. 29.

However, for the configuration and operation of the switch SW3, the switch SW1 in the above-described third embodiment and each of the modifications thereof is applicable. Likewise, for the configuration and operation of the switch SW4, the switch SW2 in the above-described third embodiment and each of the modifications thereof is applicable.

<4-2> Read Operation

Details of a read operation of a memory system according to the fourth embodiment will be described in accordance with a waveform diagram in FIG. 30.

[Time T10] through [Time T11]

In the first read operation (step S1001), the controller 17 sets the signal REN, the signal SW1P, the signal SW2P, and the signal Vclamp to the "H" level and sets the signal SW1B, the signal SW2B, and the signal Vshft to the "L" level.

Consequently, as illustrated in FIG. 45, the transistors M3 and M4 and the switches SW3 and SW4 are set to the on state. Accordingly, the node N1 is grounded via the bit line (global bit line), the memory cell MC, and the source line (global source line). As a result, the potential of the node N1 decreases to set the transistors M1 and M2 to the on state. The transistors M1 and M2 are driven as diode-connected transistors.

When the transistor M1 is set to the on state, the transistor M1 supplies the cell current (Icell_1st) to the memory cell MC.

The transistor M2 is driven based on the potential of the node M1. Thus, the transistor M2 supplies the copied current (Icopy_1st) of the cell current (Icell_1st) to the node N5.

As described above, the transistors M1 and M2 form a current mirror.

The node N6 is charged by the two switches SW3 and SW4. This allows suppression of a voltage drop due to possible switching noise in the switches SW3 and SW4.

The transistor M8 is set to the off state.

[Time T11] through [Time T12]

The controller 17 sets the signal SW1B to the "H" level and sets the signal SW1P to the "L" level in the middle of the first read operation (step S1001).

Consequently, as illustrated in FIG. 46, the switch SW3 is set to the off state.

Then, the potential of the node N6 is set to correspond to the voltage information (signal voltage) V1st based on the copied current (Icopy_1st).

As described above, the preamplifier 110 passes the cell current (Icell_1st) through the memory cell MC via the first current path comprising the transistors M1, M3, and M4. The preamplifier 110 passes the copied current (Icopy_1st) through the node N6 via the second current path comprising the transistors M2. The first current path and the second current path are electrically separated from each other.

As described above, when the first read operation (step S1001) is started, the switches SW3 and SW4 are turned on, but in the middle of the operation, the switch SW3 is turned off.

[Time T12] through [Time T13]

In the "0" write operation (step S1002), the controller 17 lowers the levels of the signal REN and the signal SW2P to "L" and raises the levels of the signal WRITE0 and the signal SW2B to "H". The signal WRITE0 is a signal relating to the "0" write operation. When the signal WRITE0 is at the "H" level, the write driver performs the "0" write operation.

As illustrated in FIG. 47, the transistors M1, M2, M4, and M8 and the switches SW3 and SW4 are set to the off state.

Consequently, the write driver not illustrated in the drawings writes "0" data to the memory cell.

[Time T13] through [Time T14]

In the second read operation (step S1003), the controller 17 raises the levels of the signal REN and the signal Vshft to "H" and lowers the level of the signal WRITE0 to "L".

Consequently, as illustrated in FIG. 48, the transistors M3 and M4 are set to the on state. Accordingly, the node N1 is grounded via the bit line (global bit line), the memory cell MC, and the source line (global source line). As a result, the potential of the node N1 decreases to set the transistors M1 and M2 to the on state. The transistors M1 and M2 are driven as diode-connected transistors.

When the transistor M1 is set to the on state, the transistor M1 supplies the cell current (Icell_2nd) to the memory cell MC.

The transistor M2 is driven based on the potential of the node M1. Thus, the transistor M2 supplies the copied current (Icopy_2nd) of the cell current (Icell_2nd) to the node N4.

The transistor M7 is set to the on state based on V1st.

The transistor M8 is set to the on state based on Vshft. Thus, the transistor M8 provides the shift current (Icopy_shft).

Then, the potential of the node N5 is set to correspond to voltage information (signal voltage) V2nd based on the cell current (Icell_2nd), the shift current (Icopy_shft), and V1st.

After [Time T14]

Operations after time T14 are similar to the operations after time T4 described using FIG. 18.

<4-3> Effects

According to the above-described embodiment, in the preamplifier of the first embodiment, the plurality of switches is provided between the node storing V1st and the node storing V2nd.

Thus, the present embodiment produces effects corresponding to the combination of the first embodiment and the third embodiment.

<5> Fifth Embodiment

A fifth embodiment will be described. In the fifth embodiment described below, the comparative example of the second embodiment is combined with the third embodiment. A basic configuration and a basic operation of the fifth embodiment are similar to those of each of the above-described embodiments. Therefore, the matters described above in each embodiment and matters which can be easily inferred from each embodiment will not be described below.

<5-1> Configuration of the Preamplifier

A configuration of the preamplifier 210 in a memory device according to the fifth embodiment will be described using FIG. 49.

As illustrated in FIG. 49, the preamplifier 210 has the same basic configuration as that of the preamplifier described in FIG. 24. A difference from the preamplifier in FIG. 24 is that, in the preamplifier 110 in FIG. 49, the transistor M35 and the transistor M36 are deleted and switches SW5 and SW6 are added.

In the present embodiment described below, the switch SW5 has the same configuration as that of the switch SW1 illustrated in FIG. 29. Furthermore, in the description below, the switch SW6 has the same configuration as that of the switch SW2 illustrated in FIG. 29.

However, for the configuration and operation of the switch SW5, the switch SW1 in the above-described third embodiment and each of the modifications thereof is applicable. Likewise, for the configuration and operation of the switch SW6, the switch SW2 in the above-described third embodiment and each of the modifications thereof is applicable.

<5-2> Read Operation

Figure 50:
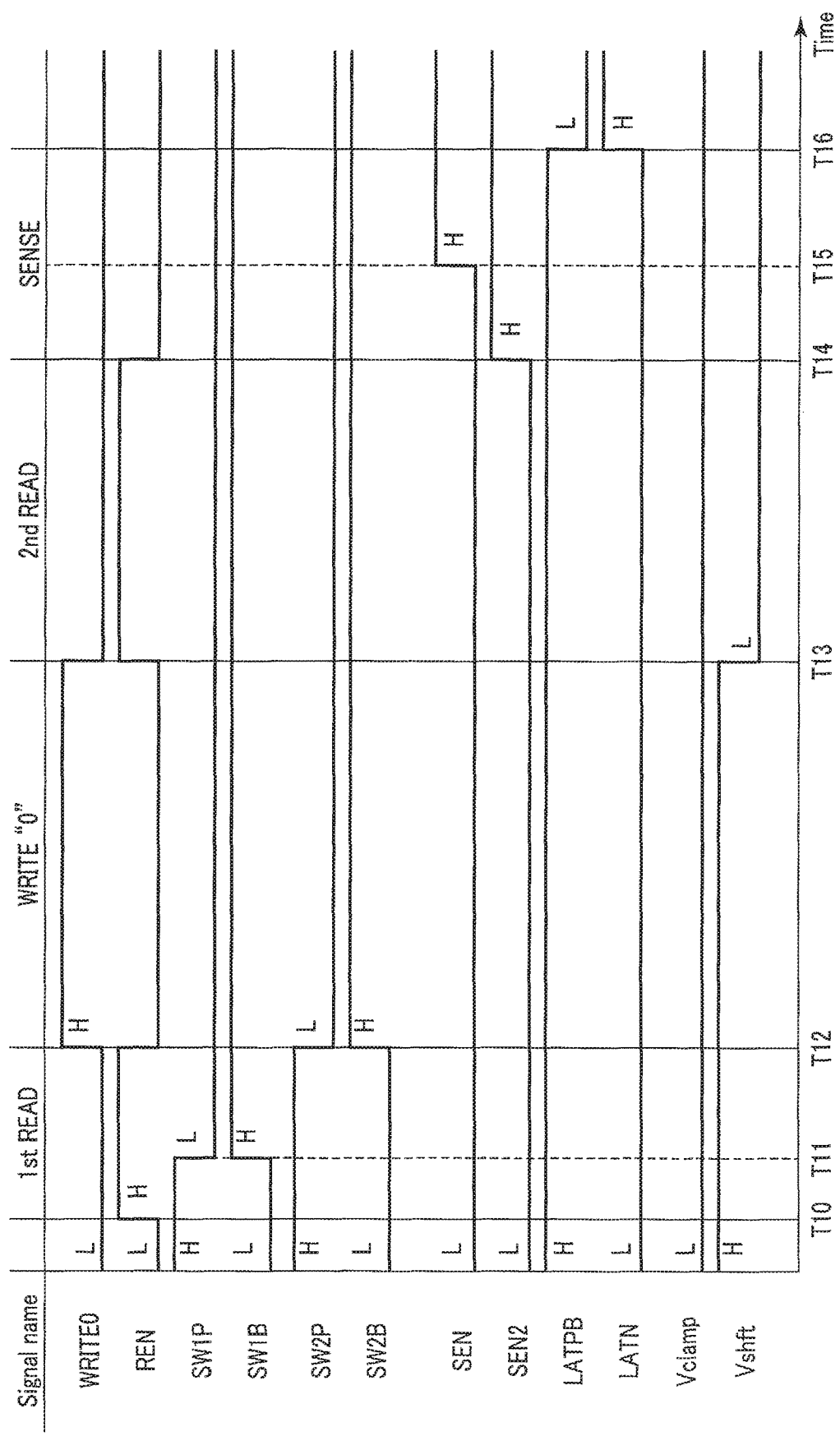
FIG. 50 is a diagram of waveforms during a read operation of a memory system according to the fifth embodiment.

Details of a read operation of a memory system according to the fifth embodiment will be described in accordance with a waveform diagram in FIG. 50.

[Time T10] through [Time T11]

In the first read operation (step S1001), the controller 17 sets the signal REN, the signal SW1P, the signal SW2P, and the signal Vshft to the "H" level and sets the signal SW1B, the signal SW2B, and the signal Vclamp to the "L" level.

Figure 51:
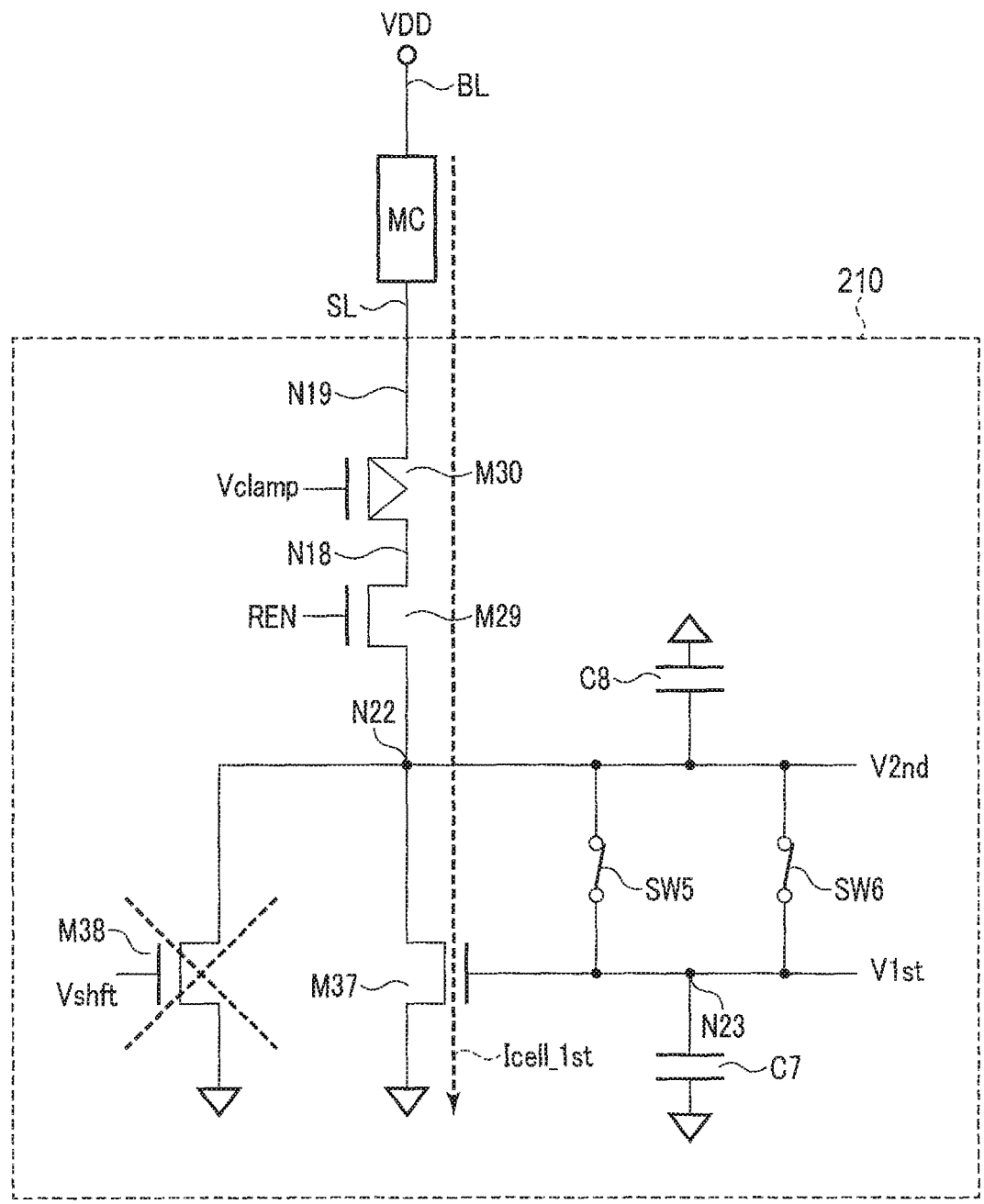
FIG. 51 is a circuit diagram illustrating an operation of the preamplifier in the memory device according to the fifth embodiment in a first read operation.

Consequently, as illustrated in FIG. 51, the transistors M29 and M30 and the switches SW5 and SW6 are set to the on state. Accordingly, the node N23 is supplied with a voltage via the bit line (global bit line), the memory cell MC, and the source line (global source line). As a result, the potential of the node N23 increases to set the transistor M37 to the on state. The transistor M37 is driven as a diode-connected transistor.

When the transistor M37 is set to the on state, the cell current (Icell_1st) from the memory cell MC flows through the transistor M37.

The node N23 is charged by the two switches SW5 and SW6. This allows suppression of a voltage drop due to possible switching noise in the switches SW5 and SW6.

[Time T11] through [Time T12]

The controller 17 sets the signal SW1B to the "H" level and sets the signal SW1P to the "L" level in the middle of the first read operation (step S1001).

Consequently, as illustrated in FIG. 52, the switch SW5 is set to the off state.

Then, the potential of the node N23 is set to correspond to the voltage information (signal voltage) V1st based on the cell current (Icell_1st).

The transistor M38 is set to the off state.

[Time T12] through [Time T13]

In the "0" write operation (step S1002), the controller 17 lowers the levels of the signal REN and the signal SW2P to "L" and raises the levels of the signal WRITE0 and the signal SW2B to "H". The signal WRITE0 is a signal relating to the "0" write operation. When the signal WRITE0 is at the "H" level, the write driver performs the "0" write operation.

Figure 53:
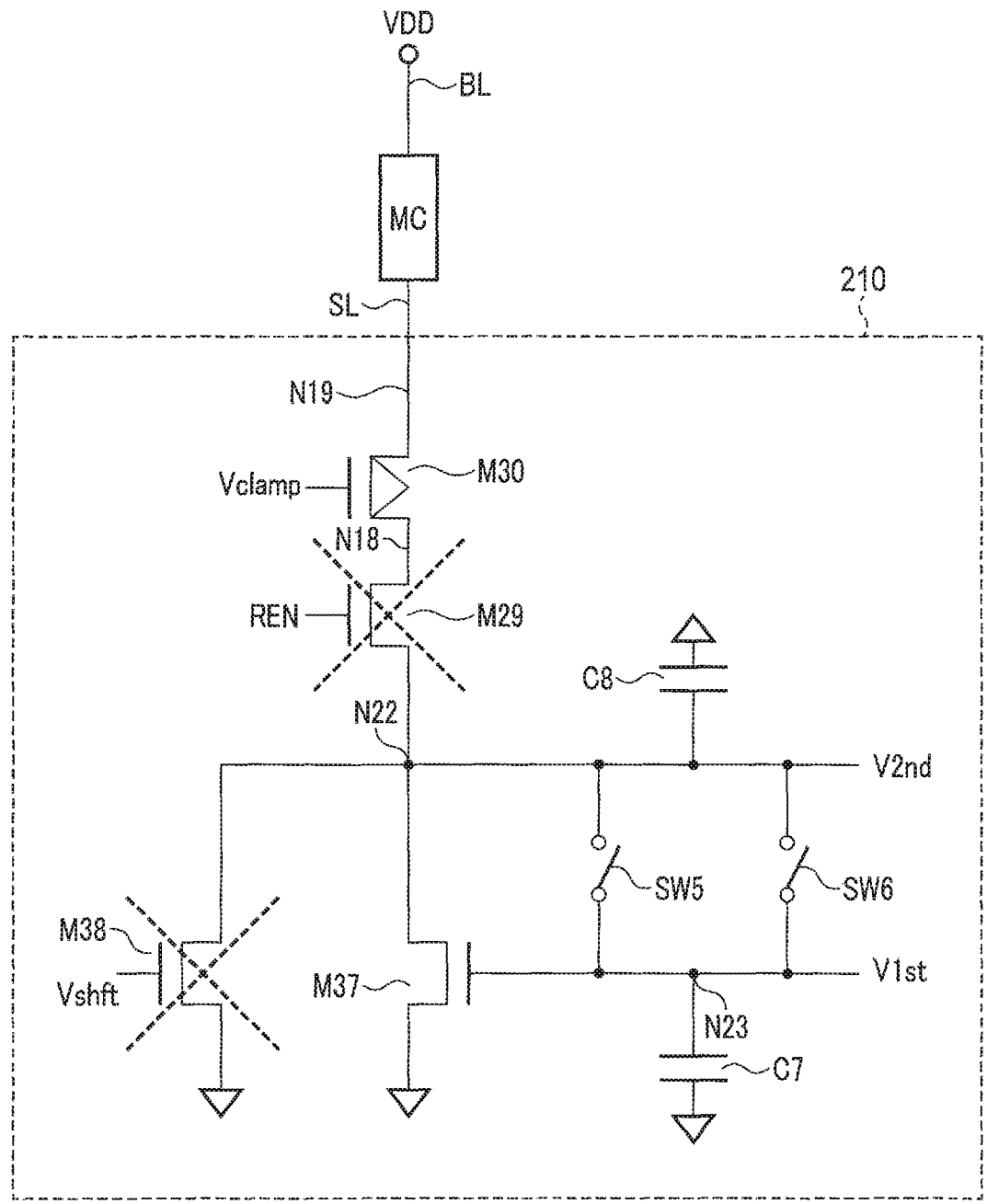
FIG. 53 is a circuit diagram illustrating an operation of the preamplifier in the memory device according to the fifth embodiment in a write operation.

As illustrated in FIG. 53, the transistors M29 and M38 and the switches SW5 and SW6 are set to the off state.

Consequently, the write driver not illustrated in the drawings writes "0" data to the memory cell.

[Time T13] through [Time T14]

In the second read operation (step S1003), the controller 17 raises the level of the signal REN to "H" and lowers the levels of the signal WRITE0 and the signal Vshft to "L".

Figure 54:
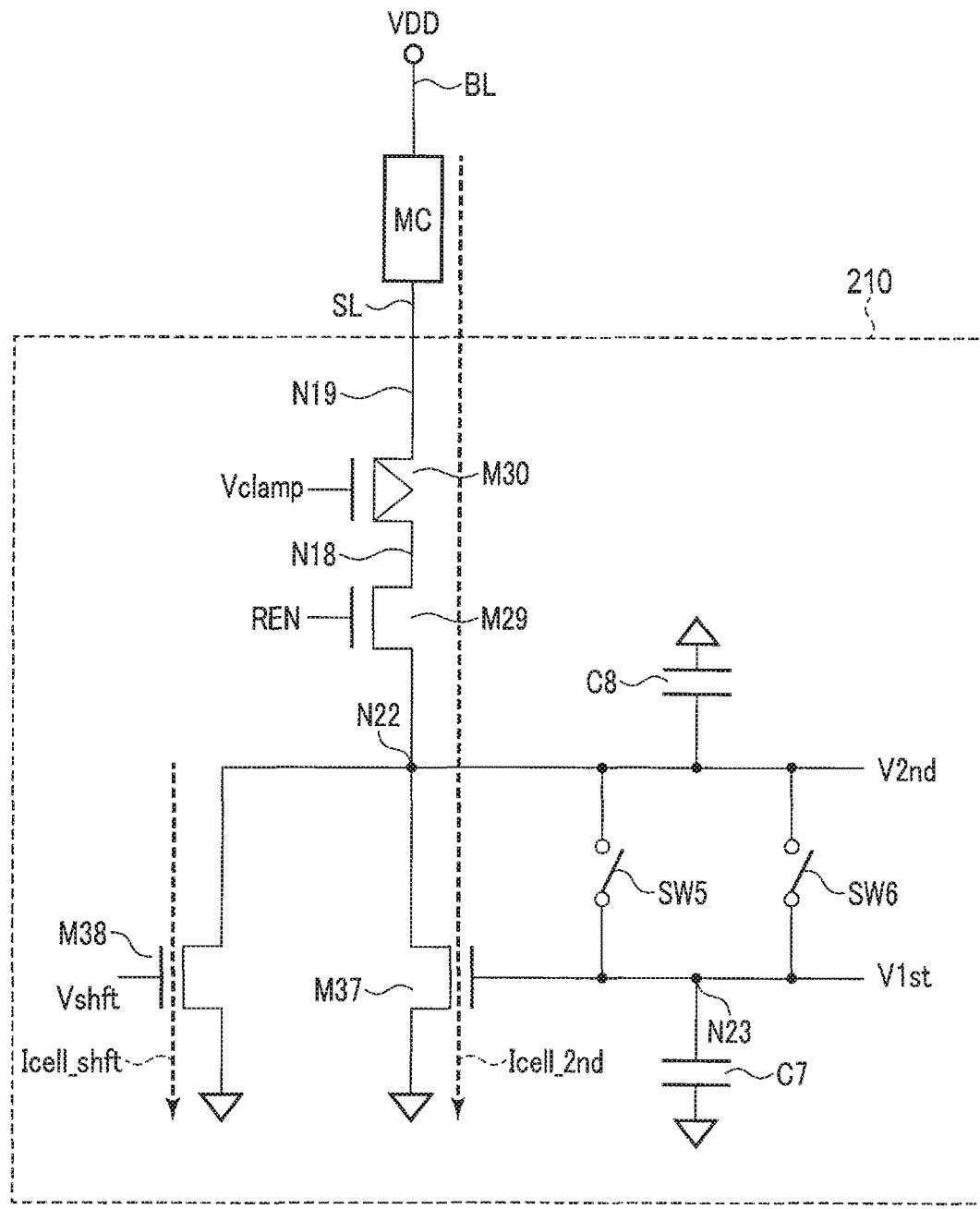
FIG. 54 is a circuit diagram illustrating an operation of the preamplifier in the memory device according to the fifth embodiment in a second read operation.

Consequently, as illustrated in FIG. 54, the transistors M29 and M30 are set to the on state. Accordingly, the node N22 is supplied with a voltage via the bit line (global bit line), the memory cell MC, and the source line (global source line).

The transistor M37 is set to the on state based on V1st.

The transistor M38 is set to the on state based on Vshft. Thus, the transistor M38 provides the shift current (Icell_shft).

Then, the potential of the node N22 is set to correspond to the voltage information (signal voltage) V2nd based on the cell current (Icell_2nd), the shift current (Icopy_shft), and V1st.

After [Time T14]

Operations after time T14 are similar to the operations after time T4 described using FIG. 12.

<5-3> Effects

According to the above-described embodiment, in the preamplifier, the plurality of switches is provided between the node storing V1st and the node storing V2nd.

Thus, the effects described in the third embodiment can be produced.

<6> Sixth Embodiment

A sixth embodiment will be described. In the sixth embodiment described below, the second embodiment is combined with the third embodiment. A basic configuration and a basic operation of the sixth embodiment are similar to those of each of the above-described embodiments. Therefore, the matters described above in each embodiment and matters which can be easily inferred from each embodiment will not be described below.

<6-1> Configuration of the Preamplifier

A configuration of the preamplifier 110 in the memory device according to the sixth embodiment will be described using FIG. 55.

Figure 55:
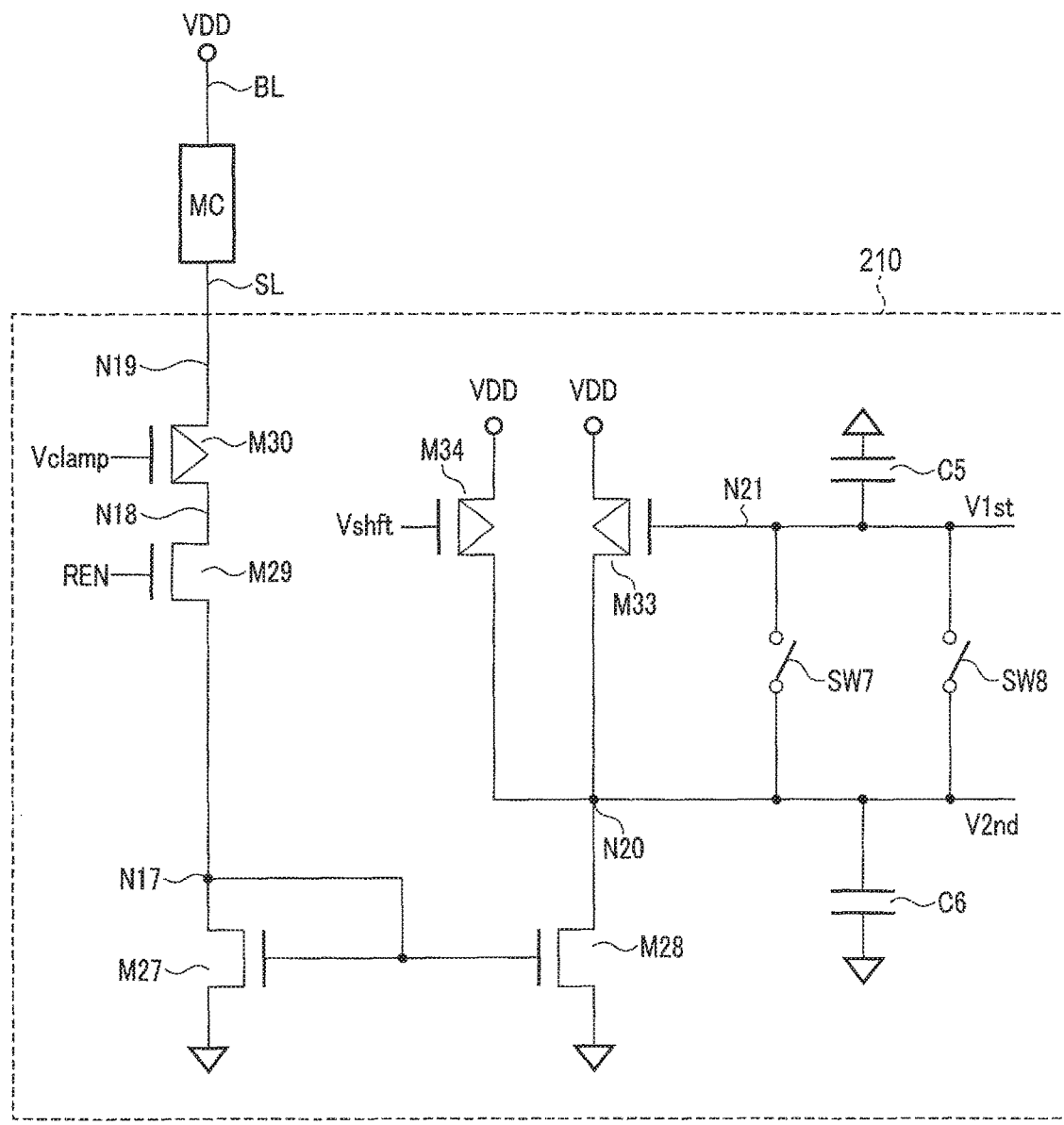
FIG. 55 is a circuit diagram illustrating a preamplifier in a memory device according to a sixth embodiment.

As illustrated in FIG. 55, the preamplifier 110 has the same basic configuration as that of the preamplifier described in FIG. 18. A difference from the preamplifier in FIG. 18 is that, in the preamplifier 110 in FIG. 55, the transistor M31 and the transistor M32 are deleted and switches SW7 and SW8 are added.

In the present embodiment described below, the switch SW7 has the same configuration as that of the switch SW1 illustrated in FIG. 29. Furthermore, in the description below, the switch SW8 has the same configuration as that of the switch SW2 illustrated in FIG. 29.

However, for the configuration and operation of the switch SW7, the switch SW1 in the above-described third embodiment and each of the modifications thereof is applicable. Likewise, for the configuration and operation of the switch SW8, the switch SW2 in the above-described third embodiment and each of the modifications thereof is applicable.

<6-2> Read Operation

Details of a read operation of a memory system according to the sixth embodiment will be described in accordance with a waveform diagram in FIG. 50.

[Time T10] through [Time T11]

In the first read operation (step S1001), the controller 17 sets the signal REN, the signal SW1P, the signal SW2P, and the signal Vshft to the "H" level and sets the signal SW1B, the signal SW2B, and the signal Vclamp to the "L" level.

Consequently, as illustrated in FIG. 56, the transistors M29 and M30 and the switches SW7 and SW8 are set to the on state. This allows the node N17 to be supplied with a voltage via the bit line (global bit line), the memory cell MC, the source line (global source line). As a result, the potential of the node N17 increases to set the transistors M27 and M28 to the on state. The transistors M27 and M28 are driven as diode-connected transistors.

When the transistor M27 is set to the on state, the cell current (Icell_1st) from the memory cell MC flows through the transistor M27.

The transistor M28 is driven based on the potential of the node N17. Thus, the copied current (Icopy_1st) of the cell current (Icell_1st) flows through the transistor M28.

As described above, the transistors M27 and M28 form a current mirror.

Furthermore, the node N21 is charged by the two switches SW7 and SW8. This allows suppression of a voltage drop due to possible switching noise in the switches SW7 and SW8.

[Time T11] through [Time T12]

The controller 17 sets the signal SW1B to the "H" level and sets the signal SW1P to the "L" level in the middle of the first read operation (step S1001).

Consequently, as illustrated in FIG. 57, the switch SW7 is set to the off state.

Then, the potential of the node N21 is set to correspond to the voltage information (signal voltage) V1st based on the copied current (Icopy_1st).

The transistor M34 is set to the off state.

[Time T12] through [Time T13]

In the "0" write operation (step S1002), the controller 17 lowers the levels of the signal REN and the signal SW2P to "L" and raises the levels of the signal WRITE0 and the signal SW2B to "H". The signal WRITE0 is a signal relating to the "0" write operation. When the signal WRITE0 is at the "H" level, the write driver performs the "0" write operation.

As illustrated in FIG. 58, the transistors M29 and M34 and the switches SW7 and SW8 are set to the off state.

Consequently, the write driver not illustrated in the drawings writes "0" data to the memory cell.

[Time T13] through [Time T14]

In the second read operation (step S1003), the controller 17 raises the level of the signal REN to "H" and lowers the levels of the signal WRITE0 and the signal Vshft to "L".

Figure 59:
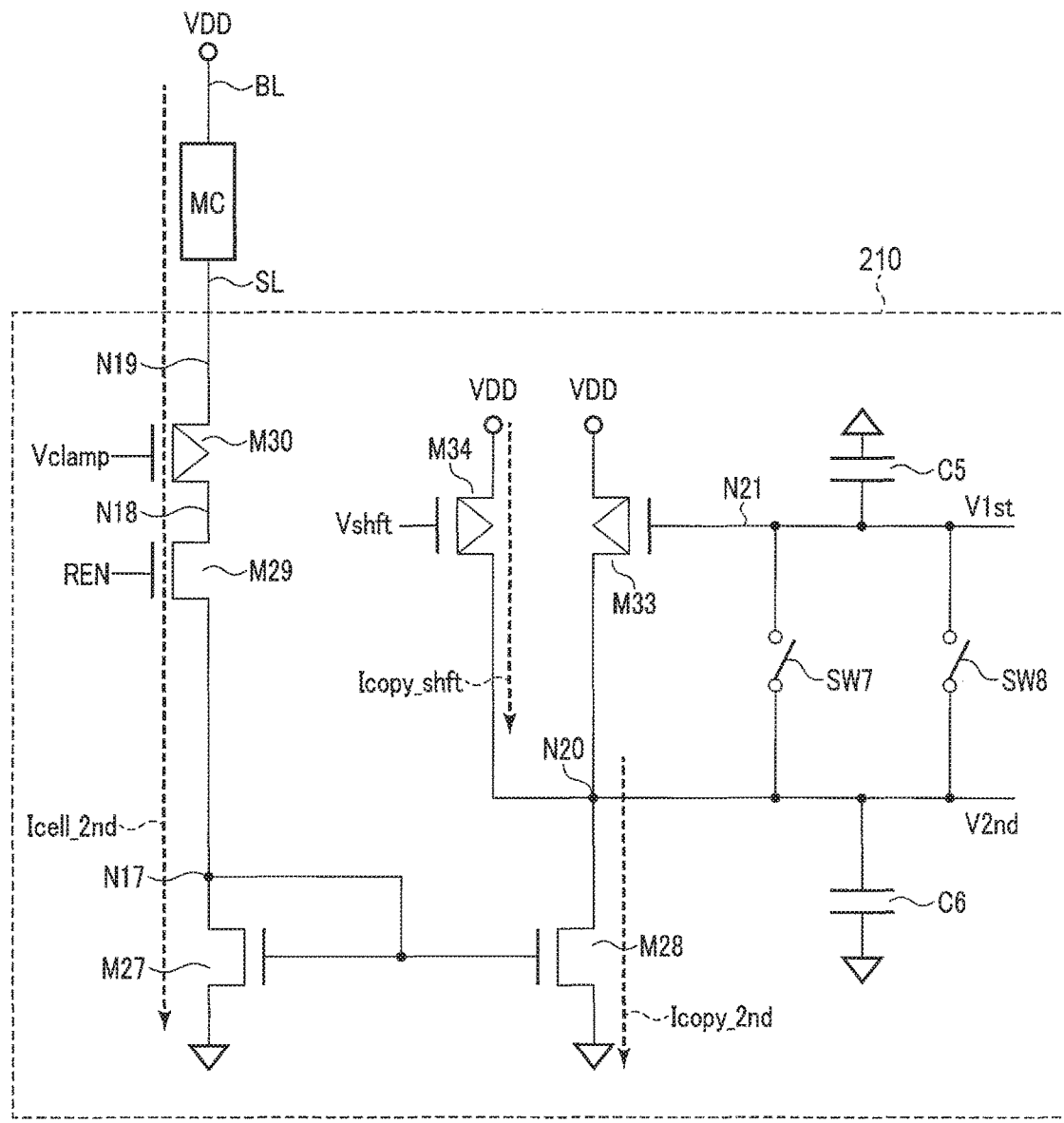
FIG. 59 is a circuit diagram illustrating an operation of the preamplifier in the memory device according to the sixth embodiment in a second read operation.

Consequently, as illustrated in FIG. 59, the transistors M29 and M30 are set to the on state. This allows the node N17 to be supplied with a voltage via the bit line (global bit line), the memory cell MC, the source line (global source line). As a result, the potential of the node N17 increases to set the transistors M27 and M28 to the on state. The transistors M27 and M28 are driven as diode-connected transistors.

When the transistor M27 is set to the on state, the cell current (Icell_2nd) from the memory cell MC flows through the transistor M27.

The transistor M28 is driven based on the potential of the node N17. Thus, the copied current (Icopy_2nd) of the cell current (Icell_2nd) flows through the transistor M28.

As described above, the transistors M27 and M28 form a current mirror.

The transistor M33 is set to the on state based on V1st.

The transistor M34 is set to the on state based on Vshft. Thus, the transistor M34 provides the shift current (Icell_shft).

Then, the potential of the node N20 is set to correspond to the voltage information (signal voltage) V2nd based on the copied current (Icopy_2nd), the shift current (Icell_shft), and V1st.

After [Time T14]

Operations after time T14 are similar to the operations after time T4 described using FIG. 12.

<6-3> Effects

According to the above-described embodiment, in the preamplifier of the second embodiment, the plurality of switches is provided between the node storing V1st and the node storing V2nd.

Thus, the present embodiment produces effects corresponding to the combination of the second embodiment and the third embodiment.

<7> Miscellaneous

In the examples described above in the embodiments, the preamplifier generates the shift current. However, the present invention is not limited to this. Each of the above-described embodiments is applicable even to a configuration where the sense amplifier generates the shift current.

Furthermore, in the examples described above in the embodiments, the memory cell is illustrated as FIG. 3. However, the present embodiments are not limited to this. The embodiments are also applicable to a memory cell which has the fixed layer (pinned layer) P connected to a bit line, and the recording layer (free layer) F connected to a source line.

Furthermore, the term "connect" in the above-described embodiments includes a state where components are indirectly connected together with another element, for example, a transistor or a resistor interposed between the components.

The embodiments have been described taking, as an example, MRAM which stores data using magnetic tunnel junction (MTJ) elements as resistance change elements. However, the present invention is not limited to this.

For example, the embodiments are applicable to a resistance change memory similar to MRAM, for example, a semiconductor memory device such as ReRAM or PCRAM which comprises elements storing data utilizing changes in resistance.

The embodiments are also applicable to, regardless of whether a volatile memory or a non-volatile memory, a semiconductor memory device which can store data based or a change in resistance resulting from application of a current or a voltage or can read stored data by converting a difference in resistance resulting from a change in resistance into a difference in current or voltage.

Furthermore, in each of the above-described embodiments, the bit line pair is referred to as the bit line BL and the source line SL for convenience of description. However, the present invention is not limited to this. For example, the bit line pair may be referred to as a first bit line and a second bit line.

Additionally, in the memory system 1 in the above-described embodiments, one memory device 10 is connected to the memory controller 20. However, the present invention is not limited to this. For example, the memory system 1 may be configured in such a manner that a plurality of memory devices 10 is connected to the memory controller 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a memory cell;
   a preamplifier configured to:
      execute a first read which passes a first current relating to the memory cell through a first path and a second current relating to the first current through a second path electrically separated from the first path, so as to generate a first voltage,
      write first data to the memory cell with the first read executed thereon; and
      execute a second read which passes a third current relating to the memory cell with the first data written thereto through the first path and a fourth current relating to the third current through the second path, so as to generate a second voltage; and
   a sense amplifier configured to determine, after the second read, data which has been stored in the memory cell at a time of the first read based on the first voltage generated as a result of the first read and the second voltage generated as a result of the second read.

2. The memory device according to claim 1, wherein the preamplifier is configured to:
   pass, by a first transistor with diode connection, the first current through the first path when the first read is executed on the memory cell, and
   pass, by the first transistor with diode connection, the third current relating to the memory cell through the first path when the second read is executed on the memory cell.

3. The memory device according to claim 2, wherein the preamplifier is configured to:
   pass, by a second transistor with diode connection, the second current through the second path when the first read is executed on the memory cell, and
   pass, by the second transistor with diode connection, the fourth current through the second path when the second read is executed on the memory cell.

4. The memory device according to claim 3, wherein:
   each of the first transistor and the second transistor comprises a gate electrode connected to the first path.

5. The memory device according to claim 1, wherein the preamplifier comprises:
   a first node where the first voltage is generated; and
   a second node where the second voltage is generated.

6. The memory device according to claim 5, wherein:
   the preamplifier is configured to shift a voltage relating to the fourth current to generate the second voltage in the second node.

7. The memory device according to claim 5, wherein:
   the preamplifier comprises a switch configured to control connection between the first node and the second node,
   the preamplifier sets the switch to an on state when the first read is executed, and
   the preamplifier sets the switch to an off state when the second read is executed.

8. A memory device comprising:
   a memory cell;
   a preamplifier configured to:
      execute a first read on the memory cell to generate a first voltage,
      write first data to the memory cell with the first read executed thereon, and
      execute a second read on the memory cell with the first data written thereto to generate a second voltage; and
   a sense amplifier configured to determine, after the second read, data which has been stored in the memory cell at a time of the first read based on the first voltage generated as a result of the first read and the second voltage generated as a result of the second read,
   wherein the preamplifier comprises:
      a first node where the first voltage is generated;
      a second node where the second voltage is generated; and
      a first switch and a second switch each configured to control connection between the first node and the second node, and
   wherein the preamplifier is configured to:
      set the first and second switches to an on state when the first read is executed, and
      set the first switch to an off state and keep the second switch in the on state, in a middle of the first read.

9. The memory device according to claim 8, wherein:
   the first switch or the second switch is a CMOS transistor, a PMOS transistor, or an NMOS transistor.

10. The memory device according to claim 8, wherein the preamplifier is configured to:
    pass, by a first transistor with diode connection, a first current relating to the memory cell when the first read is executed on the memory cell, and
    pass, by the first transistor, a second current relating to the memory cell when the second read is executed on the memory cell.

11. The memory device according to claim 10, wherein:
    the first transistor comprises a gate electrode connected to the first node.

12. The memory device according to claim 8, wherein:
    the preamplifier is configured to shift a voltage relating to the second current to generate the second voltage in the second node.

13. The memory device according to claim 8, wherein:
    the preamplifier is configured to set the first and second switches to an off state when the second read is executed.

14. A memory device comprising:
    a memory cell;
    a preamplifier configured to:
       execute a first read which passes a first current relating to the memory cell through a first path and a second current relating to the first current through a second path electrically separated from the first path, so as to generate a first voltage at a first node,
       write first data to the memory cell with the first read executed thereon; and
       execute a second read which passes a third current relating to the memory cell with the first data written thereto through the first path and a fourth current relating to the third current through the second path, so as to generate a second voltage at a second node; and
    a sense amplifier configured to determine, after the second read, data which has been stored in the memory cell at a time of the first read based on the first voltage generated as a result of the first read and the second voltage generated as a result of the second read,
    wherein the preamplifier comprises a first switch and a second switch each configured to control connection between the first node and the second node, and
    wherein the preamplifier is configured to:
       set the first and second switches to an on state when the first read is executed, and
       set the first switch to an off state and keep the second switch in the on state, in a middle of the first read.

15. The memory device according to claim 14, wherein the preamplifier is configured to:
   pass, by a first transistor with diode connection, the first current through the first path when the first read is executed on the memory cell, and
   pass, by the first transistor with diode connection, the third current relating to the memory cell through the first path when the second read is executed on the memory cell.

16. The memory device according to claim 15, wherein the preamplifier is configured to:
   pass, by a second transistor with diode connection, the second current through the second path when the first read is executed on the memory cell, and
   pass, by the second transistor with diode connection, the fourth current through the second path when the second read is executed on the memory cell.

17. The memory device according to claim 16, wherein:
   each of the first transistor and the second transistor comprises a gate electrode connected to the first path.

18. The memory device according to claim 14, wherein:
   the preamplifier is configured to shift a voltage relating to the fourth current to generate the second voltage in the second node.

19. The memory device according to claim 14, wherein:
   the first switch or the second switch is a CMOS transistor, a PMOS transistor, or an NMOS transistor.

20. The memory device according to claim 4, wherein:
   the first transistor and the second transistor form a current mirror, and
   the second path is electrically separated from the first path by the current mirror.

* * * * *

UNITED STATES PATENT AND TRADEMARK OFFICE
CERTIFICATE OF CORRECTION

PATENT NO. : 10,388,345 B2  
APPLICATION NO. : 15/918399  
DATED : August 20, 2019  
INVENTOR(S) : Kosuke Hatsuda et al.

Page 1 of 1

It is certified that error appears in the above-identified patent and that said Letters Patent is hereby corrected as shown below:

On the Title Page

Item (73) Assignee, Change "TOSHIBA MEMORY CORORATION, Tokyo (JP)" to --TOSHIBA MEMORY CORPORATION Tokyo (JP)--.

Signed and Sealed this  
Nineteenth Day of May, 2020

Andrei Iancu  
*Director of the United States Patent and Trademark Office*